US011825711B2

(12) United States Patent
Lee et al.

(10) Patent No.: US 11,825,711 B2
(45) Date of Patent: Nov. 21, 2023

(54) DISPLAY PANEL INCLUDING BENDABLE CORNER DISPLAY AREA AND DISPLAY APPARATUS INCLUDING THE SAME

(71) Applicant: SAMSUNG DISPLAY CO., LTD., Yongin-si (KR)

(72) Inventors: Sunhwa Lee, Yongin-si (KR); Gyungsoon Park, Yongin-si (KR); Jaeyong Jang, Yongin-si (KR); Yujin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 215 days.

(21) Appl. No.: 17/360,213

(22) Filed: Jun. 28, 2021

(65) Prior Publication Data
US 2022/0069051 A1    Mar. 3, 2022

(30) Foreign Application Priority Data

Sep. 1, 2020    (KR) .................. 10-2020-0111291

(51) Int. Cl.
*H10K 59/131*    (2023.01)
*H10K 59/122*    (2023.01)
*H10K 59/121*    (2023.01)
*H10K 77/10*     (2023.01)
*H01L 27/12*     (2006.01)
*H10K 59/124*    (2023.01)
*H10K 102/00*    (2023.01)

(52) U.S. Cl.
CPC ......... *H10K 59/131* (2023.02); *H10K 59/122* (2023.02); *H10K 59/1213* (2023.02); *H10K 77/111* (2023.02); *H01L 27/1214* (2013.01); *H10K 59/124* (2023.02); *H10K 2102/311* (2023.02)

(58) Field of Classification Search
None
See application file for complete search history.

(56) References Cited

U.S. PATENT DOCUMENTS 6,496,238 B1    12/2002  Greene et al.
6,796,238 B2     9/2004  Goldburt et al.
(Continued)

FOREIGN PATENT DOCUMENTS

KR    1020170005295 A    1/2017
KR    1020170028464 A    3/2017
(Continued)

*Primary Examiner* — J. E. Schoenholtz
(74) *Attorney, Agent, or Firm* — CANTOR COLBURN LLP

(57) ABSTRACT

A display panel includes a substrate including a display area and a peripheral area around the display area, the display area including a front display area, a corner display area extending from a corner of the front display area, and a middle display area between the front display area and the corner display area, a pixel arranged on the front display area and including a display element, a gate driving circuit arranged on a side of the peripheral area, a data driving circuit arranged on the side on which the gate driving circuit is arranged, a gate line connected to the gate driving circuit and extending to be connected to the pixel, and a data line connected to the data driving circuit and extending to be connected to the pixel.

20 Claims, 26 Drawing Sheets

(56) References Cited

U.S. PATENT DOCUMENTS

| | | | |
|---|---|---|---|
| 6,862,008 B2 | 3/2005 | Yamazaki et al. | |
| 10,177,175 B2 | 1/2019 | Kawamura et al. | |
| 10,411,083 B2 | 9/2019 | Song et al. | |
| 10,770,015 B2 | 9/2020 | Lee et al. | |
| 2017/0004758 A1 | 1/2017 | Son et al. | |
| 2017/0069271 A1 | 3/2017 | Kim et al. | |
| 2019/0220122 A1* | 7/2019 | Shin | G06F 3/041 |
| 2019/0269011 A1 | 8/2019 | Lee et al. | |
| 2022/0148496 A1* | 5/2022 | Cho | G09G 3/32 |

FOREIGN PATENT DOCUMENTS

| | | |
|---|---|---|
| KR | 1020180066342 A | 6/2018 |
| KR | 1020190038718 A | 4/2019 |
| KR | 1020190102123 A | 9/2019 |
| KR | 1020190138690 A | 12/2019 |

\* cited by examiner

DISPLAY PANEL INCLUDING BENDABLE CORNER DISPLAY AREA AND DISPLAY APPARATUS INCLUDING THE SAME

This application claims priority to Korean Patent Application No. 10-2020-0111291, filed on Sep. 1, 2020, and all the benefits accruing therefrom under 35 U.S.C. § 119, the content of which in its entirety is herein incorporated by reference.

BACKGROUND

1. Field

One or more embodiments relate to a display panel and a display apparatus in which a display area for displaying images is expanded.

2. Description of the Related Art

Electronic devices based on mobility have come into widespread use. Recently, tablet personal computers ("PCs"), in addition to small-sized electronic devices such as mobile phones, are widely being used as mobile electronic devices.

In order to support various functions, for example, to provide a user with visual information such as images or videos, the mobile electronic devices include a display apparatus. Recently, as components for driving such display apparatuses have become miniaturized, occupancy of the display apparatuses in electronic devices is gradually increasing. Moreover, a structure that may be curved to have a predetermined angle from a flat state has been developed.

A display panel for displaying an image, which is included in a display apparatus, includes various curvatures, such as a front display area, a first side display area extending from the front display area in a first direction and bent, and a second side display area extending from the front display area in a second direction and bent, for example.

SUMMARY

One or more embodiments include a display panel and a display apparatus including a bendable corner display area arranged to correspond to the corner of a front display area.

Additional embodiments will be set forth in part in the description which follows and, in part, will be apparent from the description, or may be learned by practice of the presented embodiments of the invention.

A display panel in an embodiment includes a substrate including a display area and a peripheral area around the display area, the display area including a front display area, a corner display area extending from a corner of the front display area, and a middle display area between the front display area and the corner display area, a pixel arranged on the front display area and including a display element, a gate driving circuit arranged on a side of the peripheral area, a data driving circuit arranged on the side on which the gate driving circuit is arranged, a gate line connected to the gate driving circuit and extending in a first direction to be connected to the pixel, and a data line connected to the data driving circuit and extending in a second direction intersecting the first direction to be connected to the pixel.

In an embodiment, the display panel may further include a gate connection line extending in the second direction and including a first side connected to the gate driving circuit and a second side connected to the gate line.

In an embodiment, the display panel may further include a data connection line including a first side connected to the data driving circuit and a second side connected to the data line adjacent to the edge of the front display area.

In an embodiment, the data connection line may at least partially overlap the front display area.

In an embodiment, the display panel may further include a voltage wire arranged on the substrate to correspond to the middle display area, a middle display element arranged to at least partially overlap the voltage wire, and a middle pixel circuit which is connected to the middle display element and drives the middle display element. The middle pixel circuit may be arranged in the front display area.

In an embodiment, the light-emission area of the display element may be smaller than the light-emission area of the middle display element.

In an embodiment, the display panel may further include a corner display element arranged on the substrate to correspond to the corner display area, and a corner pixel circuit which is connected to the corner display element and drives the corner display element. The corner pixel circuit may be arranged in the front display area or the corner display area.

In an embodiment, the light-emission area of the display element may be smaller than the light-emission area of the corner display element.

In an embodiment, the display panel may further include a first corner wire arranged in the corner display area and connected to the data line, and a second corner wire arranged in the corner display area and connected to the gate line. The first corner wire and the second corner wire may be connected to the corner pixel circuit.

In an embodiment, the substrate corresponding to the corner display area may include a plurality of strip portions each extending in a direction away from the front display area, and a plurality of spaces each defined between adjacent strip portions from among the plurality of strip portions, and penetrating through the substrate. The first corner wire and the second corner wire may be arranged in each of the plurality of strip portions.

In an embodiment, the data connection line may at least partially overlap the middle display area.

In an embodiment, the display panel may further include a middle display element arranged to at least partially overlap the data connection line, and a middle pixel circuit which is connected to the middle display element and drives the middle display element. The middle pixel circuit may be arranged in the front display area.

In an embodiment, the display panel may further include a corner display element arranged on the substrate to correspond to the corner display area, and a corner pixel circuit which is connected to the corner display element and drives the corner display element. The corner pixel circuit may be arranged in the front display area or the corner display area.

In an embodiment, the display panel may further include a first voltage wire and a second voltage wire arranged in the peripheral area and spaced apart from each other with the middle display area between the first voltage wire and the second voltage wire, and a voltage connection line arranged in the corner display area and connecting the first voltage wire to the second voltage wire.

In an embodiment, the substrate corresponding to the corner display area may include a plurality of strip portions each extending in a direction away from the front display area, and a plurality of spaces each defined between adjacent strip portions from among the plurality of strip portions, and penetrating through the substrate. The voltage connection line may be arranged along the edges of the plurality of strip portions.

In an embodiment, the display panel may further include a corner display element arranged on the substrate to correspond to the corner display area, and a corner pixel circuit which is connected to the corner display element and drives the corner display element. The corner pixel circuit may be arranged in the front display area or the corner display area.

In an embodiment, the display panel may further include a middle display element arranged on the substrate to correspond to the middle display area, and a middle pixel circuit which is connected to the middle display element and drives the middle display element. The middle pixel circuit may be arranged in the front display area or the middle display area.

A display apparatus in an embodiment includes a display panel and a window covering the display panel. The display panel includes a substrate including a display area and a peripheral area around the display area, the display area including a front display area, a corner display area extending from a corner of the front display area and bent with a preset radius of curvature, and a middle display area between the front display area and the corner display area, a pixel arranged on the front display area and including a display element, a gate driving circuit arranged on a side of the peripheral area, a data driving circuit arranged on the side on which the gate driving circuit is arranged, a gate line connected to the gate driving circuit and extending in a first direction to be connected to the pixel, and a data line connected to the data driving circuit and extending in a second direction intersecting the first direction to be connected to the pixel.

In an embodiment, the display panel may further include a gate connection line extending in the second direction and including a first side connected to the gate driving circuit and a second side connected to the gate line, and a data connection line including one side connected to the data driving circuit and a second side connected to the data line. The data connection line may at least partially overlap the front display area or the middle display area.

In an embodiment, the display panel may further include a voltage wire arranged on the substrate to correspond to the middle display area; a middle display element arranged to at least partially overlap the voltage wire, and a middle pixel circuit which is connected to the middle display element and drives the middle display element. The middle pixel circuit may be arranged in the front display area.

In an embodiment, the display panel may further include a corner display element arranged on the substrate to correspond to the corner display area, and a corner pixel circuit which is connected to the corner display element and drives the corner display element. The corner pixel circuit may be arranged in the front display area or the corner display area.

Other embodiments, features, and advantages other than those described above will become apparent from the detailed contents, claims and drawings for carrying out the following invention.

BRIEF DESCRIPTION OF THE DRAWINGS

The above and other embodiments, features, and advantages of certain embodiments of the invention will be more apparent from the following description taken in conjunction with the accompanying drawings, in which.

DETAILED DESCRIPTION

Figure 1:
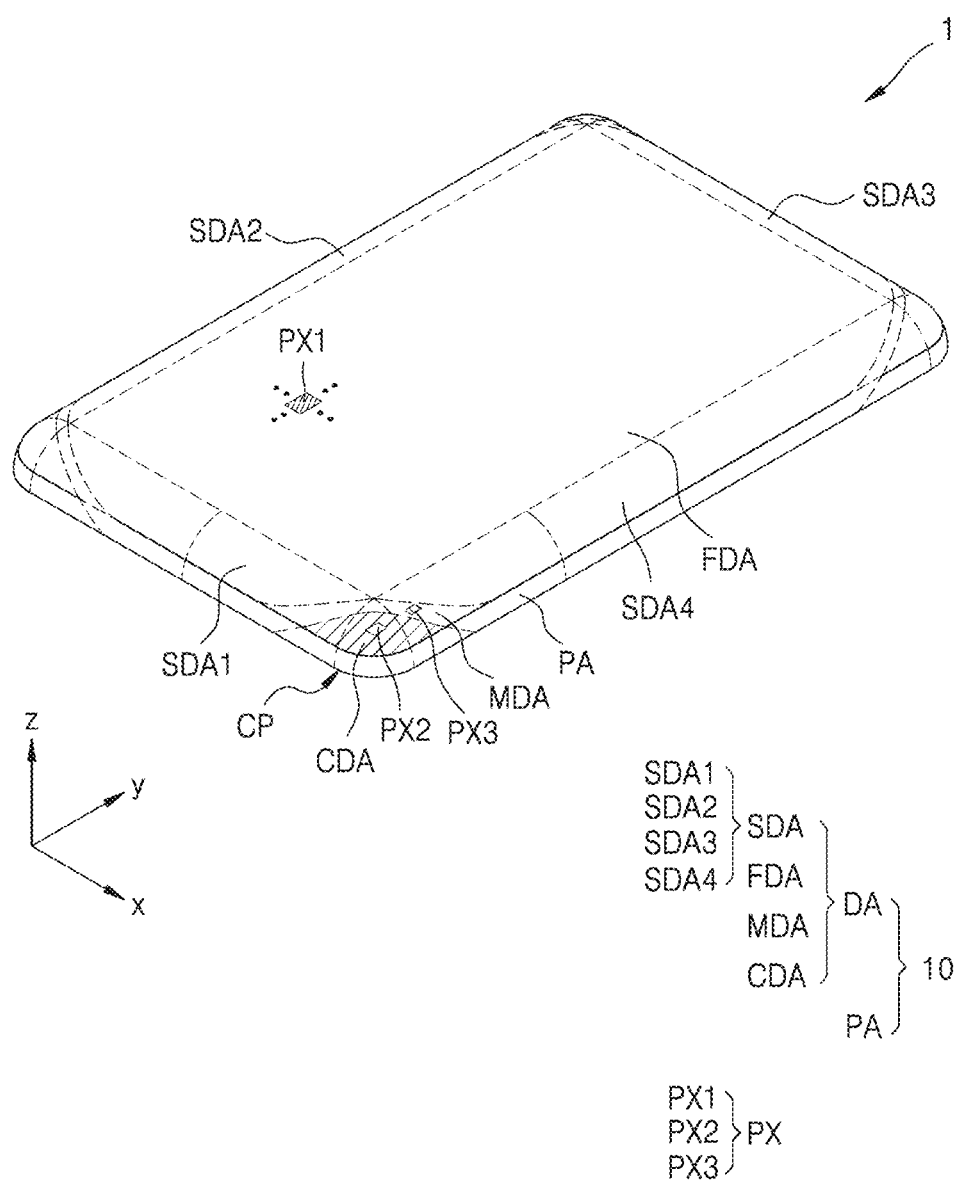
FIG. 1 is a schematic perspective view of an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain embodiments of the description. As used herein, the term "and/or" includes any and all combinations of one or more of the associated listed items.

Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Hereinafter, effects and features of the disclosure and a method for accomplishing them will be described more fully with reference to the accompanying drawings, in which embodiments of the disclosure are shown. This disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first", "second", etc. may be used herein to describe various components, these components should not be limited by these terms. These components are only used to distinguish one component from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, "A and/or B" represents A or B, or A and B. The expression "at least one of A and B" indicates only A, only B, both A and B, or variations thereof.

It will also be understood that when a layer, region, or component is referred to as being "connected" or "coupled" to another layer, region, or component, it can be directly connected or coupled to the other layer, region, or/and component or intervening layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2A:
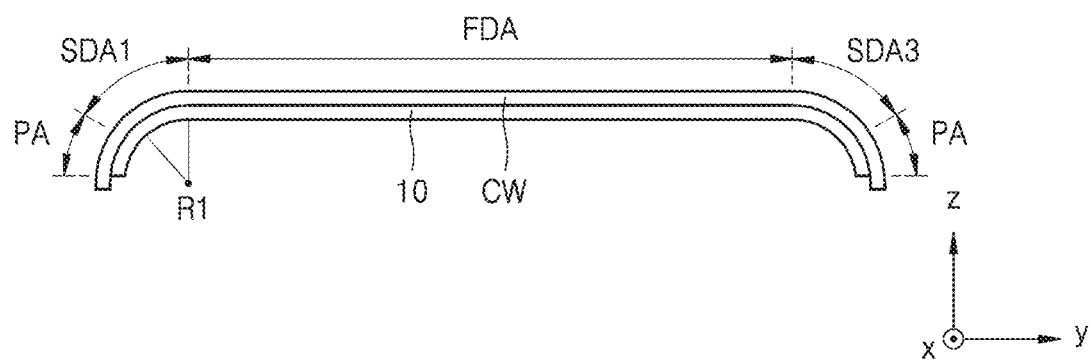
FIGS. 2A, 2B, and 2C are schematic cross-sectional views of an embodiment of a display apparatus.
Figure 2B:
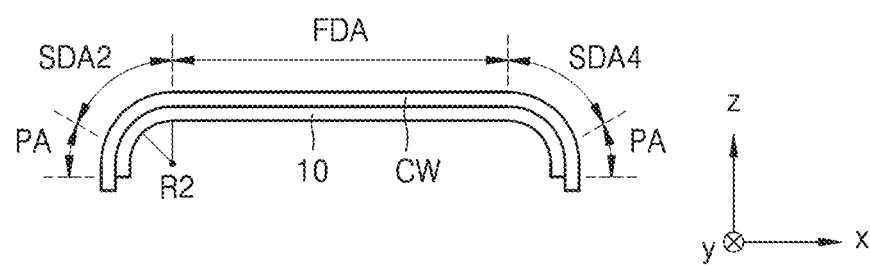
Figure 2C:
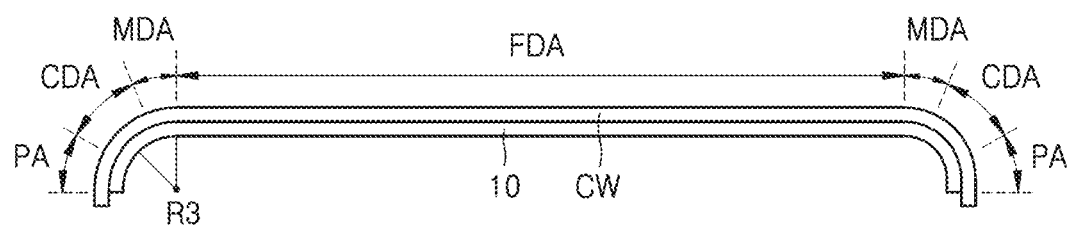

FIG. 1 is a schematic perspective view of an embodiment of a display apparatus 1, and FIGS. 2A, 2B and 2C are schematic cross-sectional views of an embodiment of the display apparatus 1. In detail, FIG. 2A illustrates a cross-section of the display apparatus 1 taken in a y direction of FIG. 1. FIG. 2B illustrates a cross-section of the display apparatus 1 taken in an x direction of FIG. 1. FIG. 2C illustrates a cross-section of the display apparatus 1 including corner display areas CDA arranged on both sides of a front display area FDA.

Referring to FIG. 1, the display apparatus 1 displays a moving picture or a still image, and thus may be used as the display screens of various products such as not only portable electronic apparatuses, such as mobile phones, smartphones, tablet personal computers ("PCs"), mobile communication terminals, electronic notebooks, electronic books, portable multimedia players ("PMPs"), navigation devices, and ultra mobile PCs ("UMPCs") but also televisions, notebooks, monitors, advertisement panels, and Internet of things ("IOT") devices.

The display apparatus 1 may also be used in wearable devices such as smart watches, watch phones, glasses-type displays, and head mounted displays ("HMDs"). The display apparatus 1 may also be used as dashboards of automobiles, center information displays ("CIDs") of the center fasciae or dashboards of automobiles, room mirror displays that replace the side mirrors of automobiles, and displays arranged on the rear sides of front seats to serve as entertainment devices for back seat passengers of automobiles.

The display apparatus 1 may have longer edges in a first direction and shorter edges in a second direction. The first direction and the second direction may intersect with each other. In an embodiment, the first direction and the second direction may define an acute angle, for example. In another embodiment, the first direction and the second direction may form an obtuse angle or a right angle. A case where the first direction (for example, the y direction) and the second direction (for example, the x direction) form a right angle will now be focused on and described in detail.

In another embodiment, the length of an edge of the display apparatus 1 in the first direction (for example, they direction) may be equal to that of an edge of the display apparatus 1 in the second direction (for example, the x direction). In another embodiment, the display apparatus 1 may have shorter edges in the first direction (for example, the y direction) and longer edges in the second direction (for example, the x direction).

Corners between the longer edges in the first direction (y direction) and the shorter edges in the second direction (x direction) may be rounded to have a predetermined curvature.

Referring to FIGS. 2A through 2C, the display apparatus 1 may include a display panel 10 and a cover window CW. The cover window CW may function to protect the display panel 10.

The cover window CW may be a flexible window. The cover window CW may protect the display panel 10 while being easily bent along an external force without generating cracks and the like. The cover window CW may include glass, sapphire or plastic. In an embodiment, the cover window CW may be tempered glass (e.g., ultra thin glass ("UTG")) or colorless polyimide ("CPI"), for example. In an embodiment, the cover window CW may have a structure in which a flexible polymer layer is arranged on one surface of a glass substrate, or may only include a polymer layer.

The display panel 10 may be below the cover window CW. Although not shown in FIGS. 2A through 2C, the display panel 10 may be attached to the cover window CW by a transparent adhesion member such as an optically clear adhesive ("OCA") film.

The display panel 10 may include a display area DA where an image is displayed, and a peripheral area PA surrounding the display area DA. The display area DA may include a plurality of pixels PX, and may display an image through the plurality of pixels PX. Each of the plurality of pixels PX may include subpixels. In an embodiment, each of the plurality of pixels PX may include a red subpixel, a green subpixel, and a blue subpixel, for example. In an alternative embodiment, each of the plurality of pixels PX may include red, green, blue, and white subpixels.

The display area DA may include a front display area FDA, a side display area SDA, a corner display area CDA, and a middle display area MDA. Each of the front display area FDA, the side display area SDA, the corner display area CDA, and the middle display area MDA may include a plurality of pixels PX, and the plurality of pixels PX may display an image.

In an embodiment, the plurality of pixels PX included in each of the front display area FDA, the side display area SDA, the corner display area CDA, and the middle display area MDA may provide an independent image, for example. In another embodiment, the plurality of pixels PX included in each of the front display area FDA, the side display area SDA, the corner display area CDA, and the middle display area MDA may provide portions of one image, respectively.

The front display area FDA may be a flat display area, and may include first pixels PX1 each including a display element. The front display area FDA may provide a most part of an image.

Pixels PX each including a display element may be also arranged in the side display area SDA. The side display area SDA may display an image by the pixels PX. The side display area SDA may include a first side display area SDA1, a second side display area SDA2, a third side display area SDA3, and a fourth side display area SDA4. At least one of the first side display area SDA1, the second side display area SDA2, the third side display area SDA3, and the fourth side display area SDA4 may be omitted.

The first side display area SDA1 and the third side display area SDA3 may be connected to the front display area FDA in the first direction (for example, the y direction). In an embodiment, the first side display area SDA1 may extend from the front display area FDA in a −y direction, and the third side display area SDA3 may extend from the front display area FDA in a +y direction, for example.

The first side display area SDA1 and the third side display area SDA3 may have arbitrary radii of curvature and may be bent. In an embodiment, the first side display area SDA1 and the third side display area SDA3 may have different radii of curvature, for example. In another embodiment, the first side display area SDA1 and the third side display area SDA3 may have the same radii of curvature. A case where each of the first side display area SDA1 and the third side display area SDA3 has the same radius of curvature, namely, a first radius of curvature R1, will now be described in detail. Because the first side display area SDA1 and the third side display area SDA3 are the same as or similar to each other, the first side display area SDA1 will now be focused on and described in detail.

The second side display area SDA2 and the fourth side display area SDA4 may be connected to the front display area FDA in the second direction (for example, the x direction). In an embodiment, the second side display area SDA2 may extend from the front display area FDA in a −x direction, and the fourth side display area SDA4 may extend from the front display area FDA in a +x direction, for example.

The second side display area SDA2 and the fourth side display area SDA4 may have arbitrary radii of curvature and may be bent. In an embodiment, the second side display area SDA2 and the fourth side display area SDA4 may have different radii of curvature, for example. In another embodiment, the second side display area SDA2 and the fourth side display area SDA4 may have the same radii of curvature. A case where each of the second side display area SDA2 and the fourth side display area SDA4 has the same radius of curvature, namely, a second radius of curvature R2, will now be focused on and described in detail. Because the second side display area SDA2 and the fourth side display area SDA4 are the same as or similar to each other, the second side display area SDA2 will now be focused on and described in detail.

In an embodiment, the first radius of curvature R1 of the first side display area SDA1 may be different from the second radius of curvature R2 of the second side display area SDA2. In an embodiment, the first radius of curvature R1 may be less than the second radius of curvature R2, for example. In another embodiment, the first radius of curvature R1 may be greater than the second radius of curvature R2.

In another embodiment, the first radius of curvature R1 of the first side display area SDA1 may be the same as the second radius of curvature R2 of the second side display area SDA2. A case where the first radius of curvature R1 is greater than the second radius of curvature R2 will now be focused on and described in detail.

The corner display areas CDA may extend from the corners of the front display area FDA and may be bent. The corner display areas CDA may be arranged to correspond to corner portions CP. The corner portions CP may be the corners of the display area DA, and thus may portions of the display area DA where the longer edges of the display area DA in the first direction (for example, the y direction) and the shorter edges thereof in the second direction (for example, the x direction) meet each other.

The corner display areas CDA may be between adjacent side display areas SDA. In an embodiment, a corner display area CDA may be between the first side display area SDA1 and the second side display area SDA2, for example. A corner display area CDA may be between the second side display area SDA2 and the third side display area SDA3, between the third side display area SDA3 and the fourth side display area SDA4, or between the fourth side display area SDA4 and the first side display area SDA1. Accordingly, the side display area SDA and the corner display areas CDA may be arranged to surround the front display area FDA, and may each have an arbitrary radius of curvature and may be bent.

Second pixels PX2 each including a display element may be arranged in each corner display area CDA. The corner display area CDA may display an image by the second pixels PX2. As will be described later with reference to FIG. 11AA, pixel circuits electrically connected to the second pixels PX2 arranged in the corner display area CDA may be arranged in the corner display area CDA, the front display area FDA, or the side display area SDA. The second pixels PX2 may be electrically connected to the pixel circuits arranged in the corner display area CDA, the front display area FDA, or the side display area SDA and may be driven.

A third radius of curvature R3 of the corner display area CDA may vary. In an embodiment, when the first radius of curvature R1 of the first side display area SDA1 is different from the second radius of curvature R2 of the second side display area SDA2, the third radius of curvature R3 of the corner display area CDA may gradually change within a range between the first radius of curvature R1 and the second radius of curvature R2, for example.

In an embodiment, the first radius of curvature R1 of the first side display area SDA1 is greater than the second radius of curvature R2 of the second side display area SDA2, the third radius of curvature R3 of the corner display area CDA may gradually decrease in a direction from the first side display area SDA1 to the second side display area SDA2. In an embodiment, the third radius of curvature R3 of the corner display area CDA may be less than the first radius of curvature R1 and may be greater than the second radius of curvature R2, for example.

In an embodiment, the display panel 10 may further include a middle display area MDA. The middle display area MDA may be between the corner display area CDA and the front display area FDA. In an embodiment, the middle display area MDA may extend between the side display area SDA and the corner display area CDA. In an embodiment, the middle display area MDA may extend between the first side display area SDA1 and the corner display area CDA, for example. The middle display area MDA may also extend between the second side display area SDA2 and the corner display area CDA. In an embodiment, the middle display area MDA may be bent.

The middle display area MDA may include third pixels PX3 each including a middle display element. Voltage wires for providing a voltage may be arranged on the middle display area MDA, and the third pixels PX3 may overlap the voltage wires. In this case, the third pixels PX3 may be over the voltage wires. As will be described later with reference to FIG. 11AA, pixel circuits electrically connected to the third pixels PX3 arranged in the middle display area MDA may not be arranged in the middle display area MDA but may be arranged in the front display area FDA and/or the side display area SDA. The third pixels PX3 may be electrically connected to the pixel circuits arranged in the front display area FDA and/or the side display area SDA and may be driven.

In the illustrated embodiment, the display apparatus 1 may display an image not only in the front display area FDA but also in the side display area SDA, the corner display area CDA, and the middle display area MDA. Accordingly, occupancy of the display area DA in the display apparatus 1 may increase. Because the display apparatus 1 is bent at its corners and includes the corner display areas CDA displaying an image, an aesthetic sense may improve.

Figure 3A:
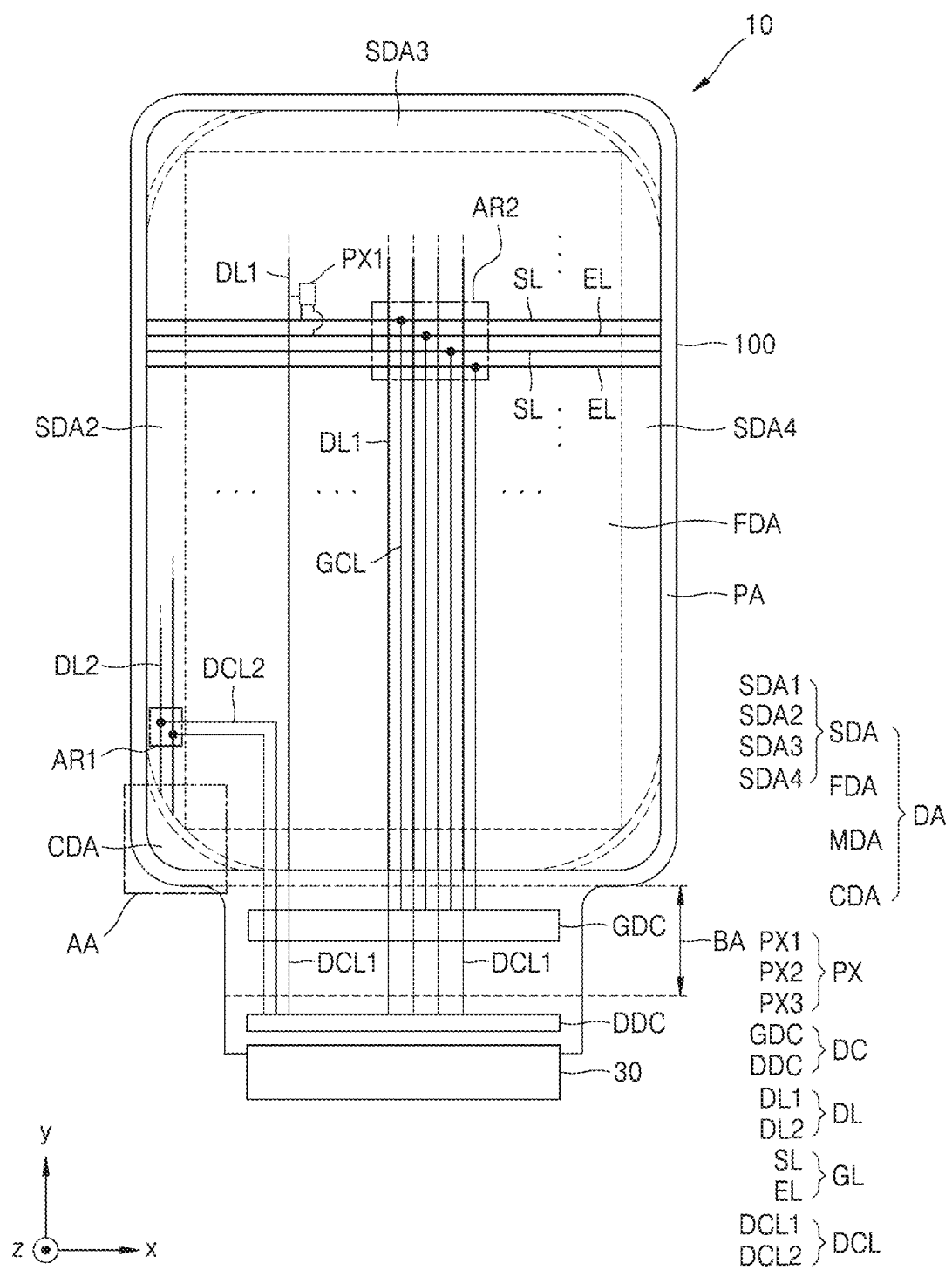
FIG. 3AA is a schematic plan view of an embodiment of a display panel, and FIG. 3AB is an enlarged view of a portion AA indicated by a dot-dash line of the display panel of FIG. 3AA.
Figure 3A:
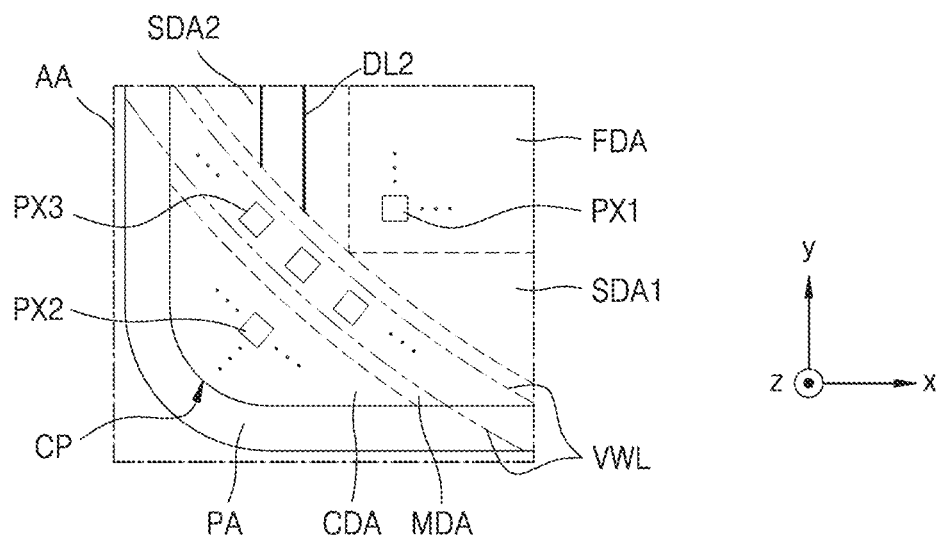
Figure 3B:
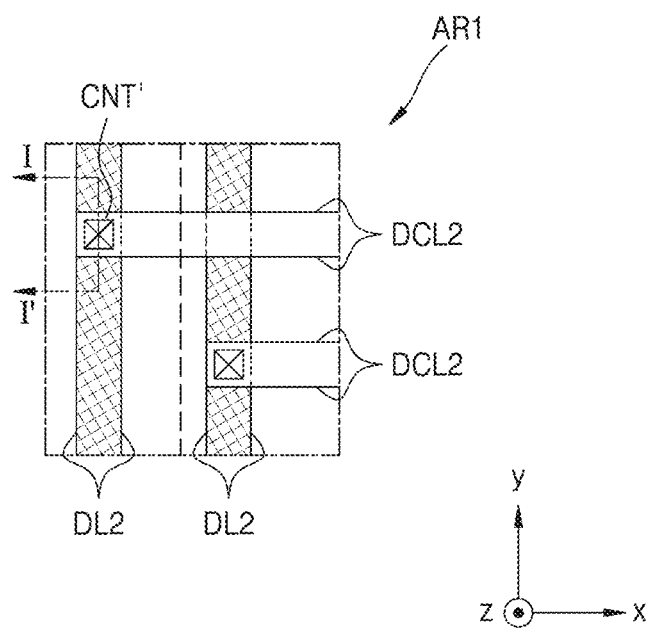
FIG. 3B is a magnified plan view of a portion of FIG. 3AA.
Figure 3C:
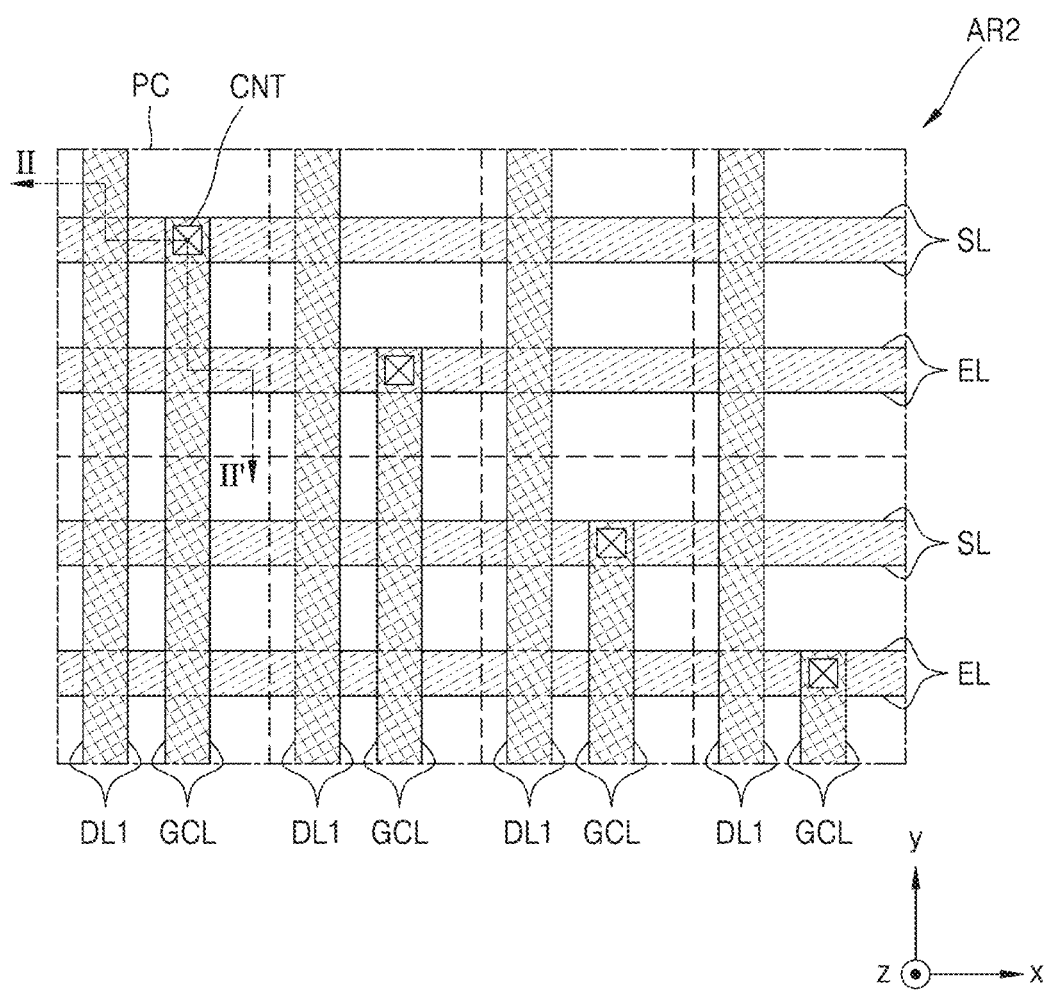
FIG. 3C is a magnified plan view of a portion of FIG. 3AA.
Figure 3D:
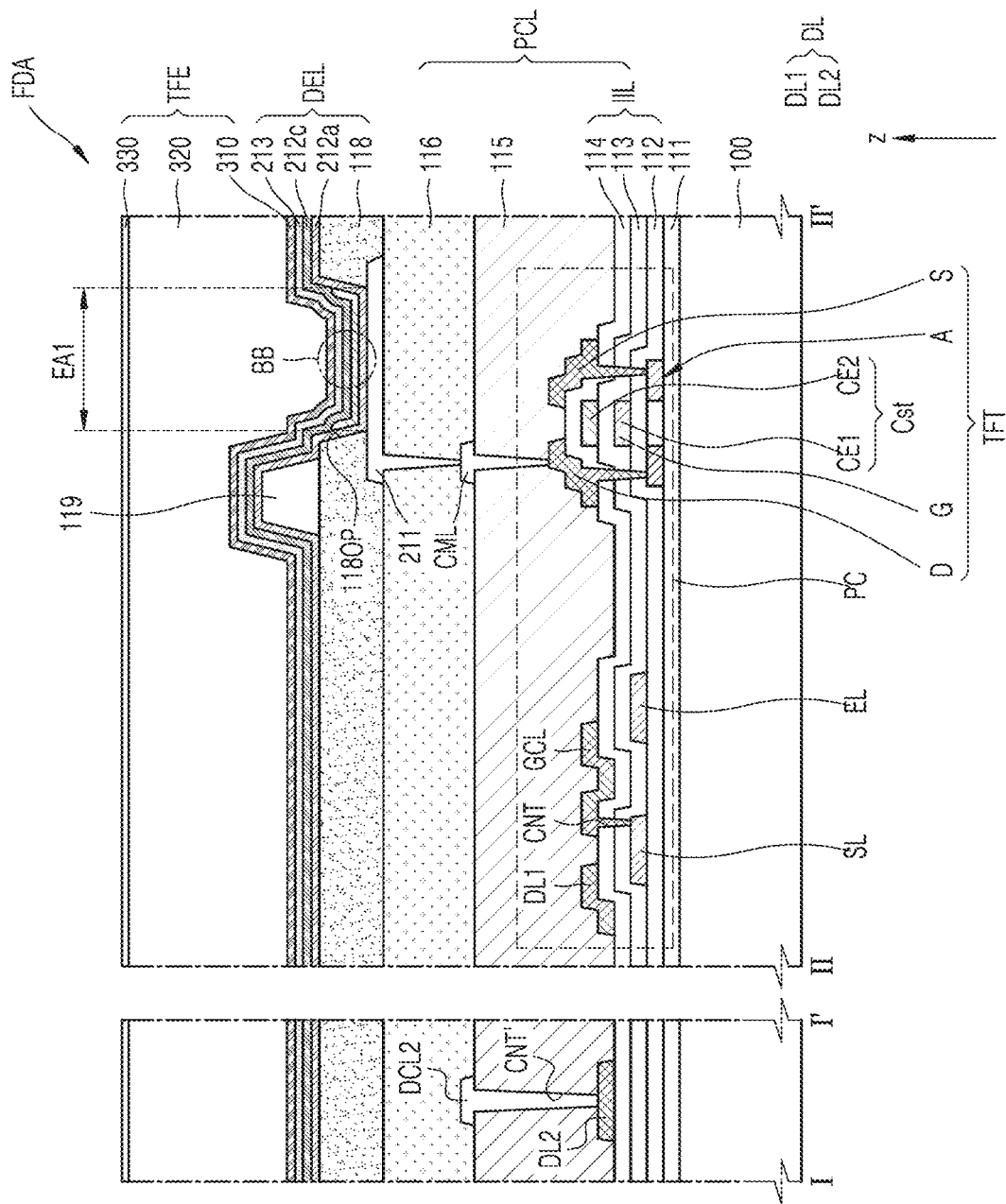
FIG. 3DA illustrates cross-sectional views of a data line of FIG. 3B and a pixel circuit of FIG. 3C taken along lines I-I' and respectively, and FIG. 3DB is an enlarged view of a portion BB indicated by a dot-dash line of FIG. 3DA.
Figure 3D:
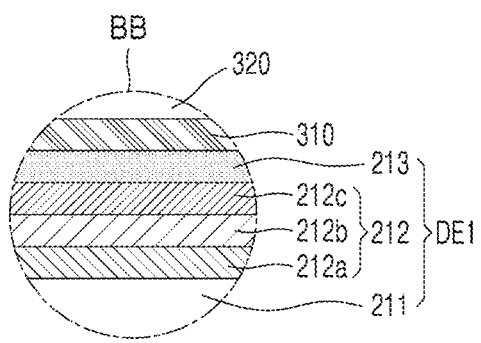
Figure 4A:
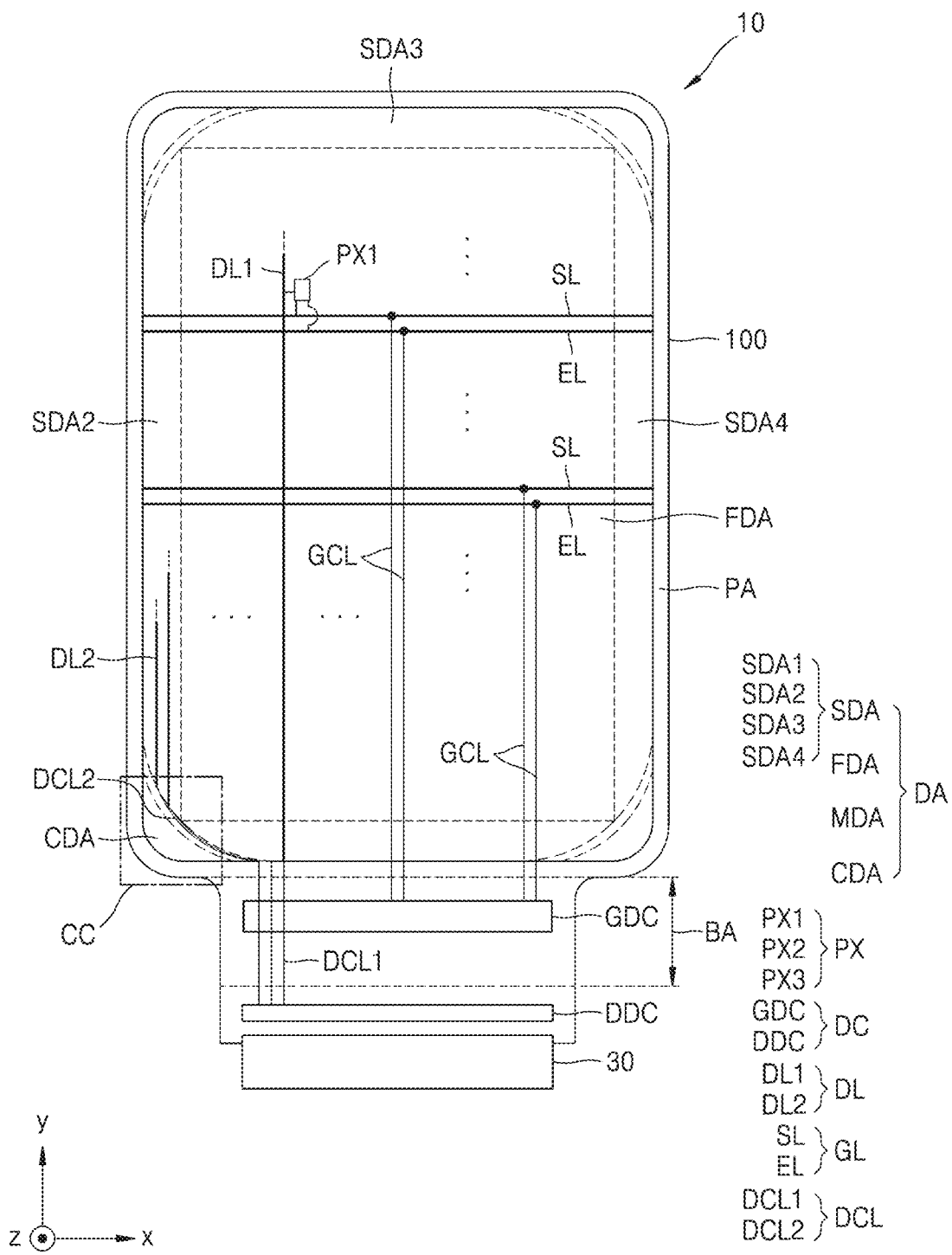
FIG. 4A is a schematic plan view of an embodiment of a display panel.

FIGS. 3AA, AB, 4A and 4B are schematic plan views of an embodiment of the display panel 10. In detail, FIGS. 3AA, AB, 4A and 4B are plan views illustrating the shapes of the side display area SDA and the corner display area CDA of the display panel 10 which are not yet bent. In other words, FIGS. 3AA, AB, 4A and 4B are plan views of the side display area SDA and the corner display area CDA of the display panel 10 which are in unbent states. FIG. 3B is a magnified plan view of a first portion AR1 of FIG. 3AA and FIG. 3C is a magnified plan view of a second portion AR2 of FIG. 3AA. FIG. 3DA illustrates cross-sectional views of a data line DL of FIG. 3B and a pixel circuit PC of FIG. 3C taken along lines and II-IP, respectively. FIG. 4A corresponds to a partial modification of FIG. 3AA, and thus will be described by focusing on differences from FIG. 3AA.

Reference numerals in FIGS. 3AA, AB, 4A and 4B that are the same as the reference numerals in FIG. 1 denote the same elements, and thus repeated descriptions thereof are omitted.

The display panel 10 may include a display element. In an embodiment, the display panel 10 may be an organic light-emitting display panel using an organic light-emitting diode including an organic emission layer, a micro light-emitting diode display panel using a micro light-emitting diode, a quantum dot light-emitting display panel using a quantum dot light-emitting diode including a quantum dot emission layer, or an inorganic light-emitting display panel using an inorganic light-emitting element including an inorganic semiconductor, for example. A case where the display panel 10 is an organic light-emitting display panel using an organic light-emitting diode as a display element will now be focused on and described in detail.

Referring to FIG. 3AA, the display panel 10 may include a display area DA and a peripheral area PA. The display area DA displays an image by a plurality of pixels PX, and the peripheral area PA may surround at least a portion of the display area DA. The display area DA may include a front display area FDA, a side display area SDA, a corner display area CDA, and a middle display area MDA.

The display panel 10 may include a substrate 100, and a multi-layer arranged on the substrate 100. The display area DA and the peripheral area PA may be defined in the substrate 100 and/or the multi-layer. In other words, the substrate 100 and/or the multi-layer may include the front display area FDA, the side display area SDA, the corner display area CDA, the middle display area MDA, and the peripheral area PA.

In an embodiment, the substrate 100 may include polymer resin such as glass, polyethersulphone, polyacrylate, polyetherimide, polyethylene naphthalate, polyethylene terephthalate, polyphenylene sulfide, polyimide, polycarbonate, cellulose triacetate, or cellulose acetate propionate. The substrate 100 including polymer resin may have flexible, rollable, and bendable characteristics. The substrate 100 may have a multi-layered structure including a base layer including the aforementioned polymer resin and a barrier layer (not shown).

Each of the pixels PX may include subpixels, and each of the subpixels may emit light of a predetermined color by an organic light-emitting diode as a display element. In an embodiment, each organic light-emitting diode may emit, for example, red light, green light, or blue light, for example. Each organic light-emitting diode may be connected to a pixel circuit including a thin-film transistor and a storage capacitor.

The peripheral area PA does not provide an image, and thus may be a non-display area. The peripheral area PA may include a bending area BA. The peripheral area PA extending from a lower end portion of the display area DA in the first direction (for example, the y direction) may include the bending area BA. The peripheral area PA may be bent at the bending area BA. When a front side of the display panel 10 is viewed while the bending area BA is being bent, a portion of the peripheral area PA may not be visually recognized by a user.

In the peripheral area PA, a driving circuit DC for providing an electrical signal to each pixel PX through a signal line, a voltage wire for providing a voltage, for example, may be arranged. The driving circuit DC may include a gate driving circuit GDC and a data driving circuit DDC.

The gate driving circuit GDC may transmit a gate signal to each pixel PX via a gate line GL. The gate line GL may extend in the second direction (for example, the x direction) and may be connected to pixels PX disposed on the same row. The gate line GL may include a scan line SL and a light-emission control line EL, and the gate signal may include a scan signal and a light-emission control signal. The gate driving circuit GDC may include a scan driving circuit, and may transmit a scan signal to each pixel PX through a scan line SL. The gate driving circuit GDC may include a light-emission control driving circuit, and may provide a light-emission control signal to each pixel PX through a light-emission control line EL.

The gate driving circuit GDC may be on one side of the peripheral area PA. In an embodiment, as shown in FIG. 3AA, the gate driving circuit GDC may be arranged in a portion of the peripheral area PA that corresponds to a lower end portion of the display panel 10, for example, for example. In another embodiment, the gate driving circuit GDC may be arranged in a portion of the peripheral area PA that corresponds to the left side or right side of the display panel 10.

The gate line GL may be connected to the gate driving circuit GDC via a gate connection line GCL. The gate connection line GCL may extend in the first direction (for example, the y direction) intersecting the second direction (for example, the x direction), one side of the gate connection line GCL may be connected to the gate driving circuit GDC, and the other side thereof may be connected to the gate line GL. The gate driving circuit GDC may transmit the gate signal to each pixel PX via the gate connection line GCL and the gate line GL.

FIG. 3C illustrates some of a plurality of pixel circuits PC arranged in a row direction (x direction) and a column direction (y direction). Each of the scan line SL and the light-emission control line EL may extend in the second direction (for example, the x direction), and a first data line DL1 that is the data line DL may extend in the first direction (for example, the y direction). The gate connection line GCL that connects each of the scan line SL and the light-emission control line EL to the gate driving circuit GDC may extend in the first direction (for example, the y direction). The gate connection line GCL may extend in the same direction as the extension direction of the first data line DL1.

In an embodiment, as shown in FIG. 3C, one gate connection line GCL may overlap one pixel circuit PC. Pixel circuits PC arranged on the same column may be overlapped by the same gate connection line GCL. In another embodiment, two or more gate connection lines GCL may overlap one pixel circuit PC. In other words, the pixel circuits PC arranged on the same column may be overlapped by two or more gate connection lines GCL.

In an embodiment, the gate connection line GCL may be in a different layer from the layer in which the scan line SL and the light-emission control line EL are. Referring to FIG. 3DA, insulating layers such as a first gate insulating layer 112 and a second gate insulating layer 113 may be between the gate connection line GCL and the scan line SL and the light-emission control line EL. In this case, the gate connection line GCL may be connected to the scan line SL and the light-emission control line EL through a contact hole CNT defined in the first gate insulating layer 112 and the second gate insulating layer 113.

In FIG. 3DA, the gate connection line GCL is arranged on the second gate insulating layer 113. However, in another embodiment, the gate connection line GCL may be on the first gate insulating layer 112. The first gate insulating layer 112 may be between the gate connection line GCL and the scan line SL and the light-emission control line EL.

The contact hole CNT connecting the scan line SL and/or the light-emission control line EL to the gate connection line GCL may be defined in at least one pixel circuit PC from among the pixel circuits PC arranged on the same row. In an embodiment, two or more pixel circuits PC from among a plurality of pixel circuits PC arranged on the same row may be connected to the gate connection line GCL through the contact hole CNT, for example.

In an embodiment, the gate connection line GCL may be in the same layer as the layer in which the first data line DL1 is. Referring to FIG. 3DA, the gate connection line GCL and the first data line DL1 may be on an interlayer insulating layer 114.

Referring back to FIG. 3AA, the data driving circuit DDC may be on the same side as the gate driving circuit GDC. In an embodiment, the data driving circuit DDC may be on one side of the peripheral area PA, together with the gate driving circuit GDC. In an embodiment, as shown in FIG. 3AA, the data driving circuit DDC together with the gate driving circuit GDC may be arranged in the portion of the peripheral area PA corresponding to the lower end portion of the display panel 10, for example. In another embodiment, the data driving circuit DDC together with the gate driving circuit GDC may be arranged in the portion of the peripheral area PA corresponding to the left side or right side of the display panel 10.

As a comparative example, a data driving circuit and a gate driving circuit may be arranged on respective one sides of different peripheral areas, respectively. The data driving circuit may be in the lower end portion of a display panel, and the gate driving circuit may be on the left and/or right sides of the display panel. In this case, according to the layout of the gate driving circuit, a dead space on the left and/or right sides of the display panel may increase, for example.

In contrast, both the data driving circuit DDC and the gate driving circuit GDC in an embodiment may be on one side of the peripheral area PA. As shown in FIG. 3AA, when both the data driving circuit DDC and the gate driving circuit GDC are arranged in the lower end portion of the display panel 10, dead spaces on the left and right sides of the display panel 10 may decrease. The display area DA on which an image is displayed may increase by as much as the area by which the dead spaces on the left and right sides of the display panel 10 decrease.

The data driving circuit DDC may transmit a data signal to each pixel PX via the data line DL. The data line DL may extend in the first direction (for example, the y direction) and may be connected to pixels PX disposed on the same column.

The data line DL may include a first data line DL1 arranged in correspondence with the front display area FDA, and a second data line DL2 arranged adjacent to the edge of the display area DA. As shown in FIG. 3AA, the second data line DL2 may be arranged to correspond to the side display area SDA. The second data line DL2 may also be arranged in a portion of the front display area FDA that is adjacent to the side display area SDA.

The first data line DL1 may be connected to the data driving circuit DDC through a first data connection line DCL1. One side of the first data connection line DCL1 may be connected to the data driving circuit DDC, and the other side thereof may be connected to the first data line DL1. The first data connection line DCL1 may be arranged to correspond to the peripheral area PA.

The second data line DL2 may be connected to the data driving circuit DDC through a second data connection line DCL2. One side of the second data connection line DCL2 may be connected to the data driving circuit DDC, and the other side thereof may be connected to the second data line DL2.

In an embodiment, as shown in FIG. 3AA, a portion of the second data connection line DCL2 may overlap the peripheral area PA, and the other portion of the second data connection line DCL2 may overlap the front display area FDA. The second data connection line DCL2 may be bent at least once in the front display area FDA. A portion of the second data connection line DCL2 may extend from the front display area FDA in the second direction (for example, the x direction).

FIG. 3B illustrates magnified portions of the second data line DL2 and the second data connection line DCL2. A portion of the second data connection line DCL2 may extend in the second direction (for example, the x direction). The second data connection line DCL2 may extend in the first direction (for example, the y direction).

In an embodiment, the second data line DL2 and the second data connection line DCL2 may be in different layers. Referring to FIG. 3DA, an insulating layer such as a first planarization layer 115 may be between the second data line DL2 and the second data connection line DCL2. In this case, the second data line DL2 and the second data connection line DCL2 may be connected to each other through a contact hole CNT' defined in the first planarization layer 115.

Figure 4B:
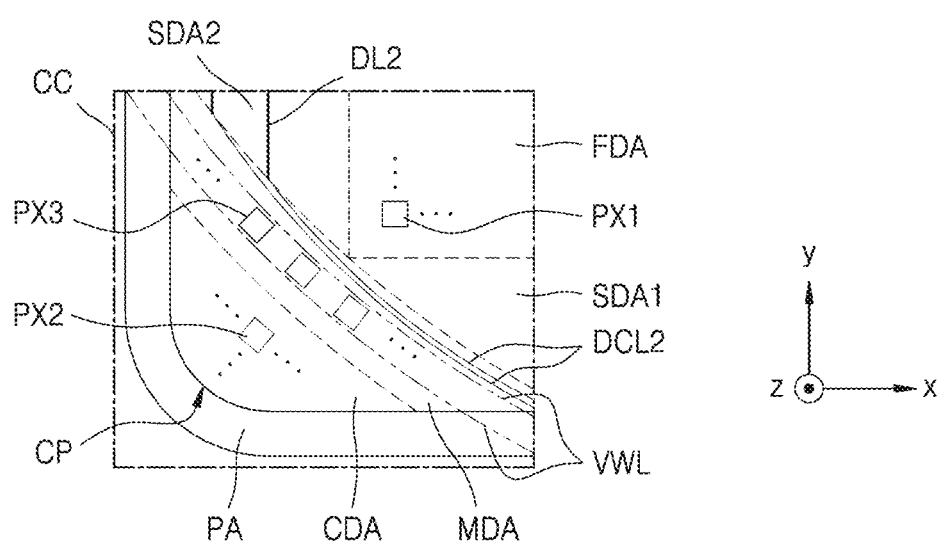
FIG. 4B is an enlarged view of a portion CC indicated by a dot-dash line of the display panel of FIG. 4A.

In an embodiment, as shown in FIG. 4B, a portion of the second data connection line DCL2 may overlap the peripheral area PA, and the other portion of the second data connection line DCL2 may overlap the middle display area MDA. In this case, the second data connection line DCL2 may not be bent in the front display area FDA, and may extend along the middle display area MDA. The second data connection line DCL2 may include a curve that follows the middle display area MDA.

The peripheral area PA may include a pad unit (not shown) that is an area where an electronic device, a printed circuit board, or the like may be electrically connected. The pad unit may be exposed without being covered with an insulating layer, and may be electrically connected to a flexible printed circuit board ("FPCB") 30. The FPCB 30 may electrically connect a controller to the pad unit, and may provide a signal or power received from the controller. In an embodiment, the gate driving circuit GDC and/or the data driving circuit DDC may be arranged on the FPCB 30.

Referring to FIG. 3AB which is an enlarged view of a portion AA of FIG. 3AA, the corner display area CDA may include second pixels PX2 each including a corner display element, and may be bent. In other words, as described above with reference to FIG. 1, the corner display area CDA may extend from the corner of the front display area FDA and may be bent with an arbitrary radius of curvature, while being arranged to correspond to the corner portion CP.

When the corner display area CDA is bent, a compressive strain may be generated more greatly than a tensile strain in the corner display area CDA. In this case, a shrinkable substrate and a shrinkable multi-layered structure need to be applied to the corner display area CDA. Accordingly, the shape of a stack of multiple layers or a substrate 100 arranged in the corner display area CDA may be different from that of a stack of multiple layers or a substrate 100 arranged in the front display area FDA. In an embodiment, the corner display area CDA may include a plurality of strip portions each extending in a direction away from the front display area FDA, and a space may be between adjacent strip portions. This will be described later in detail with reference to FIGS. 5A and 5B.

In an embodiment, the second pixels PX2 may be electrically connected to pixel circuits arranged in the front display area FDA and/or the side display area SDA. In another embodiment, the second pixels PX2 may be electrically connected to pixel circuits arranged in the corner display area CDA. In this case, the pixel circuits arranged in the corner display area CDA may share various wires connected to the pixel circuits arranged in the front display area FDA and/or the side display area SDA. The pixel circuits arranged in the corner display area CDA may provide a scan signal, a data signal, and the like through the wires. This will be described later in detail with reference to FIGS. 12A through 12E.

Third pixels PX3 each including a middle display element may be arranged in the middle display area MDA between the front display area FDA and the corner display area CDA. In an embodiment, as shown in FIG. 3AB, a voltage wire VWL for providing a voltage may be arranged in the middle display area MDA. In this case, the third pixels PX3 arranged in the middle display area MDA may overlap the voltage wire VWL. By reference, the voltage wire VWL is indicated by a two-dot-dashed line in FIG. 3AB.

Referring to FIG. 4B which is an enlarged view of a portion CC of FIG. 4A, the second data connection line DCL2 may be arranged in the middle display area MDA between the front display area FDA and the corner display area CDA. As described above, the second data connection line DCL2 may connect the second data line DL2 to the data driving circuit DDC.

When the second data connection line DCL2 is arranged in the middle display area MDA, the third pixels PX3 arranged in the middle display area MDA may overlap the second data connection line DCL2. The pixel circuits electrically connected to the third pixels PX3 may be arranged in the front display area FDA and/or the side display area SDA.

Multiple layers stacked on a display panel will now be described in detail with reference to FIG. 3DA.

Referring to FIG. 3DA, the display panel may include the substrate 100, a buffer layer 111, a pixel circuit layer PCL, a display element layer DEL, and a thin-film encapsulation layer TFE.

The buffer layer 111 may include an inorganic insulating material, such as silicon nitride, silicon oxynitride, or silicon oxide, and may be a single layer or multiple layers including the inorganic insulating material.

The pixel circuit layer PCL may be on the buffer layer 111. The pixel circuit layer PCL may include a thin-film transistor TFT included in a pixel circuit PC, an inorganic insulating layer IIL, a first planarization layer 115, and a second planarization layer 116, where the inorganic insulating layer IIL, the first planarization layer 115, and the second planarization layer 116 arranged below and/or over the components of the thin-film transistor TFT. The inorganic insulating layer IIL may include the first gate insulating layer 112, the second gate insulating layer 113, and the interlayer insulating layer 114.

The thin-film transistor TFT may include a semiconductor layer A, and the semiconductor layer A may include polysilicon. In an alternative embodiment, the semiconductor layer A may include, for example, amorphous silicon, an oxide semiconductor, or an organic semiconductor. The semiconductor layer A may include a channel region, and a source region and a drain region respectively arranged on both sides of the channel region. A gate electrode G may overlap the channel region.

The gate electrode G may include a low resistance metal material. In an embodiment, the gate electrode G may include a conductive material including at least one of molybdenum (Mo), aluminum (Al), copper (Cu), and titanium (Ti), and may be a multi-layer or single layer including the aforementioned materials, for example. In an embodiment, the scan line SL and the light-emission control line EL may be arranged in the same layer as the layer in which the gate electrode G is arranged. The scan line SL and the light-emission control line EL may be on the first gate insulating layer 112.

In an embodiment, the first gate insulating layer 112 between the semiconductor layer A and the gate electrode G may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

In an embodiment, the second gate insulating layer 113 may cover the gate electrode G. Similar to the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An upper electrode CE2 of a storage capacitor Cst may be on the second gate insulating layer 113. The upper electrode CE2 may overlap the gate electrode G. The gate electrode G and the upper electrode CE2 overlapping each other with the second gate insulating layer 113 therebetween may constitute the storage capacitor Cst of the pixel circuit PC. In other words, the gate electrode G may function as a lower electrode CE1 of the storage capacitor Cst. In this way, the storage capacitor Cst and the thin-film transistor TFT may overlap each other. In an embodiment, the storage capacitor Cst and the thin-film transistor TFT may not overlap each other.

In an embodiment, the upper electrode CE2 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may each be a single layer or multi-layer including the aforementioned materials, for example.

The interlayer insulating layer 114 may cover the upper electrode CE2. In an embodiment, the interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like, for example. The interlayer insulating layer 114 may be a single layer or multi-layer including the aforementioned inorganic insulating material.

The data line DL, the gate connection line GCL, a drain electrode D, and a source electrode S may be disposed on the interlayer insulating layer 114. The data line DL, the gate connection line GCL, the drain electrode D, and the source electrode S may include a highly conductive material. In an embodiment, the data line DL, the gate connection line GCL, the drain electrode D, and the source electrode S may include a conductive material including at least one of Mo, Al, Cu, and T1, and may be a multi-layer or single layer including the aforementioned materials, for example. In an embodiment, the data line DL, the gate connection line GCL, the drain electrode D, and the source electrode S may have a multi-layered structure of Ti/Al/Ti.

The first planarization layer 115 may cover the data line DL, the gate connection line GCL, the drain electrode D, and the source electrode S. The first planarization layer 115 may include an organic insulating material. In an embodiment, the first planarization layer 115 may include an organic insulating material, such as a commercial polymer (such as polymethyl methacrylate ("PMMA") or polystyrene ("PS")), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, or a combination thereof.

A connecting electrode CML and the second data connection line DCL2 may be on the first planarization layer 115. The connecting electrode CML may be connected to the drain electrode D or the source electrode S through a contact hole of the first planarization layer 115. The second data connection line DCL2 may be connected to the second data line DL2 through the contact hole CNT' of the first planarization layer 115.

The connecting electrode CML and the second data connection line DCL2 may include a highly conductive material. In an embodiment, the connecting electrode CML may include a conductive material including at least one of molybdenum (Mo), aluminum (Al), copper (Cu), and titanium (Ti), and may be a multi-layer or single layer including the aforementioned materials, for example. In an embodiment, the connecting electrode CML and the second data connection line DCL2 may have a multi-layer structure of Ti/Al/Ti.

A second planarization layer 116 may cover the connecting electrode CML and the second data connection line DCL2. The second planarization layer 116 may include an organic insulating layer. In an embodiment, the second planarization layer 116 may include an organic insulating material, such as a commercial polymer (such as PMMA or PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, or a combination thereof.

The display element layer DEL may be on the pixel circuit layer PCL. The display element layer DEL may include a first display element DE1. The first display element DE1 may be an organic light-emitting diode OLED (refer to FIG. 6). A pixel electrode 211 of the first display element DE1 may be electrically connected to the connecting electrode CML through a contact hole of the second planarization layer 116.

In an embodiment, the pixel electrode 211 may include conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 211 may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound of these materials. In another embodiment, the pixel electrode 211 may further include a film including ITO, IZO, ZnO, or $In_2O_3$ above/below the aforementioned reflection layer.

An opening 118OP through which a center portion of the pixel electrode 211 is exposed may be defined in a pixel defining layer 118 arranged on the pixel electrode 211. The pixel defining layer 118 may include an organic insulating material and/or an inorganic insulating material. The opening 118OP may define a light-emission area (hereinafter, also referred to as a light-emission area EA1) of light emitted by the first display element DE1. In an embodiment, a width of the opening 118OP may correspond to a width of the light-emission area EA1 of the first display element DE1, for example.

A spacer 119 may be on the pixel defining layer 118. The spacer 119 may be included to prevent damage to the substrate 100, in a method of manufacturing a display apparatus. The display panel may be manufactured using a mask sheet. In this case, when the mask sheet enters the opening 118OP of the pixel defining layer 118 or closely adheres to the pixel defining layer 118 and a deposition material is deposited on the substrate 100, the spacer 119 may prevent a portion of the substrate 100 from being damaged or destructed by the mask sheet.

The spacer 119 may include an organic insulating material such as polyimide. In an alternative embodiment, the spacer 119 may include an inorganic insulating material such as silicon nitride or silicon oxide, or may include an inorganic insulating material and an organic insulating material.

In an embodiment, the spacer 119 may include a material different from that included in the pixel defining layer 118. In another embodiment, the spacer 119 may include the same material as that included in the pixel defining layer 118. In this case, the pixel defining layer 118 and the spacer 119 may be provided together in a mask process using a halftone mask or the like.

An intermediate layer 212 may be on the pixel defining layer 118. The intermediate layer 212 may include an emission layer 212b arranged in the opening 118OP of the pixel defining layer 118. The emission layer 212b may include a low molecular or high molecular organic material that emits light of a predetermined color.

A first functional layer 212a and a second functional layer 212c may be arranged below and above the emission layer 212b, respectively. The first functional layer 212a may include a hole transport layer ("HTL"), or may include an HTL and a hole injection layer ("HIL"). The second functional layer 212c is a component arranged above the emission layer 212b, and is optional. The second functional layer 212c may include an electron transport layer ("ETL") and/or an electron injection layer ("EIL"). The first functional layer 212a and/or the second functional layer 212c may be a common layer covering the entire surface of the substrate 100, similar to an opposite electrode 213 to be described later.

The opposite electrode 213 may include a conductive material having a low work function. In an embodiment, the opposite electrode 213 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials, for example. In an alternative embodiment, the opposite electrode 213 may further include a layer, such as ITO, IZO, ZnO, or $In_2O_3$, on the (semi)transparent layer including any of the above-described materials.

In an embodiment, a capping layer (not shown) may be further arranged on the opposite electrode 213. The capping layer may include lithium fluoride (LiF), an inorganic material, or/and an organic material.

The thin-film encapsulation layer TFE may be on the opposite electrode 213. In an embodiment, the thin-film encapsulation layer TFE includes at least one inorganic encapsulation layer and at least one organic encapsulation layer. FIG. 3DA illustrates the thin-film encapsulation layer TFE including a first inorganic encapsulation layer 310, an organic encapsulation layer 320, and a second inorganic encapsulation layer 330 sequentially stacked on each other.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy-based resin, polyimide, and polyethylene. In an embodiment, the organic encapsulation layer 320 may include acrylate.

Although not shown in the drawings, a touch electrode layer may be arranged on the thin-film encapsulation layer TFE, and an optical functional layer may be arranged on the touch electrode layer. The touch screen layer may obtain coordinate information based on an external input, for example, a touch event. The optical functional layer may reduce reflectance of light (external light) externally incident toward the display apparatus, and/or may improve color purity of light emitted by the display apparatus. In an embodiment, the optical functional layer may include a phase retarder and/or a polarizer. The phase retarder may be of a film type or liquid coating type, and may include a $\lambda/2$ phase retarder and/or a $\lambda/4$ phase retarder. The polarizer may also be of a film type or liquid coating type. The film type may include a stretchable synthetic resin film, and the liquid coating type may include liquid crystals arranged in a predetermined arrangement. The phase retarder and the polarizer may further include protective films, respectively.

In another embodiment, the optical functional layer may include a black matrix and color filters. The color filters may be arranged by taking into account the colors of light beams emitted by the pixels of the display apparatus. Each of the color filters may include a pigment or dyes of a red, green, or blue color. In an alternative embodiment, each of the color filters may further include quantum dots in addition to the above-described pigment or dyes. In an alternative embodiment, some of the color filters may not include the above-described pigment or dyes, and may include scattered particles such as titanium oxide.

In another embodiment, the optical functional layer may include a destructive interference structure. The destructive interference structure may include a first reflection layer and a second reflection layer arranged in different layers. First reflected light and second reflected light respectively reflected by the first reflection layer and the second reflection layer may be destructively interfered with each other, and thus the reflectance of external light may be reduced.

An adhesion member may be between the touch electrode layer and the optical functional layer. The adhesion member may employ a general adhesion member known to the art without limitation. The adhesion member may be a pressure sensitive adhesive ("PSA").

Figure 5A:
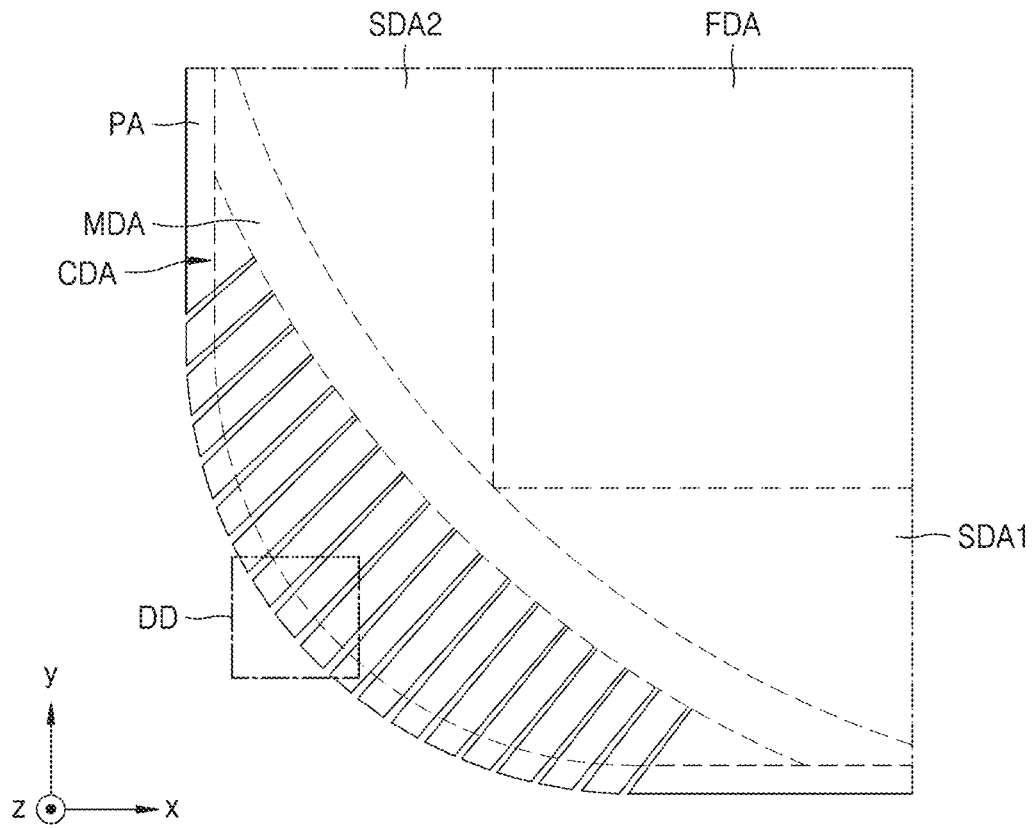
FIGS. 5AA and 5BA are schematic plan views of an embodiment of a magnified portion of a display panel, and FIGS. 5AB and 5BB are enlarged views of portions DD and EE indicated by dot-dash lines of FIGS. 5AA and 5BA, respectively.
Figure 5A:
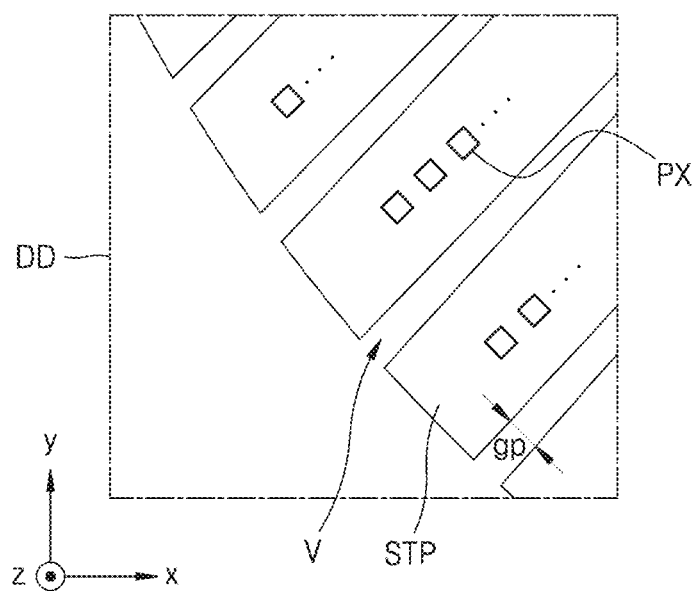

FIGS. 5AA to 5BB are schematic plan views of an embodiment of a magnified portion of the display panel 10. In detail, FIGS. 5AA and 5AB may be understood as illustrating an unfolded display panel 10 before an external force is applied thereto, and FIGS. 5BA and 5BB may be understood as illustrating a display panel 10 deformed after an external force is applied thereto.

Referring to FIGS. 5AA and 5AB, the display panel 10 may include a plurality of strip portions STP arranged to correspond to the corner display area CDA, and a plurality of spaces V may be defined between the plurality of strip portions STP and penetrate through the display panel 10. Because the display panel 10 includes the substrate 100, it may be considered that the substrate 100 has the plurality of strip portions STP and that the plurality of spaces V is defined in the substrate 100.

Respective one ends of the plurality of strip portions STP may be spaced apart from each other by a gap gp. Empty spaces may be defined between the plurality of strip portions STP due to the gap gp, and may correspond to the plurality of spaces V, respectively. The gap gp between the plurality of strip portions STP may vary. In an embodiment, as shown in FIG. 5AA, the gap gp between the plurality of strip portions STP may widen in a direction from the middle display area MDA to the corner display area CDA, for example. In another embodiment, the gap gp between the plurality of strip portions STP may not vary but may be constant. In other words, the plurality of strip portions STP may be arranged radially or in parallel.

Respective other ends of the plurality of strip portions STP may not be spaced apart from each other but may be connected to each other. As shown in FIG. 5AA, the plurality of strip portions STP may be connected to each other near the middle display area MDA. The plurality of strip portions STP may each extend from the middle display area MDA to the corner display area CDA, and may form the plurality of spaces V defined between the plurality of strip portions STP. Respective extension lengths of the plurality of strip portions STP may be different from one another. The respective extension lengths of the plurality of strip portions STP may be different from one another according to distances by which the plurality of strip portions STP are spaced apart from the middle area of the corner display area CDA. In an embodiment, strip portions STP disposed in the middle from among the plurality of strip portions STP may have greater lengths extending toward the corner display area CDA than those of the other strip portions STP, and the respective extension lengths of the plurality of strip portions STP may decrease as distances by which the plurality of strip portions STP is spaced apart from the middle area of the corner display area CDA increase, for example.

Each of the spaces V may penetrate through a front surface and a bottom surface of the display panel 10. Each of the spaces V may reduce the weight of the display panel 10 and may improve flexibility of the display panel 10. When an external force (e.g., a warping, bending, or pulling force) is applied to the display panel 10, the shapes of the spaces V change, and thus stress generation during deformation of the display panel 10 is easily reduced. Thus, abnormal deformation of the display panel 10 may be prevented, and durability of the display panel 10 may improve. Accordingly, when an electronic device including the display panel 10 is used, user's convenience may improve, and the display panel 10 may be easily applied to wearable devices.

Figure 5B:
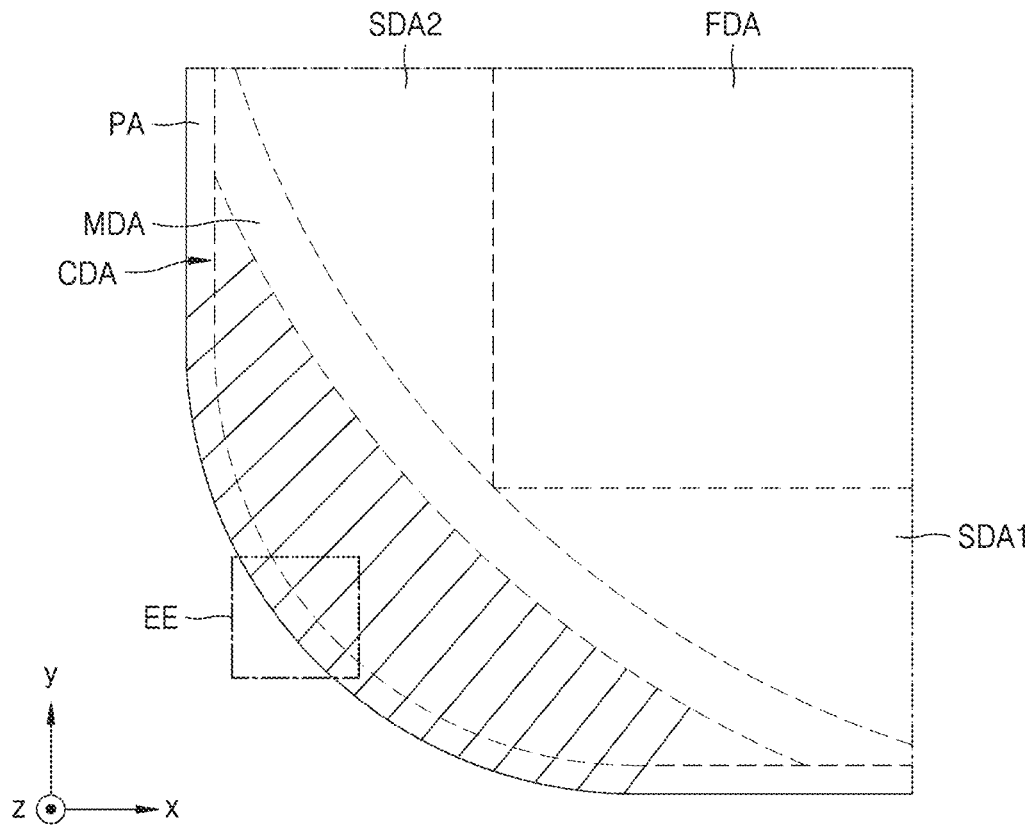
Figure 5B:
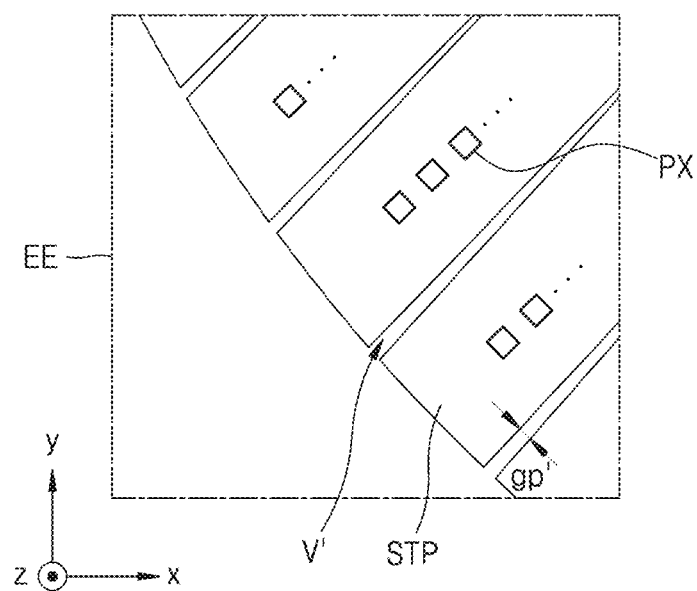

Referring to FIG. 5BB, when an external force is applied to the display panel 10, the area or shape of each space V' may be changed, and the location of each strip portion STP may also be changed. In an embodiment, when a bending force is exerted on the edges of the display panel 10 and a corner between the edges, the area of the space V' may decrease with a decrease in a gap gp' between the plurality of strip portions STP, and neighboring strip portions STP may contact each other, for example.

When an external force is applied to the display panel 10 as described above, the gap gp' between the plurality of strip portions STP and the area of the space V' may change, but there may be no changes in the shapes of the plurality of strip portions STP. In other words, a pixel circuit, a display element, and the like may be arranged on each of the plurality of strip portions STP, and the shapes of the plurality of strip portions STP do not change even when an external force is applied to the display panel 10, and thus the pixel circuit, the display element, and the like arranged on each of the plurality of strip portions STP may be protected. Thus, pixels may also be arranged in the corner display area CDA of the display panel 10 having a curvature. Accordingly, the display area DA may expand from the front display area FDA to the corner display area CDA.

A plurality of pixels PX may be arranged on each strip portion STP. The plurality of pixels PX arranged on the strip portion STP may be spaced apart from each other in one direction. The plurality of pixels PX may be arranged in various configurations such as a stripe configuration, an s-stripe configuration, and a PenTile configuration.

Figure 6:
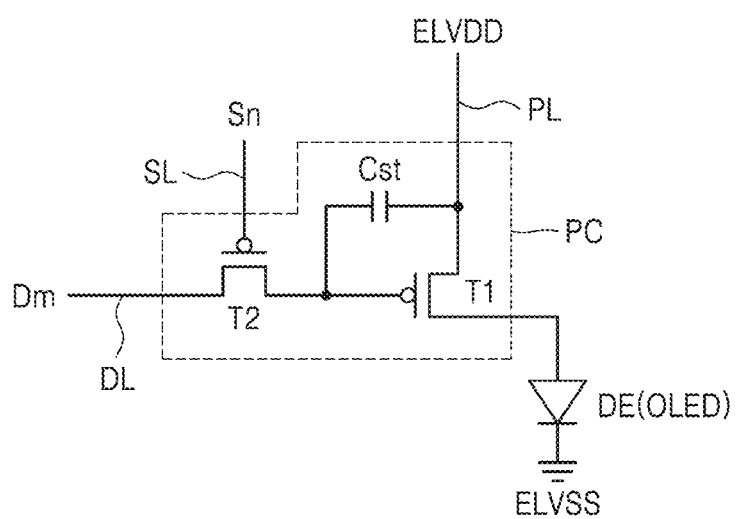
FIGS. 6 and 7 are equivalent circuit diagrams of an embodiment of a pixel circuit applicable to a display panel.

FIG. 6 is a schematic equivalent circuit diagram of an embodiment of a pixel circuit PC applicable to a display panel.

Referring to FIG. 6, the pixel circuit PC may be connected to a scan line SL, a data line DL, and a display element DE. The display element DE may be an organic light-emitting diode OLED.

The pixel circuit PC may include a driving thin-film transistor T1, a scan thin-film transistor T2, and a storage capacitor Cst. The scan thin-film transistor T2 is connected to the scan line SL and the data line DL, and transmits, to the driving thin-film transistor T1, a data voltage Dm received via the data line DL according to a scan signal Sn received via the scan line SL where n and m are natural numbers.

The storage capacitor Cst is connected to the scan thin-film transistor T2 and a driving voltage line PL, and stores a voltage corresponding to a difference between a voltage received from the scan thin-film transistor T2 and a driving voltage ELVDD supplied to the driving voltage line PL.

The driving thin-film transistor T1 is connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a predetermined brightness due to the driving current.

Although a case where the pixel circuit PC includes two thin-film transistors and one storage capacitor is illustrated in FIG. 6, embodiments are not limited thereto. In an embodiment, the pixel circuit PC may include three or more thin-film transistors and/or two or more storage capacitors, for example. In another embodiment, the pixel circuit PC may include seven thin-film transistors and one storage capacitor. This will now be described with reference to FIG. 7.

Figure 7:
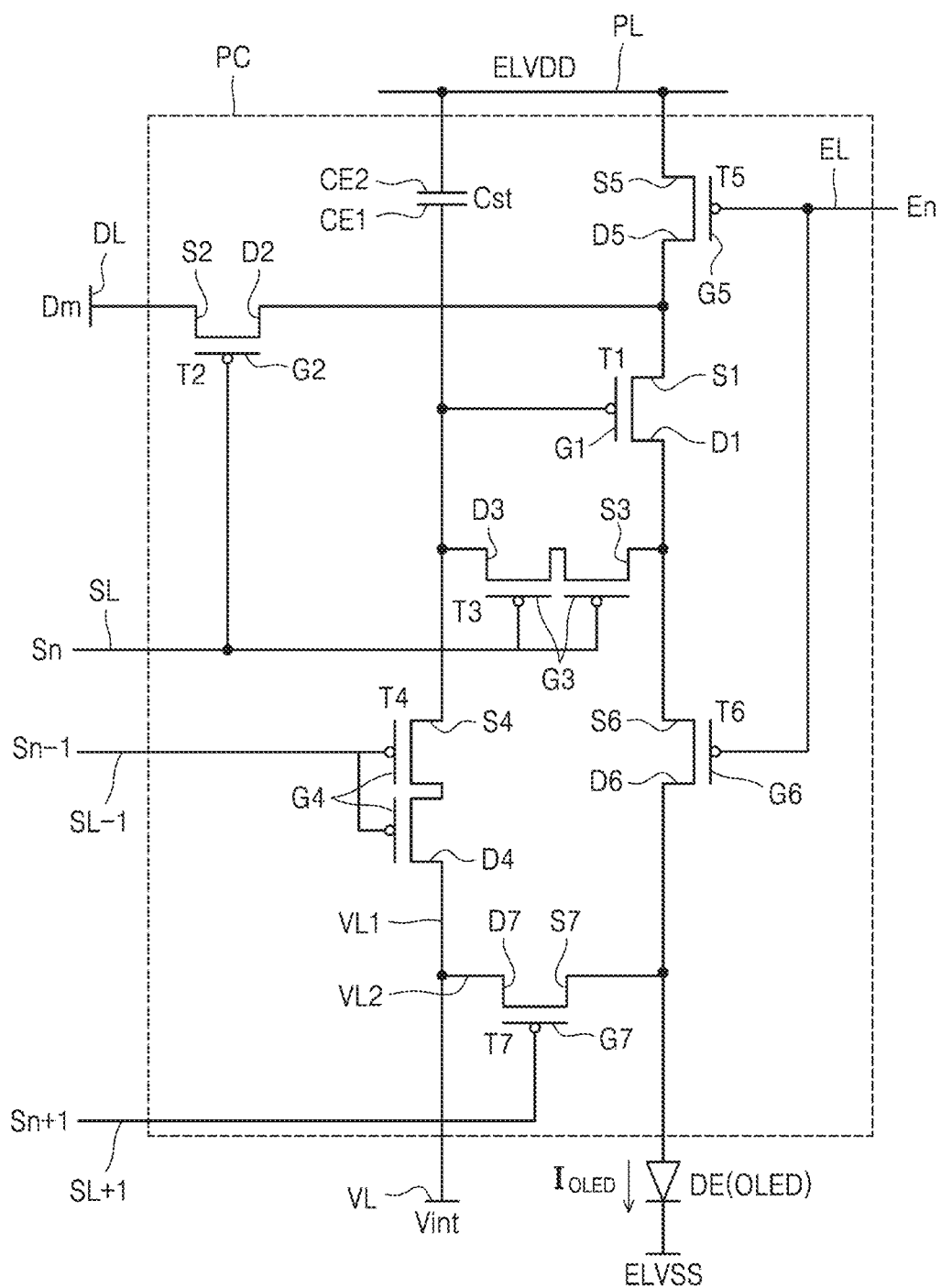

FIG. 7 is a schematic equivalent circuit diagram of an embodiment of a pixel circuit PC applicable to a display panel.

Referring to FIG. 7, the pixel circuit PC may be connected to a scan line SL, a data line DL, and a display element DE. The display element DE may be an organic light-emitting diode OLED.

In an embodiment, as shown in FIG. 7, the pixel circuit PC includes first through seventh thin-film transistors T1 through T7 and a storage capacitor Cst, for example. The first through seventh thin-film transistors T1 through T7 and the storage capacitor Cst are connected to first through third scan lines SL, SL−1, and SL+1 for respectively transmitting first through third scan signals Sn, Sn−1, and Sn+1, a data line DL for transmitting a data voltage Dm, a light-emission control line EL for transmitting a light-emission control signal En, a driving voltage line PL for transmitting a driving voltage ELVDD, an initializing voltage line VL for transmitting an initializing voltage Vint, and a common electrode to which a common voltage ELVSS is applied.

The first thin-film transistor T1 is a driving transistor in which the magnitude of a drain current is determined according to a gate-source voltage, and the second through seventh thin-film transistors T2 through T7 may be switching transistors that are turned on/off according to the gate-source voltage, substantially, a gate voltage.

The first thin-film transistor T1 may be also referred to as a driving thin-film transistor, the second thin-film transistor T2 may be also referred to as a scan thin-film transistor, the third thin-film transistor T3 may be also referred to as a compensating thin-film transistor, the fourth thin-film transistor T4 may be also referred to as a gate initializing thin-film transistor, the fifth thin-film transistor T5 may be also referred to as a first light-emission control thin-film transistor, the sixth thin-film transistor T6 may be also referred to as a second light-emission control thin-film transistor, and the seventh thin-film transistor T7 may be also referred to as an anode initializing thin-film transistor.

The storage capacitor Cst is connected between the driving voltage line PL and a driving gate G1 of the driving thin-film transistor T1. The storage capacitor Cst may have an upper electrode CE2 connected to the driving voltage line PL, and a lower electrode CE1 connected to the driving gate G1 of the driving thin-film transistor T1.

The driving thin-film transistor T1 may control the magnitude of a driving current $I_{OLED}$ flowing from the driving voltage line PL to the organic light-emitting diode OLED according to the gate-source voltage. The driving thin-film transistor T1 may include the driving gate G1 connected to the lower electrode CE1 of the storage capacitor Cst, a driving source S1 connected to the driving voltage line PL through the first light-emission control thin-film transistor T5, and a driving drain D1 connected to the organic light-emitting diode OLED through the second light-emission control thin-film transistor T6.

The driving thin-film transistor T1 may output the driving current $I_{OLED}$ to the organic light-emitting diode OLED according to the gate-source voltage. The magnitude of the driving current $I_{OLED}$ is determined based on a difference between the gate-source voltage and a threshold voltage of the driving thin-film transistor Ti. The organic light-emitting diode OLED may receive the driving current $I_{OLED}$ from the driving thin-film transistor T1, and emit light with a brightness based on the magnitude of the driving current $I_{OLED}$.

The scan thin-film transistor T2 transmits the data voltage Dm to the driving source S1 of the driving thin-film transistor T1 in response to the first scan signal Sn. The scan thin-film transistor T2 may include a scan gate G2 connected to the first scan line SL, a scan source S2 connected to the data line DL, and a scan drain D2 connected to the driving source S1 of the driving thin-film transistor T1.

The compensating thin-film transistor T3 is serially connected between the driving drain D1 and the driving gate G1 of the driving thin-film transistor T1, and connects the driving drain D1 and the driving gate G1 of the driving thin-film transistor T1 to each other in response to the first scan signal Sn. The compensating thin-film transistor T3 may include a compensating gate G3 connected to the first scan line SL, a compensating source S3 connected to the driving drain D1 of the driving thin-film transistor T1, and a compensating drain D3 connected to the driving gate G1 of the driving thin-film transistor T1. Although the compensating thin-film transistor T3 has two thin-film transistors serially connected to each other in FIG. 7, the compensating thin-film transistor T3 may include one thin-film transistor.

The gate initializing thin-film transistor T4 applies an initializing voltage Vint to the driving gate G1 of the driving thin-film transistor T1 in response to the second scan signal Sn−1. The gate initializing thin-film transistor T4 may include a first initializing gate G4 connected to the second scan line SL−1, a first initializing source S4 connected to the driving gate G1 of the driving thin-film transistor T1, and a first initializing drain D4 connected to the initializing voltage line VL. Although the gate initializing thin-film transistor T4 includes two thin-film transistors serially connected to each other in FIG. 7, the gate initializing thin-film transistor T4 may include one thin-film transistor.

The anode initializing thin-film transistor T7 applies the initializing voltage Vint to an anode of the organic light-emitting diode OLED in response to the third scan signal Sn+1. The anode initializing thin-film transistor T7 may include a second initializing gate G7 connected to the third scan line SL+1, a second initializing source S7 connected to the anode of the organic light-emitting diode OLED, and a second initializing drain D7 connected to the initializing voltage line VL.

The first light-emission control thin-film transistor T5 may connect the driving voltage line PL to the driving source S1 of the driving thin-film transistor T1 in response to the light-emission control signal En. The first light-emission control thin-film transistor T5 may include a first light-emission control gate G5 connected to the light-emission control line EL, a first light-emission control source S5 connected to the driving voltage line PL, and a first light-emission control drain D5 connected to the driving source S1 of the driving thin-film transistor T1.

The second light-emission control thin-film transistor T6 may connect the driving drain D1 of the driving thin-film transistor T1 to the anode of the organic light-emitting diode OLED in response to the light-emission control signal En. The second light-emission control thin-film transistor T6 may include a second light-emission control gate G6 connected to the light-emission control line EL, a second light-emission control source S6 connected to the driving drain D1 of the driving thin-film transistor T1, and a second light-emission control drain D6 connected to the anode of the organic light-emitting diode OLED.

The second scan signal Sn−1 may be substantially synchronized with a first scan signal Sn on a previous row. The third scan signal Sn+1 may be substantially synchronized with the first scan signal Sn. In another embodiment, the third scan signal Sn+1 may be substantially synchronized with a first scan signal Sn on a next row.

In the illustrated embodiment, the first through seventh thin-film transistors T1 through T7 may include semiconductor layers including silicon. In an embodiment, the first through seventh thin-film transistors T1 through T7 may include semiconductor layers including low temperature polysilicon ("LTPS"). Because a polysilicon material has a high electron mobility (100 square centimeters per volt per second ($cm^2$/Vs) or greater), energy consumption power is low and reliability is high, for example. In another embodiment, the semiconductor layers of the first through seventh thin-film transistors T1 through T7 may include oxide including at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an embodiment, the semiconductor layers of the first through seventh thin-film transistors T1 through T7 may be an InSnZnO ("ITZO") semiconductor layer, an InGaZnO ("IGZO") semiconductor layer, or the like, for example. In another embodiment, some of the semiconductor layers of the first through seventh thin-film transistors T1 through T7 may include LTPS, and others thereof may include an oxide semiconductor (e.g., IGZO or the like).

Operations of one pixel circuit PC and an organic light-emitting diode OLED, as a display element DE, of the display panel 10 in an embodiment will now be described in detail. As shown in FIG. 7, the first through seventh thin-film transistors T1 through T7 are assumed to be p-type metal-oxide-semiconductor field-effect transistors ("MOSFETs").

First, in response to a light-emission control signal En of a high level, the first light-emission control thin-film transistor T5 and the second light-emission control thin-film transistor T6 are turned off, and the driving thin-film transistor T1 stops outputting the driving current $I_{OLED}$ and the organic light-emitting diode OLED stops emitting light.

Thereafter, during a gate initialization period when a second scan signal Sn−1 of a low level is received, the gate initializing thin-film transistor T4 is turned on, and the initializing voltage Vint is applied to the driving gate G1 of the driving thin-film transistor T1, namely, to the lower electrode CE1 of the storage capacitor Cst. The storage capacitor Cst stores a difference (ELVDD-Vint) between the driving voltage ELVDD and the initializing voltage Vint.

Then, during a data write period when a first scan signal Sn of a low level is received, the scan thin-film transistor T2 and the compensating thin-film transistor T3 are turned on, and the data voltage Dm is received by the driving source S1 of the driving thin-film transistor T1. The driving thin-film transistor T1 is diode-connected by the compensating thin-film transistor T3 and is biased in a forward direction. The gate voltage of the driving thin-film transistor T1 increases from the initializing voltage Vint. When the gate voltage of the driving thin-film transistor T1 becomes equal to a data compensating voltage (Dm−|Vth|) obtained by reducing a threshold voltage Vth of the driving thin-film transistor T1 from the data voltage Dm, the driving thin-film transistor T1 is turned off and at the same time the gate voltage of the driving thin-film transistor T1 stops increasing. Accordingly, the storage capacitor Cst stores a difference (ELVDD−Dm+|Vth|) between the driving voltage ELVDD and the data compensating voltage (Dm−|Vth|).

During an anode initialization period when a third scan signal Sn+1 of a low level is received, the anode initializing thin-film transistor T7 is turned on, and the initializing voltage Vint is applied to the anode of the organic light-emitting diode OLED. By allowing the organic light-emitting diode OLED to completely emit no light by applying the initializing voltage Vint to the anode of the organic light-emitting diode OLED, a pixel PX receives a data voltage Dm corresponding to a black grayscale in a next frame, but minute light emission of the organic light-emitting diode OLED may be prevented.

The first scan signal Sn and the third scan signal Sn+1 may be substantially synchronized with each other. In this case, the data write period and the anode initialization period may be the same periods.

Thereafter, in response to a light-emission control signal En of a low level, the first light-emission control thin-film transistor T5 and the second light-emission control thin-film transistor T6 may be turned on, the driving thin-film transistor T1 may output a driving current $I_{OLED}$ corresponding to a voltage (ELVDD−Dm) obtained by subtracting the threshold voltage |Vth| of the driving thin-film transistor T1 from a voltage stored in the storage capacitor Cst, namely, the source-gate voltage (ELVDD−Dm+|Vth|) of the driving thin-film transistor T1, and the organic light-emitting diode OLED may emit light with a brightness corresponding to the magnitude of the driving current $I_{OLED}$.

Figure 8A:
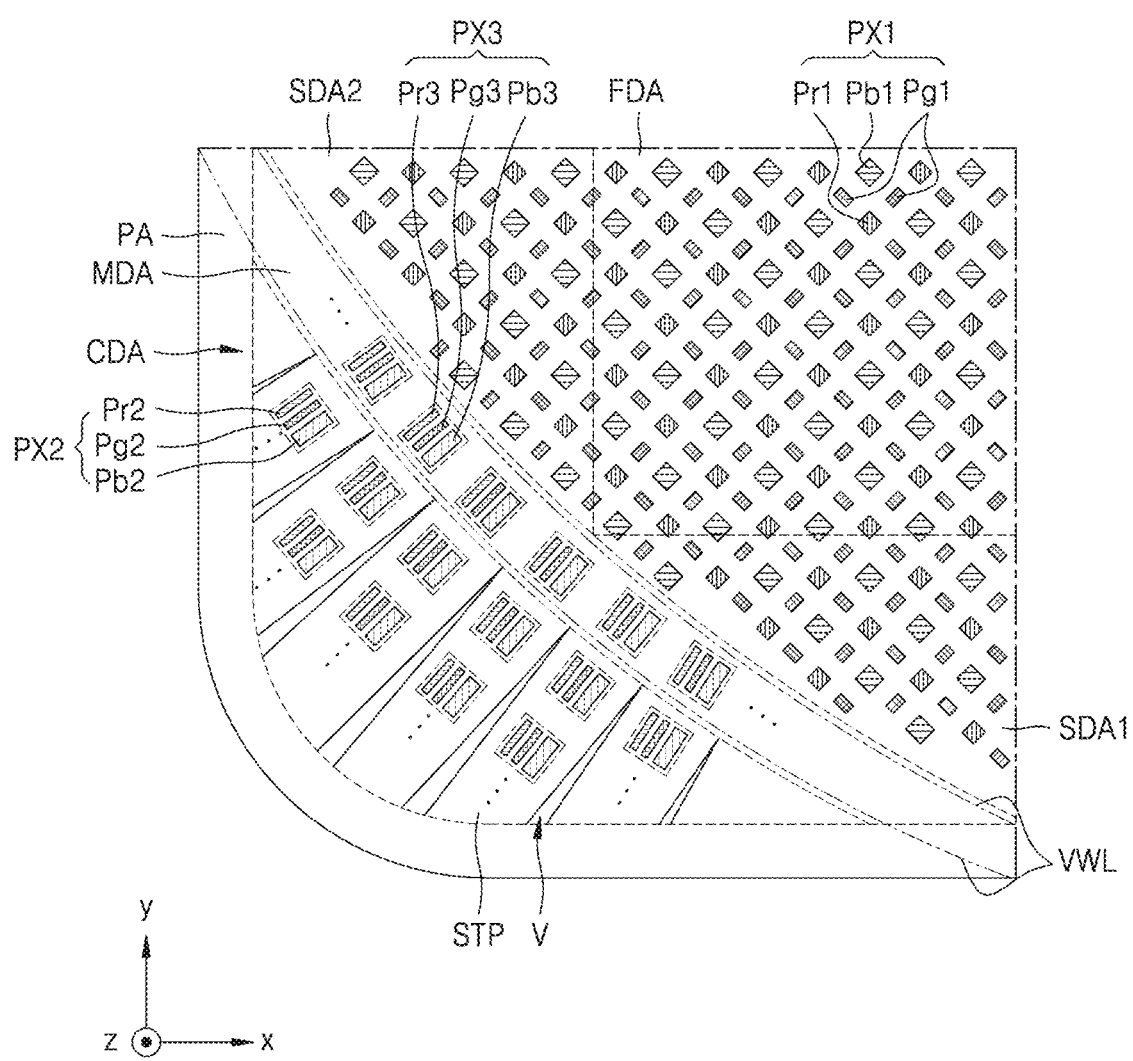
FIG. 8A is a magnified plan view schematically illustrating an embodiment of a corner portion.
Figure 8B:
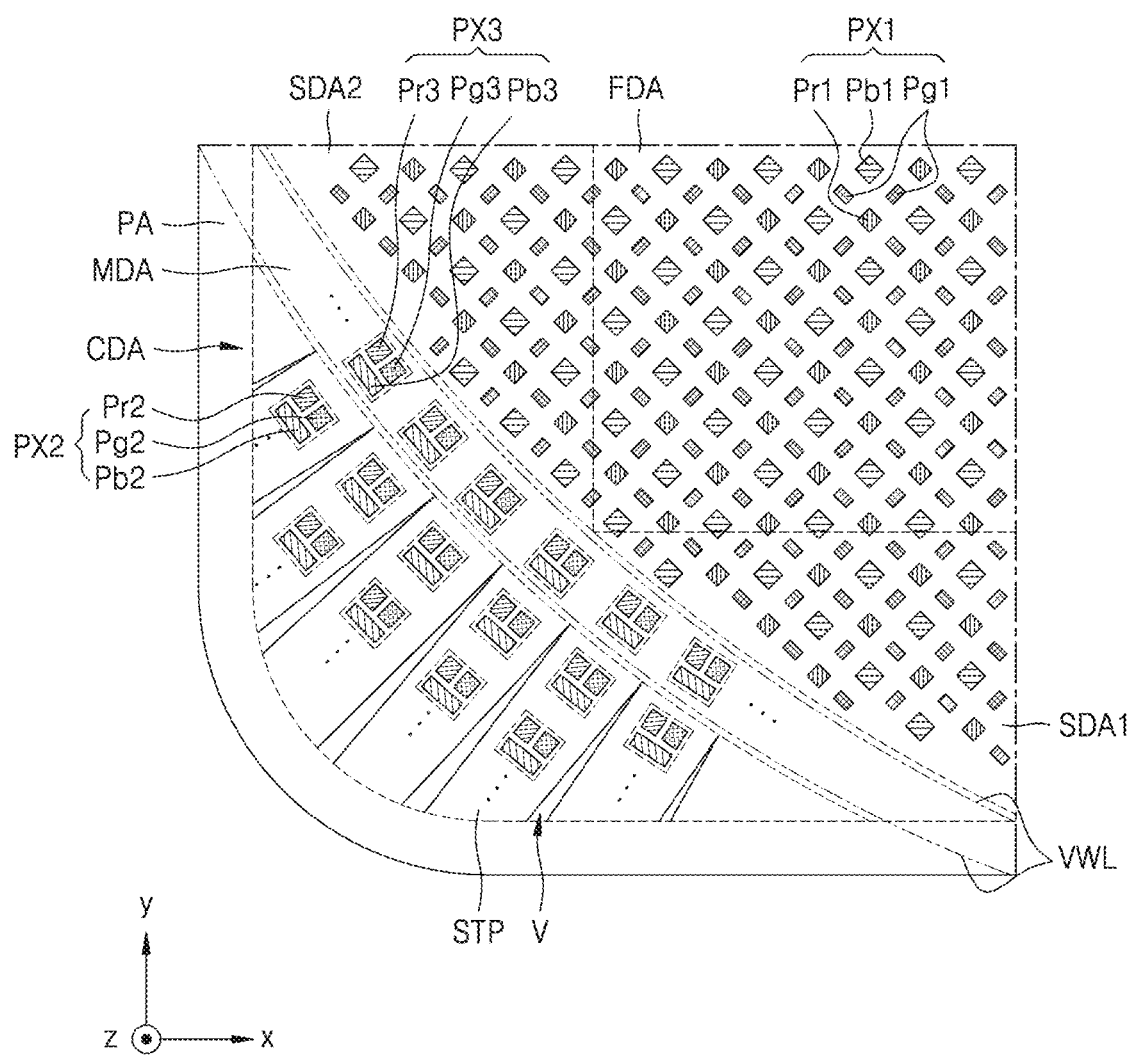
FIG. 8B is a magnified plan view schematically illustrating another embodiment of a corner portion.

FIGS. 8A and 8B are schematic plan views of an embodiment of a magnified portion of the display panel 10. In detail, FIGS. 8A and 8B are magnified plan views schematically illustrating the corner portion CP of the display panel 10. FIG. 8B corresponds to a partial modification of FIG. 8A, and thus will be described by focusing on differences from FIG. 8A.

Referring to FIG. 8A, a plurality of first pixels PX1 may be arranged in the front display area FDA and/or the side display area SDA. Each of the plurality of first pixels PX1 may include a first red subpixel Pr1, a first green subpixel Pg1, and a first blue subpixel Pb1. In an embodiment, the first pixel PX1 includes subpixels arranged in a PenTile configuration. In this case, one first red subpixel Pr1, two first green subpixels Pg1, and one first blue subpixel Pb1 may constitute one first pixel PX1.

A plurality of second pixel pixels PX2 may be arranged in the corner display area CDA, and a plurality of third pixels PX3 may be arranged in the middle display area MDA. Each of the plurality of second pixel pixels PX2 may include a second red subpixel Pr2, a second green subpixel Pg2, and a second blue subpixel Pb2, and each of the plurality of third pixels PX3 may include a third red subpixel Pr3, a third green subpixel Pg3, and a third blue subpixel Pb3. Although a plurality of third pixels PX3 is arranged in one column along the middle display area MDA in FIG. 8A, the plurality of third pixels PX3 may be also arranged near the side of the corner display area CDA and/or the front display area FDA and thus may be arranged in a plurality of columns.

In an embodiment, each second pixel PX2 and each third pixel PX3 may have the same subpixel layouts. The subpixel layout of the second pixel PX2 may be the same as that of the third pixel PX3.

In an embodiment, as shown in FIG. 8A, the second pixels PX2 and the third pixels PX3 may have stripe subpixel layouts, for example. In another embodiment, as shown in FIG. 8B, the second pixels PX2 and the third pixels PX3 may have s-stripe subpixel layouts. In another embodiment, the second pixels PX2 and the third pixels PX3 may have PenTile subpixel layouts.

In another embodiment, each second pixel PX2 and each third pixel PX3 may have different subpixel layouts. The subpixel layout of the second pixel PX2 may be different from that of the third pixel PX3. In an embodiment, each second pixel PX2 may have a stripe type layout, and each third pixel PX3 may have an s-stripe type or PenTile type layout, for example.

Each of the second pixel PX2 and the third pixel PX3 may include subpixels. When each second pixel PX2 has a stripe type or s-stripe type layout, one second red subpixel Pr2, one second green subpixel Pg2, and one second blue subpixel Pb2 may constitute one second pixel PX2. When each third pixel PX3 has a stripe type or s-stripe type layout, one third red subpixel Pr3, one third green subpixel Pg3, and one third blue subpixel Pb3 may constitute one third pixel PX3.

In an embodiment, a planar area of each second pixel PX2 may be the same as that of each third pixel PX3. The second pixel PX2 may include a corner display element (hereinafter, a second display element) DE2 (refer to FIGS. 11AA and 11C), and the planar area of the second pixel PX2 may be defined as the area of a light-emission area EA2 (refer to FIG. 11C) of the second display element DE2. Although the second pixel PX2 has been focused on and described above, this description is equally applicable to the third pixel PX3. The third pixel PX3 may include a middle display element (hereinafter, a third display element) DE3 (refer to FIGS. 11AA and 11C), and the planar area of the third pixel PX3 may be defined as the area of a light-emission area EA3 (refer to FIG. 11C) of the third display element DE3. In another embodiment, a planar area of each second pixel PX2 may be different from that of each third pixel PX3. In other words, the area of the light-emission region EA2 of the second display element DE2 may be different from that of the light-emission region EA3 of the third display element DE3.

When the planar area of the second pixel PX2 is equal to the planar area of the third pixel PX3 and the second pixel PX2 and the third pixel PX3 have the same type layouts, an image quality difference between the corner display area CDA and the middle display area MDA may be prevented or minimized.

The planar areas of the second pixel PX2 and the third pixel PX3 may be greater than the planar area of the first pixel PX1. The first pixel PX1 may include the first display element DE1 (refer to FIG. 3DA or 11A), and the planar area of the first pixel PX1 may be defined as the area of the light-emission area EA1 (refer to FIG. 3DA) of the first display element DE1. In other words, the areas of the light-emission areas EA2 and EA3 of the second display element DE2 and the third display element DE3 may be greater than the area of the light-emission region EA1 of the first display element DE1. The number (i.e., resolution) of pixels arranged per unit area of the corner display area CDA and the middle display area MDA may be less than that of the front display area FDA and/or the side display area SDA. Instead, because a space where the second pixels PX2 and the third pixels PX3 may be arranged may be more secured, the second pixels PX2 and the third pixels PX3 may have large planar areas, and thus life spans of the second pixels PX2 and the third pixels PX3 may increase.

As described above with reference to FIG. 3AB, the voltage wire VWL may be arranged in the middle display area MDA disposed between the corner display area CDA and the front display area FDA. The third pixels PX3 arranged in the middle display area MDA may overlap the voltage wire VWL. In this case, because pixels may also be arranged in the area where the voltage wire VWL is arranged, the area may be used as the display area DA. The voltage wire VWL may be the initializing voltage line VL (refer to FIG. 7) and/or a common voltage line. The initializing voltage Vint (refer to FIG. 7), the common voltage ELVSS (refer to FIG. 7), and the like may be applied to the voltage wire VWL.

In an embodiment, as will be described later with reference to FIGS. 11AA and 11AB, the second pixels PX2 arranged in the corner display area CDA may be electrically connected to the pixel circuits arranged in the front display area FDA and/or the side display area SDA. The third pixels PX3 arranged in the middle display area MDA may be electrically connected to the pixel circuits arranged on the front display area FDA and/or the side display area SDA.

In another embodiment, as will be described later with reference to FIG. 12A, the second pixels PX2 arranged in the corner display area CDA may be electrically connected to the pixel circuits arranged in the corner display area CDA.

Figure 9:
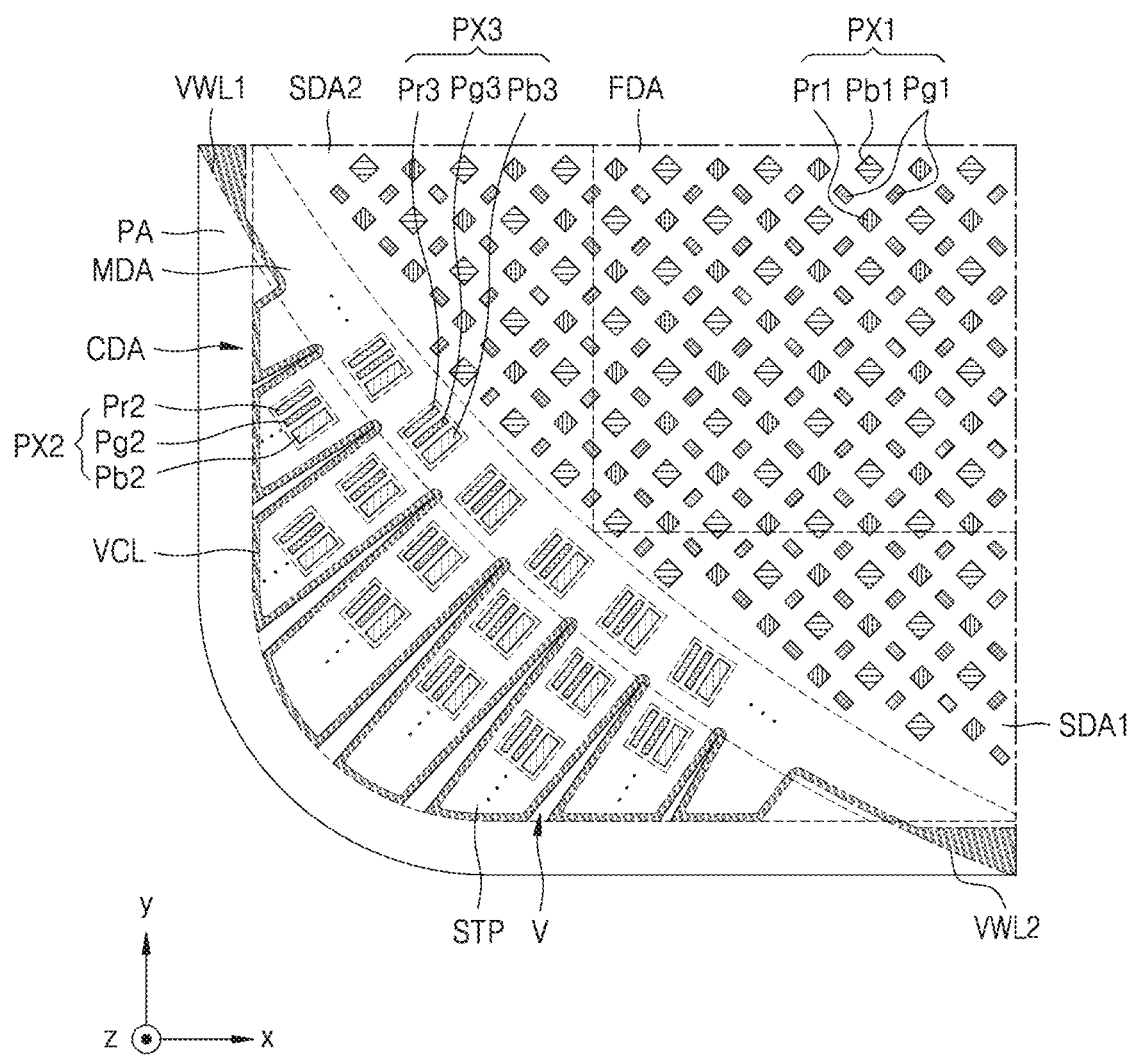
FIG. 9 is a magnified plan view schematically illustrating another embodiment of a corner portion.

FIG. 9 is a schematic plan view of an embodiment of a magnified portion of the display panel 10. In detail, FIG. 9 is a magnified plan view schematically illustrating the corner portion CP of the display panel 10. FIG. 9 corresponds to a partial modification of FIG. 8A, and thus will be described by focusing on differences from FIG. 8A.

Referring to FIG. 9, a first voltage wire VWL1 and a second voltage wire VWL2 may be arranged in the peripheral area PA of the display panel 10. The first voltage wire VWL1 and the second voltage wire VWL2 may be spaced apart from each other with the middle display area MDA therebetween. The first voltage wire VWL1 and the second voltage wire VWL2 may be connected to each other through a voltage connection line VCL.

The voltage connection line VCL may be arranged in the corner display area CDA, and may be arranged along the edge of the corner display area CDA. In an embodiment, the voltage connection line VCL may be arranged along the edges of the plurality of strip portions STP, for example. Each of the plurality of strip portions STP may extend from the middle display area MDA to the corner display area CDA. Because the voltage connection line VCL is arranged along the edges of the plurality of strip portions STP, a portion of the voltage connection line VCL may extend from the middle display area MDA to the corner display area CDA. Because the voltage connection line VCL is arranged in the corner display area CDA, a portion of the voltage connection line VCL may include a curve.

In FIG. 9, the first voltage wire VWL1 and the second voltage wire VWL2 are connected to the voltage connection line VCL arranged on the edge of the corner display area CDA, and thus, in contrast with FIG. 8A, no voltage wires VWL may be arranged in the middle display area MDA. Accordingly, pixel circuits may also be arranged in the middle display area MDA. The third pixels PX3 arranged in the middle display area MDA may be electrically connected to the pixel circuits arranged in the middle display area MDA.

The pixel circuits electrically connected to the third pixels PX3 arranged in the middle display area MDA may be arranged in the front display area FDA and/or the side display area SDA.

Figure 10:
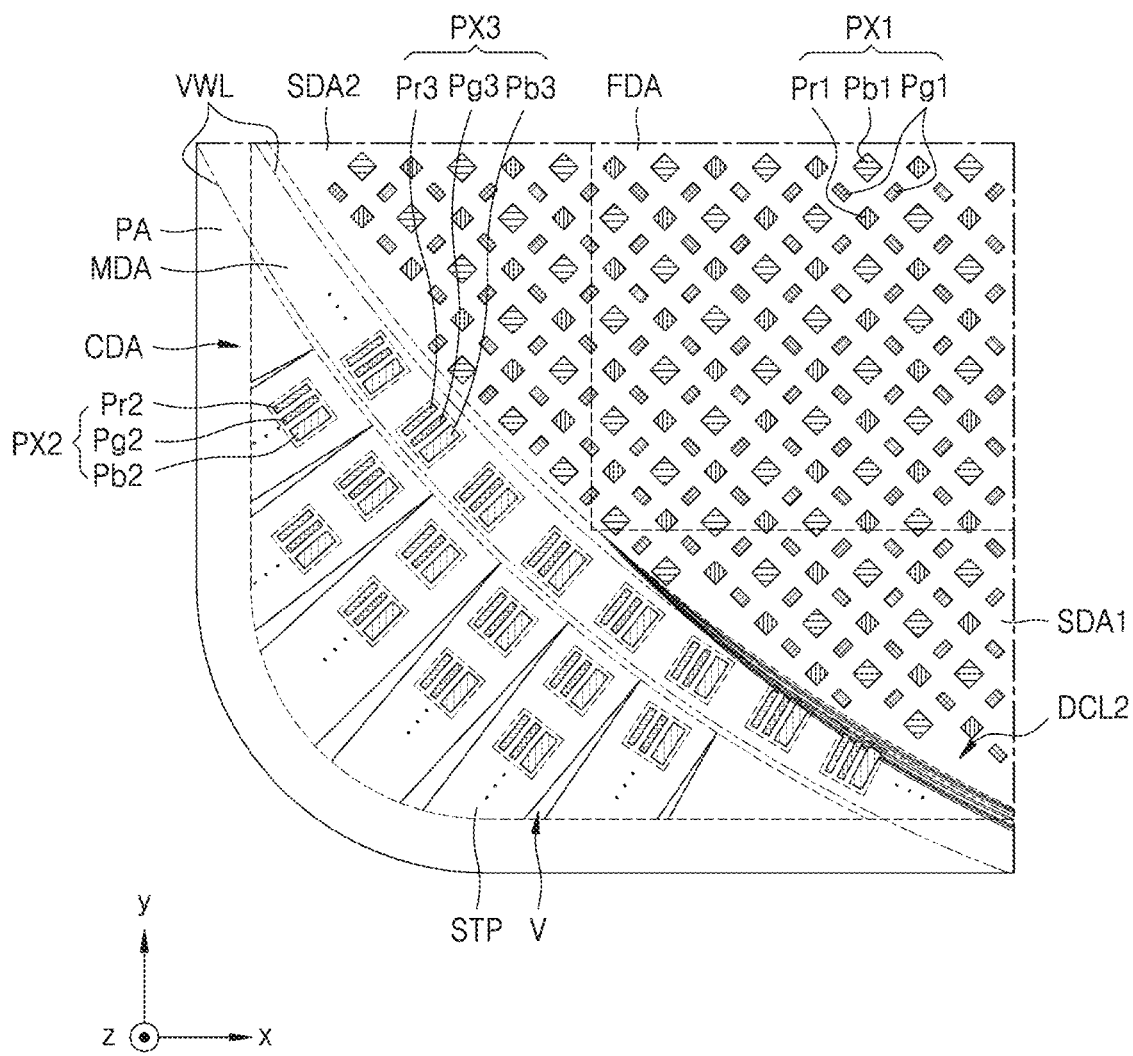
FIG. 10 is a magnified plan view schematically illustrating another embodiment of a corner portion.

FIG. 10 is a schematic plan view of another embodiment of a magnified portion of the display panel 10. In detail, FIG. 10 is a magnified plan view schematically illustrating the corner portion CP of the display panel 10. FIG. 10 corresponds to a partial modification of FIG. 8A, and thus will be described by focusing on differences from FIG. 8A.

Referring to FIG. 10, as described above with reference to FIG. 4B, a second data connection line DCL2 may be arranged in the middle display area MDA. The second data connection line DCL2 may connect the data driving circuit DDC to the second data line DL2.

When the second data connection line DCL2 is arranged in the middle display area MDA, the third pixels PX3 arranged in the middle display area MDA may overlap the second data connection line DCL2. In an embodiment, the third pixels PX3 may be arranged on the second data connection line DCL2, for example.

When the third pixels PX3 are overlapped by the second data connection line DCL2, the pixel circuits electrically connected to the third pixels PX3 may be arranged in the front display area FDA and/or the side display area SDA.

Figure 11A:
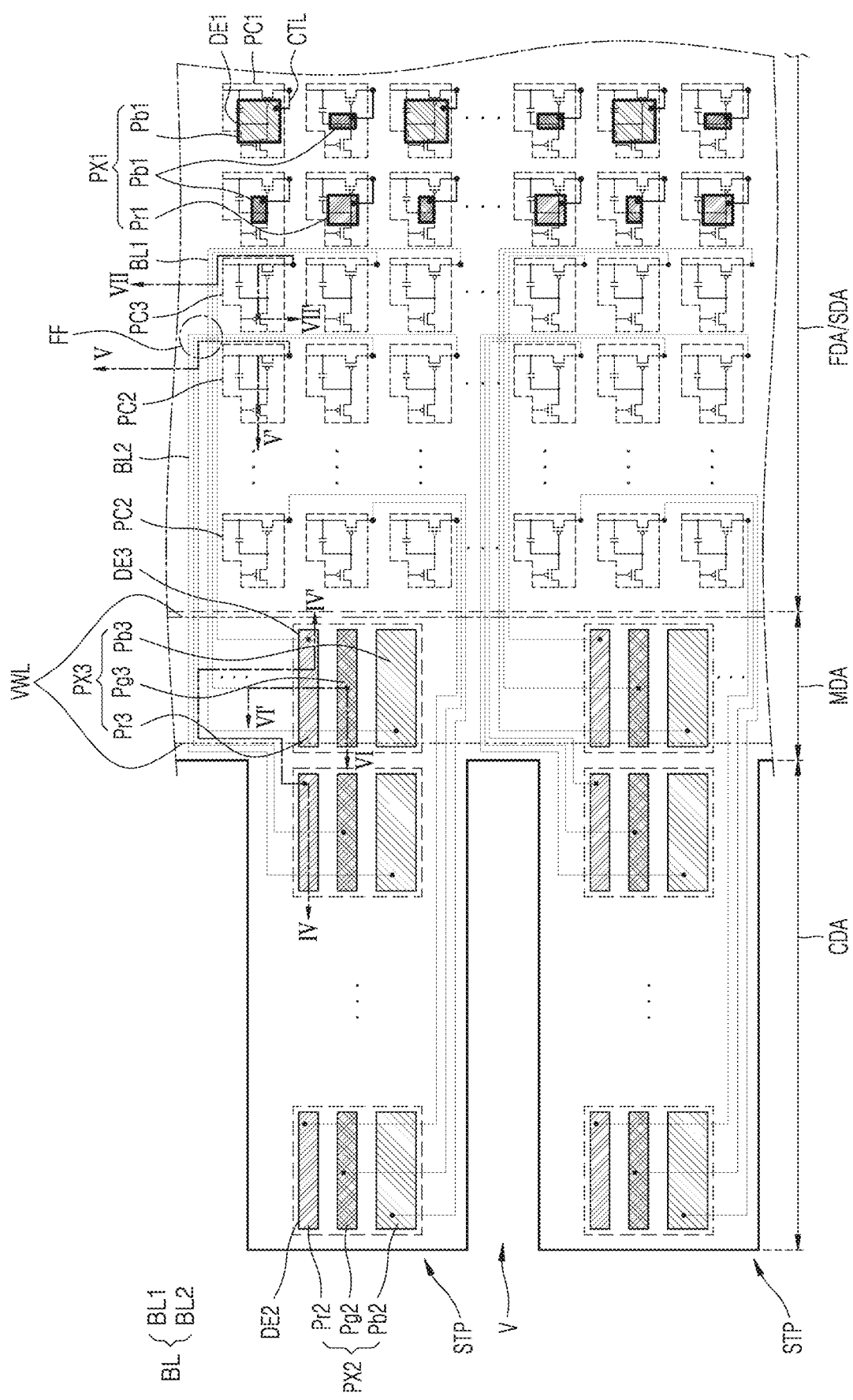
FIG. 11AA is a schematic plan view of an embodiment of a layout of pixel circuits and display elements of a display panel, and FIG. 11AB is an enlarged view of a portion FF indicated by a dot-dash line of FIG. 11AA.
Figure 11A:
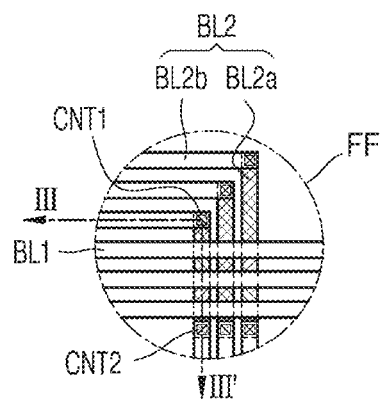
Figure 11B:
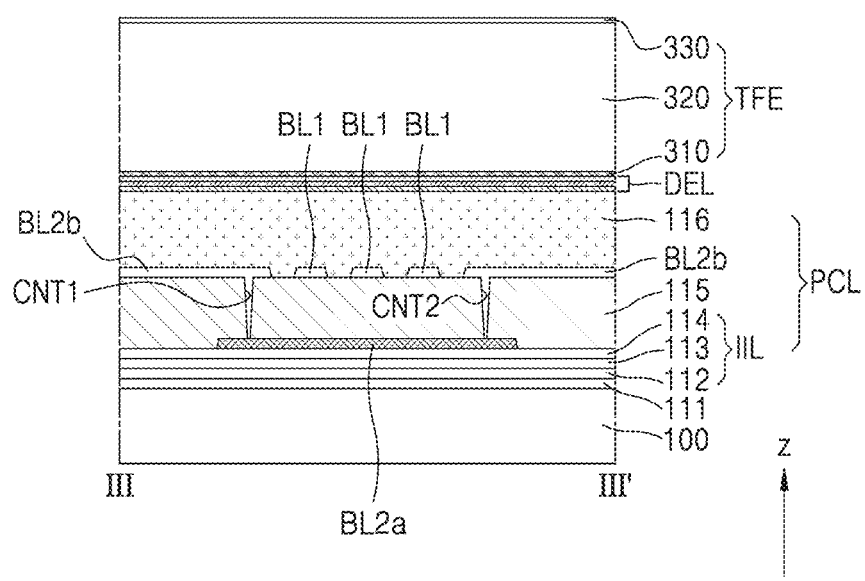
FIG. 11B is a cross-sectional view of a bridge wire of FIG. 11AA taken along line III-III'.

FIG. 11AA is a plan view of a layout of pixel circuits PC and display elements DE of the display panel 10 in an embodiment, and FIG. 11B is a cross-sectional view of a bridge line BL of FIG. 11AB taken along line III-III'.

FIG. 11AA illustrates an embodiment of a layout of pixel circuits and display elements of each of the front display area FDA and/or the side display area SDA, the middle display area MDA, and the corner display area CDA. In particular, FIG. 11AA focuses on and illustrates a layout of pixel circuits and display elements of each of the middle display area MDA and the corner display area CDA. Although a boundary between the front display area FDA and/or the side display area SDA and the middle display area MDA is indicated by a dotted straight line in FIG. 11AA, the boundary may be a curve. This may be equally applied to a boundary between the middle display area MDA and the corner display area CDA.

Referring to FIG. 11AA, first pixels PX1 may be arranged in the front display area FDA and/or the side display area SDA. Each first pixel PX1 may include a first display element DE1. The first display element DE1 may be electrically connected to a first pixel circuit PC1 through a contact line CTL. In this case, the first pixel circuit PC1 may be arranged in the front display area FDA and/or the side display area SDA where the first display element DE1 is arranged. The first display element DE1 may overlap the first pixel circuit PC1.

Third pixels PX3 may be arranged in the middle display area MDA. Each third pixel PX3 may include a third display element DE3. The third display element DE3 may be electrically connected to a middle pixel circuit (hereinafter, a third pixel circuit) PC3 through a first bridge line BL1. In this case, the third pixel circuit PC3 may be arranged in the front display area FDA and/or the side display area SDA. According to a layout of the third display element DE3 and the third pixel circuit PC3, the first bridge line BL1 may vary. At least a portion of the first bridge line BL1 may extend from the front display area FDA toward the middle display area MDA.

As described above with reference to FIGS. 8A and 10, the voltage wire VWL and/or the data connection line DCL may be arranged in the middle display area MDA. Because the voltage wire VWL and/or the data connection line DCL are arranged in the middle display area MDA, a space where the third pixel circuits PC3 are to be arranged may be insufficient. Instead, the third pixel circuits PC3 may be arranged not in the middle display area MDA but in portions of the front display area FDA and/or the side display area SDA that are adjacent to the middle display area MDA. The third pixel circuit PC3 and the third display element DE3 may be spaced apart from each other. In this way, the third pixel circuits PC3 for the third pixels PX3 are arranged in portions of the front display area FDA and/or the side display area SDA that are adjacent to the middle display area MDA, and the third pixel circuits PC3 are electrically connected to the third display elements DE3 arranged in the middle display area MDA through the first bridge lines BL1, and thus the display area may expand to the middle display area MDA where the voltage wire VWL and/or the data connection line DCL are arranged.

In another embodiment, as described above with reference to FIG. 9, when no voltage wires VWL, no data connection lines DCL, and the like are arranged in the middle display area MDA, the third pixel circuits PC3 may be arranged in the middle display area MDA. In this case, similar to the first display element DE1, the third display element DE3 may be connected to the third pixel circuit PC3 through the contact line CTL. The third display element DE3 may overlap the third pixel circuit PC3.

Second pixels PX2 may be arranged in the corner display area CDA. Each second pixel PX2 may include a second display element DE2. The second display element DE2 may be electrically connected to a corner pixel circuit (hereinafter, a second pixel circuit) PC2 through a second bridge line BL2. In this case, the second pixel circuit PC2 may be arranged in the front display area FDA and/or the side display area SDA. According to layouts of the second display element DE2 and the second pixel circuit PC2, the second bridge line BL2 may vary. At least a portion of the second bridge line BL2 may extend from the front display area FDA toward the corner display area CDA.

In an embodiment, a plurality of pixels arranged in the middle display area MDA and the corner display area CDA may be sequentially connected to a plurality of pixel circuits arranged in the front display area FDA and/or the side display area SDA. In an embodiment, as shown in FIG. 11AA, the third pixels PX3 arranged in the middle display area MDA may be closer to the front display area FDA and/or the side display area SDA than the second pixels PX2 arranged in the corner display area CDA are, for example. In this case, the third pixels PX3 may be connected to the third pixel circuits PC3 closest to the first pixels PX1. This may be equally applied to the second pixels PX2 arranged in the corner display area CDA. In an embodiment, a second pixel PX2 closest to the middle display area MDA may be connected to a second pixel circuit PC2 closest to a third pixel circuit PC3, for example. A second pixel PX2 arranged at an end of a strip portion STP may be connected to a second pixel circuit PC2 farthest from the third pixel circuit PC3. In another embodiment, the second pixel PX2 closest to the middle display area MDA may be connected to the second pixel circuit PC2 farthest from the third pixel circuit PC3. The second pixel PX2 arranged at an end of the strip portion STP may be connected to the second pixel circuit PC2 closest to the third pixel circuit PC3.

Referring to FIG. 11AB which is an enlarged view of a portion FF of FIG. 11AA, the second bridge line BL2 for connecting the second pixel PX2 to the second pixel circuit PC2 may be overlapped by the first bridge line BL1 for connecting the third pixel PX3 to the third pixel circuit PC3.

In an embodiment, the second bridge line BL2 may include a first portion BL2a and a second portion BL2b. The first portion BL2a may be overlapped by the first bridge line BL1. The first portion BL2a and the first bridge line BL1 may be in different layers. Referring to FIG. 11B, an insulating layer such as the first planarization layer 115 may be between the first portion BL2a and the first bridge line BL1. The first portion BL2a and the second portion BL2b may be connected to each other through a first contact hole CNT1 and a second contact hole CNT2 defined in the first planarization layer 115. In this case, even when the first bridge line BL1 and the second bridge line BL2 overlap each other, they may not be electrically connected to each other. Although the second bridge line BL2 includes the first portion BL2a and the second portion BL2b in FIG. 11AB, the first bridge line BL1 may include a first portion and a second portion arranged in different layers. A case where the first bridge line BL1 and the second bridge line BL2 overlap each other has been illustrated as an example, but this description may be equally applied to a case where the first bridge lines BL1 overlap each other or the second bridge lines BL2 overlap each other.

Figure 11C:
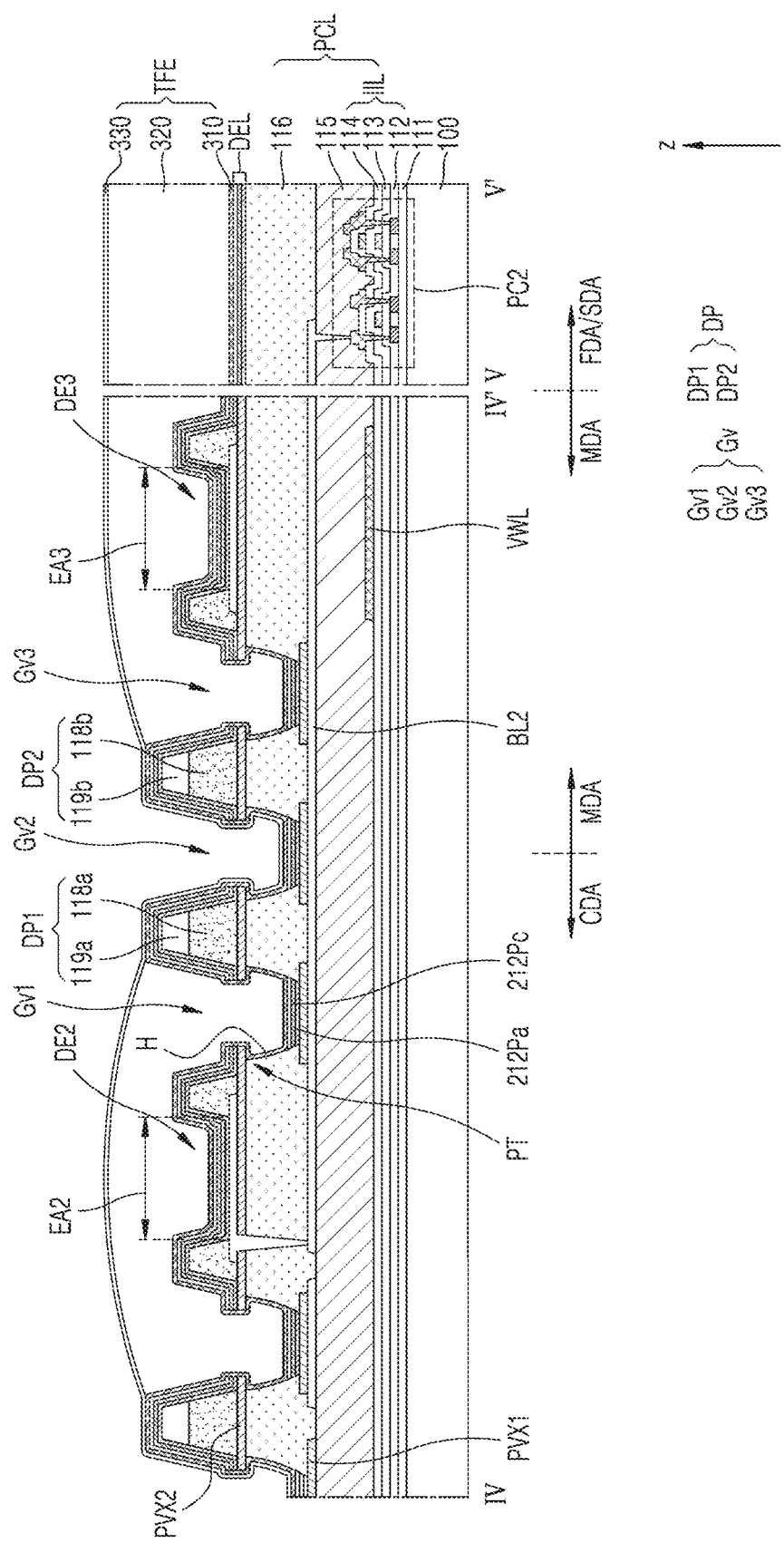
FIG. 11C is a cross-sectional view of a front display area, a middle display area, and a corner display area of FIG. 11AA taken along lines IV-IV' and V-V'.
Figure 11D:
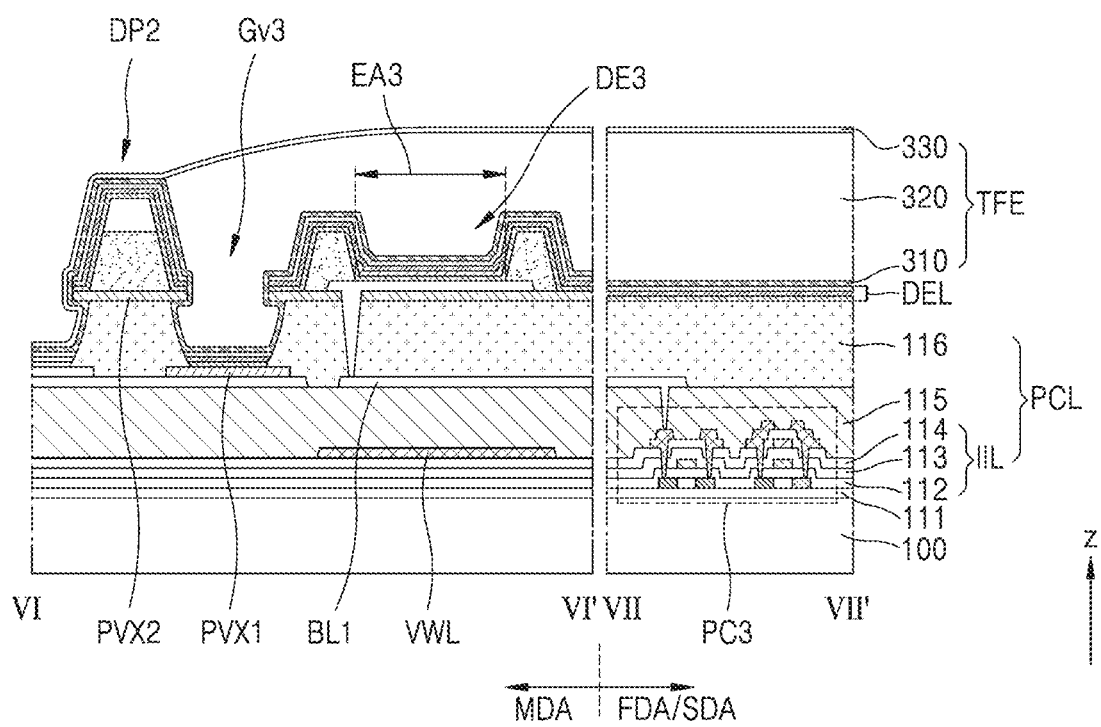
FIG. 11D is a cross-sectional view of a front display area and a middle display area of FIG. 11AA taken along lines VI-VI' and VII-VII'.

FIG. 11C is a cross-sectional view of the front display area FDA, the middle display area MDA, and the corner display area CDA of FIG. 11AA taken along lines IV-IV' and V-V', and FIG. 11D is a cross-sectional view of the front display area FDA and the middle display area MDA of FIG. 11AA taken along lines VI-VI' and VII-VII'. Reference numerals in FIGS. 11C and 11D that are the same as the reference numerals in FIG. 3DA denote the same elements, and thus repeated descriptions thereof are omitted.

Referring to FIGS. 11C and 11D, a display panel may include the corner display area CDA, the middle display area MDA and the front display area FDA. For convenience of explanation, the front display area FDA has been focused on described. However, this description may be equally applied to the side display area SDA. The corner display area CDA may include a second display element DE2, and the middle display area MDA may include a third display element DE3. In an embodiment, the second display element DE2 and the third display element DE3 may be organic light-emitting diodes OLED, for example.

In the illustrated embodiment, the second display element DE2 arranged in the corner display area CDA may be electrically connected to the second pixel circuit PC2 arranged in the front display area FDA. The third display element DE3 arranged in the middle display area MDA may be electrically connected to the third pixel circuit PC3 arranged in the front display area FDA.

Multiple layers stacked in the corner display area CDA, the middle display area MDA, and the front display area FDA will now be described in detail.

In the corner display area CDA, the middle display area MDA, and the front display area FDA, the substrate 100, the buffer layer 111, the pixel circuit layer PCL, the display element layer DEL, and the thin-film encapsulation layer TFE may be stacked. The pixel circuit layer PCL may include an inorganic insulating layer IIL, a voltage wire VWL, a bridge line BL, a first planarization layer 115, a second planarization layer 116, and the like.

A buffer layer 111 may be arranged on the substrate 100, and the inorganic insulating layer IIL may be arranged on the buffer layer 111. In an embodiment, the inorganic insulating layer IIL may include a first gate insulating layer 112, a second gate insulating layer 113, and an interlayer insulating layer 114.

The voltage wire VWL may be on the inorganic insulating layer IIL. The voltage wire VWL may be arranged to correspond to the middle display area MDA. In an embodiment, the initializing voltage Vint, the common voltage ELVSS, and the like of FIG. 7 may be applied to the voltage wire VWL, for example.

The first planarization layer 115 may be on the inorganic insulating layer IIL, and the first planarization layer 115 may cover the voltage wire VWL. The bridge line BL may be on the first planarization layer 115.

First, referring to FIG. 11C, the second bridge line BL2 may extend from the front display area FDA to the corner display area CDA. The second bridge line BL2 may overlap the front display area FDA, the middle display area MDA, and the corner display area CDA. On end of the second bridge line BL2 may be connected to the second pixel circuit PC2 arranged in the front display area FDA, and the other end of the second bridge line BL2 may be connected to the second display element DE2 arranged in the corner display area CDA. The second display element DE2 may be electrically connected to the second pixel circuit PC2 through the second bridge line BL2.

Referring to FIG. 11D, the first bridge line BL1 may extend from the front display area FDA to the middle display area MDA. The first bridge line BL1 may overlap the front display area FDA and the middle display area MDA. On end of the first bridge line BL1 may be connected to the third pixel circuit PC3 arranged in the front display area FDA, and the other end of the first bridge line BL1 may be connected to the third display element DE3 arranged in the middle display area MDA. The third display element DE3 may be electrically connected to the third pixel circuit PC3 through the first bridge line BL1.

Although the first bridge line BL1 and the second bridge line BL2 are both on the first planarization layer 115 in FIGS. 11C and 11D, the first bridge line BL1 and the second bridge line BL2 may be on the first gate insulating layer 112 or the second gate insulating layer 113.

The first bridge line BL1 and the second bridge line BL2 may be in different layers. In an embodiment, the first bridge line BL1 may be on the first gate insulating layer 112, and the second bridge line BL2 may be on the first planarization layer 115, for example.

A first inorganic pattern layer PVX1 may be on the bridge line BL. In an embodiment, a plurality of first inorganic pattern layers PVX1 may be on the bridge line BL, and may be spaced apart from each other on the bridge line BL.

The second planarization layer 116 may cover the bridge line BL. In an embodiment, the second planarization layer 116 may be a lower layer that defines a groove Gv. A hole H may be defined in the second planarization layer 116. In this case, the hole H may correspond to the first inorganic pattern layer PVX1. The second planarization layer 116 may cover the edge of the first inorganic pattern layer PVX1. Accordingly, the groove Gv may be defined by a center portion of the first inorganic pattern layer PVX1 and the hole H of the second planarization layer 116.

A second inorganic pattern layer PVX2 may be on the second planarization layer 116. Second inorganic pattern layers PVX2 may be on both sides of the groove Gv, and may have a pair of protruding tips PT protruding in a center direction of the groove Gv. In this case, a first functional layer 212a, a second functional layer 212c, and an opposite electrode 213 (refer to FIG. 3DA) arranged on the second inorganic pattern layer PVX2 may be disconnected by the groove Gv and the pair of protruding tips PT. The first functional layer pattern 212Pa, the second functional layer pattern 212Pc, and the opposite electrode 213 may be within the groove Gv.

A dam unit DP protruding in a thickness direction of the substrate 100 may be above the second inorganic pattern layer PVX2. In an embodiment, the dam unit DP may include a first dam unit DP1 and a second dam unit DP2. In an embodiment, the dam unit DP and the groove Gv may alternate with each other. In an embodiment, a first groove Gv1, a first dam unit DP1, a second groove Gv2, a second dam unit DP2, and a third groove Gv3 may be sequentially arranged in a direction from the corner display area CDA to the middle display area MDA, for example.

The dam unit DP may include first layers 118a and 118b, and second layers 119a and 119b on the first layers 118a and 118b. In this case, the first layers 118a and 118b may include the same material as a material included in the pixel defining layer 118. The first layers 118a and 118b may be simultaneously provided when the pixel defining layer 118 is provided. The second layers 119a and 119b include the same material as a material included in the spacer 119 of FIG. 3DA. The second layers 119a and 119b may be simultaneously provided when the spacer 119 is provided.

The thin-film encapsulation layer TFE may cover the second display element DE2 and the third display element DE3. The thin-film encapsulation layer TFE may include at least one inorganic encapsulation layer and at least one organic encapsulation layer. FIGS. 11C and 11D illustrate that the thin-film encapsulation layer TFE includes a first inorganic encapsulation layer 310, an organic encapsulation layer 320, and a second inorganic encapsulation layer 330.

The thin-film encapsulation layer TFE may extend from the second display element DE2 to the first dam unit DP1. The thin-film encapsulation layer TFE may extend from the third display element DE3 to the second dam unit DP2.

The first inorganic encapsulation layer 310 may entirely and consecutively cover the corner display area CDA, the middle display area MDA, and the front display area FDA. In detail, the first inorganic encapsulation layer 310 may be entirely and consecutively arranged in the first groove Gv1, the first dam unit DP1, the second groove Gv2, the second dam unit DP2, and the third groove Gv3. The first inorganic encapsulation layer 310 may cover the first functional layer pattern 212Pa, the second functional layer pattern 212Pc, and the opposite electrode 213 arranged within the groove Gv.

The organic encapsulation layer 320 may be broken up by the dam unit DP. In an embodiment, the organic encapsulation layer 320 may extend from the second display element DE2 to the first dam unit DP1 and may fill the first groove Gv1, for example. The organic encapsulation layer 320 may extend from the third display element DE3 to the second dam unit DP2 and may fill the third groove Gv3. In other words, the organic encapsulation layer 320 may be controlled by the first dam unit DP1 and the second dam unit DP2. In this case, the second groove Gv2 may not be filled with the organic encapsulation layer 320.

Similar to the first inorganic encapsulation layer 310, the second inorganic encapsulation layer 330 may entirely and consecutively cover the corner display area CDA, the middle display area MDA, and the front display area FDA. In an embodiment, the second inorganic encapsulation layer 330 may contact the first inorganic encapsulation layer 310 on the first dam unit DP1 and the second dam unit DP2. The second inorganic encapsulation layer 330 may contact the first inorganic encapsulation layer 310 in the second groove Gv2. Accordingly, the organic encapsulation layer 320 may be broken up by the dam unit DP. In an embodiment, at least one of the first layers 118a and 118b and the second layers 119a and 119b of the dam unit DP may be omitted, and the organic encapsulation layer 320 may extend from the middle display area MDA to the corner display area CDA. In other words, the organic encapsulation layer 320 may be integrally included in the middle display area MDA and the corner display area CDA.

Figure 12A:
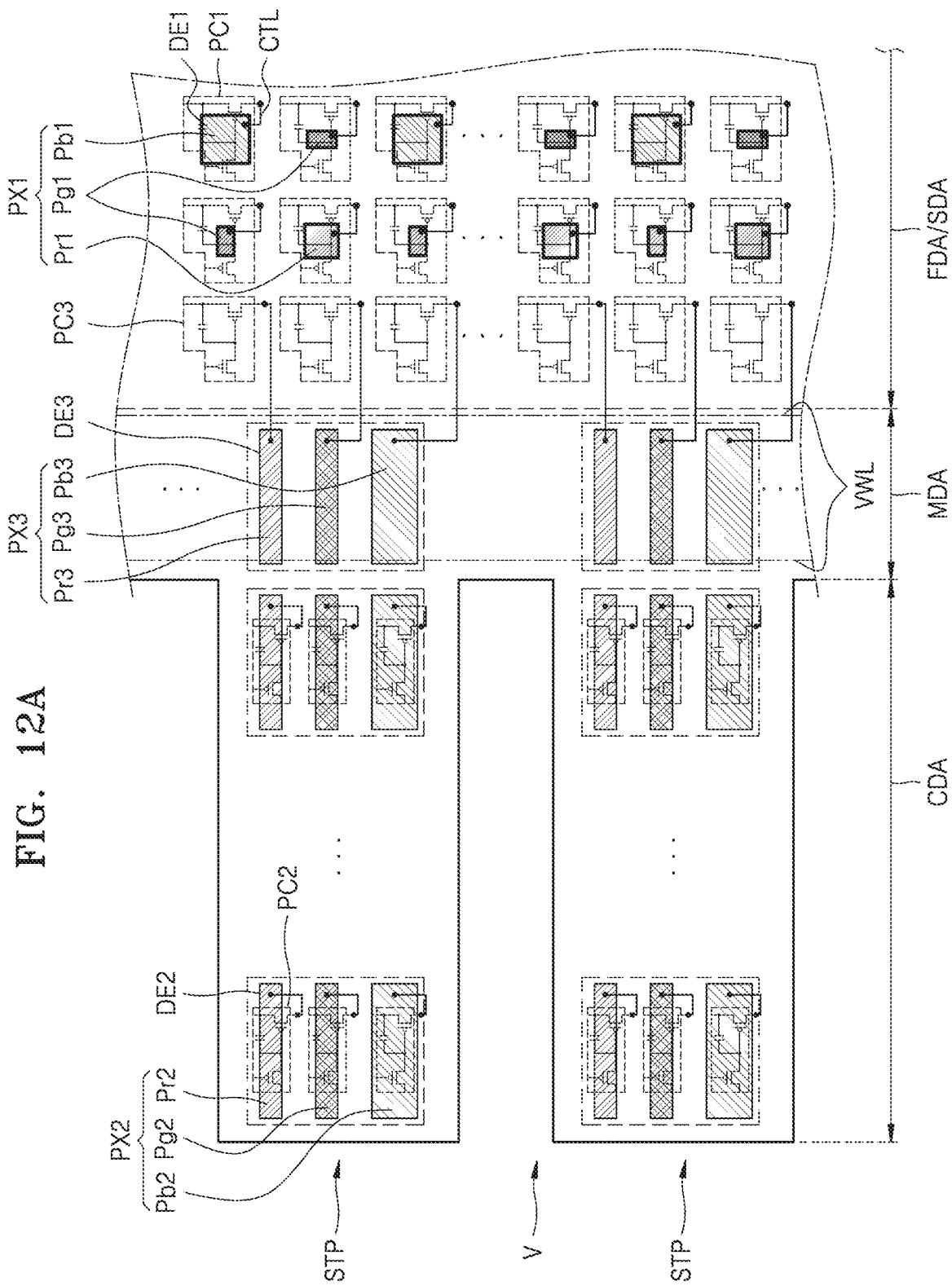
FIG. 12A is a schematic plan view of another embodiment of a layout of pixel circuits and display elements of a display panel.

FIG. 12A is a schematic plan view of another embodiment of a layout of pixel circuits PC and display elements DE of the display panel 10. FIG. 12A corresponds to a partial modification of FIG. 11AA, and thus will be described by focusing on differences from FIG. 11AA.

FIG. 12A illustrates another embodiment of a layout of pixel circuits and display elements of each of the front display area FDA and/or the side display area SDA, the middle display area MDA, and the corner display area CDA.

Referring to FIG. 12A, second pixels PX2 may be arranged in the corner display area CDA. Each second pixel PX2 may include a second display element DE2. The second display element DE2 may be electrically connected to a second pixel circuit PC2. In contrast with FIG. 11AA, the second pixel circuit PC2 may be arranged in the corner display area CDA, like the front display area FDA and/or the side display area SDA. In other words, the second pixel circuit PC2 may be arranged in the corner display area CDA, and may be electrically connected to the second display element DE2. The second display element DE2 may overlap the second pixel circuit PC2.

The second pixel circuit PC2 arranged in the corner display area CDA may share various wires with a first pixel circuit PC1 arranged in the front display area FDA and/or the side display area SDA. This will be described later in more detail with reference to FIGS. 12B through 12D.

Third pixels PX3 may be arranged in the middle display area MDA. Each third pixel PX3 may include a third display element DE3. The third display element DE3 may be electrically connected to a third pixel circuit PC3. In this case, the third pixel circuit PC3 may be arranged in the front display area FDA and/or the side display area SDA.

Figure 12B:
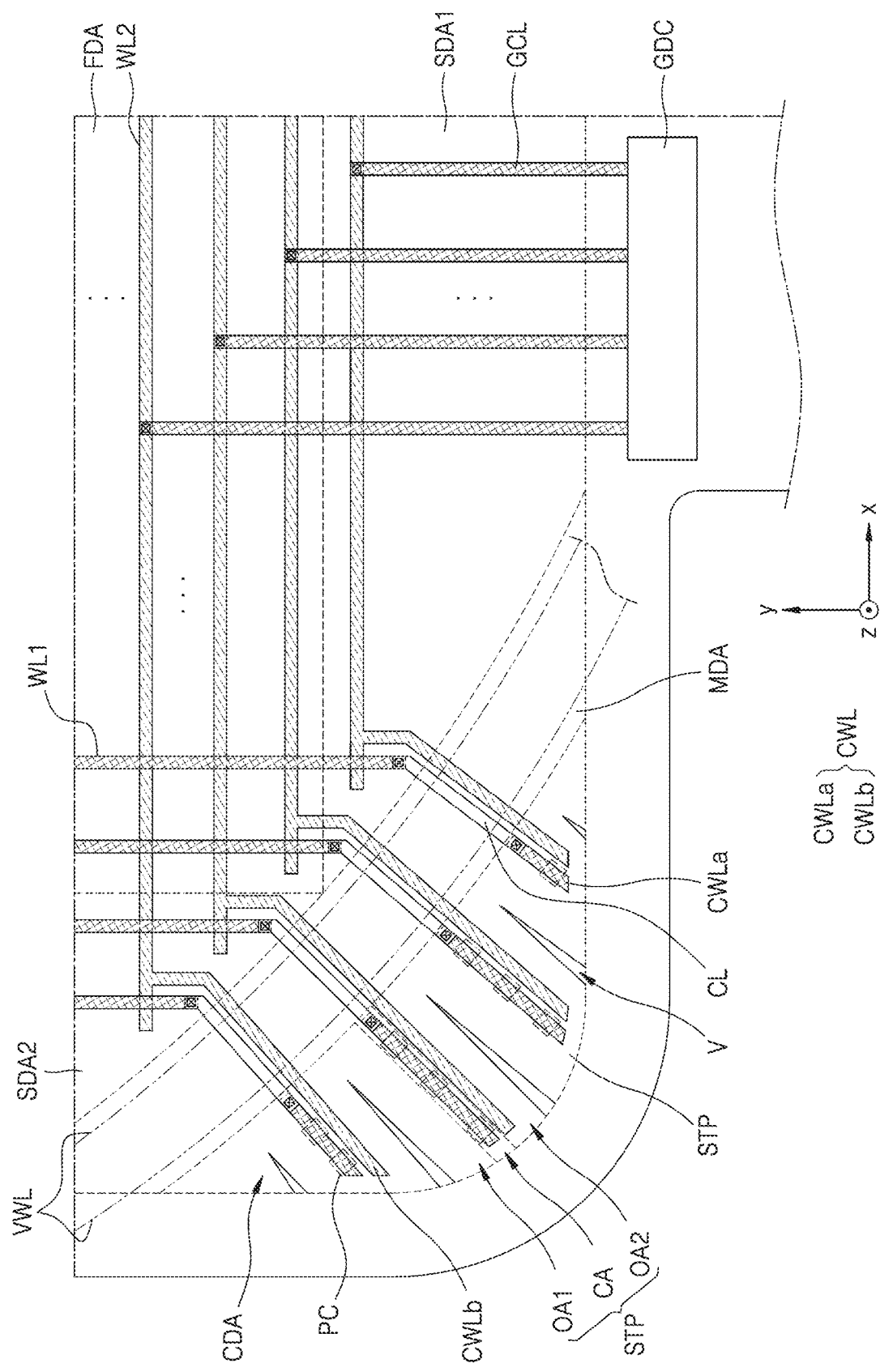
FIG. 12B is a schematic plan view of another embodiment of a magnified portion of a display panel.

FIG. 12B is a schematic plan view of another embodiment of a magnified portion of a display panel 10. In detail, FIG. 12B is a magnified plan view schematically illustrating a corner portion CP of the display panel 10.

Referring to FIG. 12B, the display panel 10 may include a substrate 100, first wires WL1, second wires WL2, corner wires CWL, and pixel circuits PC. Each corner wire CWL may include a first corner wire CWLa and a second corner wire CWLb.

The substrate 100 may include a display area and a peripheral area PA. The display area may include the front display area FDA, a first side display area SDA1 connected to the front display area FDA in the first direction (for example, the y direction), a second side display area SDA2 connect to the front display area FDA in the second direction (for example, the x direction), and a corner display area CDA disposed between the first side display area SDA1 and the second side display area SDA2 and surrounding at least a portion of the front display area FDA. The display area may include the middle display area MDA between the front display area FDA and the corner display area CDA.

The first wires WL1 and/or the second wires WL2 may be arranged in one of the front display area FDA, the first side display area SDA1, and the second side display area SDA2. In an embodiment, the first wires WL1 extending in the first direction (for example, they direction) and the second wires WL2 extending in the second direction (for example, the x direction) may be arranged in the front display area FDA, for example.

A voltage wire VWL may be arranged in the middle display area MDA. The voltage wire VWL may be arranged in an extension direction of the middle display area MDA. As described above with reference to FIG. 4B, a data connection line DCL in addition to the voltage wire VWL may be arranged in the middle display area MDA.

The corner display area CDA may include a plurality of strip portions STP each extending in a direction away from the front display area FDA. The plurality of strip portions STP may each extend from the middle display area MDA, and a space V may be defined between adjacent strip portions STP.

Each of the plurality of strip portions STP may include a center area CA, and a first outer area OA1 and a second outer area OA2 arranged on both sides of the center area CA. In this case, the center area CA, the first outer area OA1, and the second outer area OA2 may each extend in the same direction as the direction in which each of the plurality of strip portions STP extends. Pixel circuits PC may be arranged in the center area CA.

Each first wire WL1 may extend in the first direction (for example, the y direction) in the front display area FDA. The first wire WL1 may also extend in the first direction (for example, they direction) in at least one of the first side display area SDA1 and the second side display area SDA2. The first wire WL1 may transmit a data signal to at least one of the first side display area SDA1, the second side display area SDA2, and the front display area FDA. The first wire WL1 may be connected to the first corner wire CWLa.

In detail, the first wire WL1 may be connected to the first corner wire CWLa through the connection line CL.

The first wire WL1 may correspond to the data line DL of FIGS. 3AA and 4A. The first wire WL1 may be connected to the data driving circuit DDC and may transmit a data signal to a pixel circuit disposed in at least one of the first side display area SDA1, the second side display area SDA2, and the front display area FDA. The first wire WL1 may be connected to the data driving circuit DDC through the first data connection line DCL1 disposed in the peripheral area PA, as shown in FIG. 3AA, or may be connected to the data driving circuit DDC through the second data connection line DCL2 partially overlapping the front display area FDA. In another embodiment, as shown in FIGS. 4A and 4B, the first wire WL1 may be connected to the data driving circuit DDC through the second data connection line DCL2 disposed in the middle display area MDA.

In an embodiment, the first wire WL1 and the connection line CL may be in different layers. In an embodiment, an insulating layer may be between the first wire WL1 and the connection line CL, for example. In this case, the first wire WL1 and the connection line CL may be connected to each other through a contact hole of the insulating layer.

The second wire WL2 may extend in the second direction (for example, the x direction) in the front display area FDA. The second wire WL2 may also extend in the second direction (for example, the x direction) in at least one of the first side display area SDA1 and the second side display area SDA2.

The second wire WL2 may be connected to the gate driving circuit GDC. In detail, the second wire WL2 may be connected to the gate driving circuit GDC via each gate connection line GCL. The gate connection line GCL may extend in the first direction (for example, the y direction). One end of the gate connection line GCL may be connected to the gate driving circuit GDC, and the other end of the gate connection line GCL may be connected to the second wire WL2.

The gate connection line GCL may be in the same layer as the layer in which the first wire WL is. In an embodiment, the gate connection line GCL and the first wire WL1 may be on the same insulating layer, for example. The gate connection line GCL and the second wire WL2 may be in different layers. In an embodiment, an insulating layer may be between the gate connection line GCL and the second wire WL2. In this case, the gate connection line GCL and the second wire WL2 may be connected to each other through a contact hole of the insulating layer, for example.

The second wire WL2 may extend in the second direction (for example, the x direction). Thus, the second wire WL2 may transmit a scan signal or a light-emission control signal to at least one of the first side display area SDA1, the second side display area SDA2, and the front display area FDA. The second wire WL2 may be connected to the second corner wire CWLb.

The first corner wire CWLa may be arranged in the corner display area CDA. The first corner wire CWLa may extend in a direction intersecting the first direction (for example, the y direction) and the second direction (for example, the x direction) within the corner display area CDA. The first corner wire CWLa may extend in a direction away from the front display area FDA.

The first corner wire CWLa may be arranged on each of the plurality of strip portions STP. In this case, the first corner wire CWLa may extend in the same direction as the extension direction of each strip portion STP. In an embodiment, the first corner wire CWLa may overlap the pixel circuits PC. In another embodiment, the first corner wire CWLa may be spaced apart from the pixel circuits PC. In this case, the first corner wire CWLa may be arranged in at least one of the first outer area OA1 and the second outer area OA2.

The first corner wire CWLa may be connected to the first wire WL1. In detail, the first corner wire CWLa may be connected to the first wire WL1 through the connection line CL. In an embodiment, the first corner wire CWLa and the connection line CL may be in different layers. In an embodiment, an insulating layer may be between the first corner wire CWLa and the connection line CL, for example. In this case, the first corner wire CWLa and the connection line CL may be connected to each other through a contact hole of the insulating layer. In an embodiment, the first corner wire CWLa and the first wire WL1 may be on the same insulating layer.

The connection line CL may extend from the middle display area MDA to the corner display area CDA. The connection line CL may overlap the voltage wire VWL arranged in the middle display area MDA. When the data connection line DCL is arranged in the middle display area MDA, the connection line CL may overlap the data connection line DCL.

The first corner wire CWLa may be connected to the pixel circuits PC arranged on the plurality of strip portions STP. In an embodiment, when the first corner wire CWLa overlaps the pixel circuits PC, the first corner wire CWLa may be directly connected to the pixel circuits PC. In another embodiment, when the first corner wire CWLa is spaced apart from the pixel circuits PC, the first corner wire CWLa may be connected to the pixel circuits PC through a bridge line (not shown).

The first corner wire CWLa may transmit a data signal to the pixel circuits PC arranged on the plurality of strip portions STP. The first corner wire CWLa may transmit the data signal received through the first wire WL1 and the connection line CL to the pixel circuits PC arranged on the plurality of strip portions STP.

The second corner wire CWLb may be arranged in the corner display area CDA. The second corner wire CWLb may extend in the direction intersecting the first direction (for example, the y direction) and the second direction (for example, the x direction) within the corner display area CDA. The second corner wire CWLb may extend in a direction away from the front display area FDA. The second corner wire CWLb may extend in the same direction as the extension direction of the first corner wire CWLa.

The second corner wire CWLb may be arranged on each of the plurality of strip portions STP. In this case, the second corner wire CWLb may extend in the same direction as the extension direction of each strip portion STP. In an embodiment, the second corner wire CWLb may be spaced apart from the pixel circuits PC. In this case, the second corner wire CWLb may be arranged in at least one of the first outer area OA1 and the second outer area OA2. In another embodiment, the second corner wire CWLb may overlap the pixel circuits PC.

The second corner wire CWLb may be connected to the second wire WL2. The second corner wire CWLb may transmit a scan signal or a light-emission control signal.

The second corner wire CWLb may pass through the middle display area MDA and extend to the corner display area CDA. In an embodiment, the second corner wire CWLb may overlap the voltage wire VWL arranged in the middle display area MDA. When the data connection line DCL is arranged in the middle display area MDA, a portion of the second corner wire CWLb may overlap the data connection line DCL.

The second corner wire CWLb may be connected to the pixel circuits PC arranged on the plurality of strip portions STP. In an embodiment, when the second corner wire CWLb is spaced apart from the pixel circuits PC, the second corner wire CWLb may be connected to the pixel circuits PC through the bridge line. In another embodiment, when the second corner wire CWLb overlaps the pixel circuits PC, the second corner wire CWLb may be directly connected to the pixel circuits PC.

Although not shown in FIG. 12B, in an embodiment, a common wire may extend in the extension direction of each of the plurality of strip portions STP. The initializing voltage Vint, the common voltage ELVSS, and the like of FIG. 7 may be applied to the common wire. The initializing voltage Vint, the driving voltage ELVDD, and the like may be supplied to the pixel circuits PC arranged in the corner display area CDA through the common wire.

In the illustrated embodiment, the first wire WL1 for transmitting a data signal may extend in the first direction (for example, the y direction). The second wire WL2 for transmitting a scan signal or a light-emission control signal may extend in the second direction (for example, the x direction). In the illustrated embodiment, because the space V is defined between adjacent strip portions STP, each of the first wire WL1 and the second wire WL2 may not extend in the first direction (for example, the y direction) and the second direction (for example, the x direction). Accordingly, the first corner wire CWLa and the second corner wire CWLb may each extend in the extension direction of each of the plurality of strip portion STP and may transmit the data signal, the scan signal, and/or the light-emission control signal to the pixel circuits PC arranged on the plurality of strip portions STP. The data signal, the scan signal, the light-emission control signal, and the like transmitted to the front display area FDA and/or the side display area SDA may also be transmitted to the corner display area CDA. In other words, the wires arranged in the front display area FDA and/or the side display area SDA and the wires arranged in the corner display area CDA may share the data signal, the scan signal, the light-emission control signal, and the like.

Figure 12C:
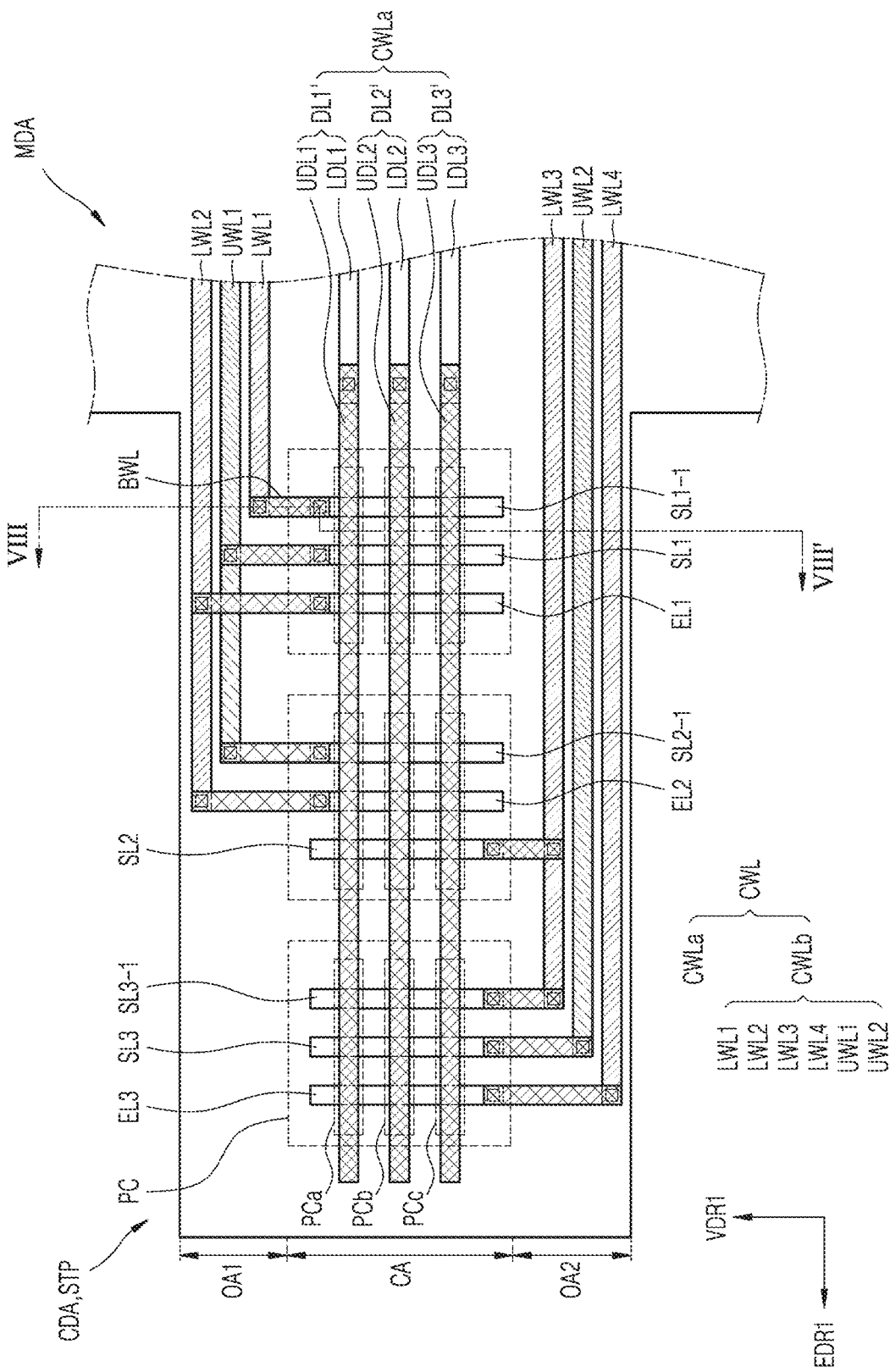
FIGS. 12C and 12D are schematic plan views of an embodiment of a corner display area.
Figure 12D:
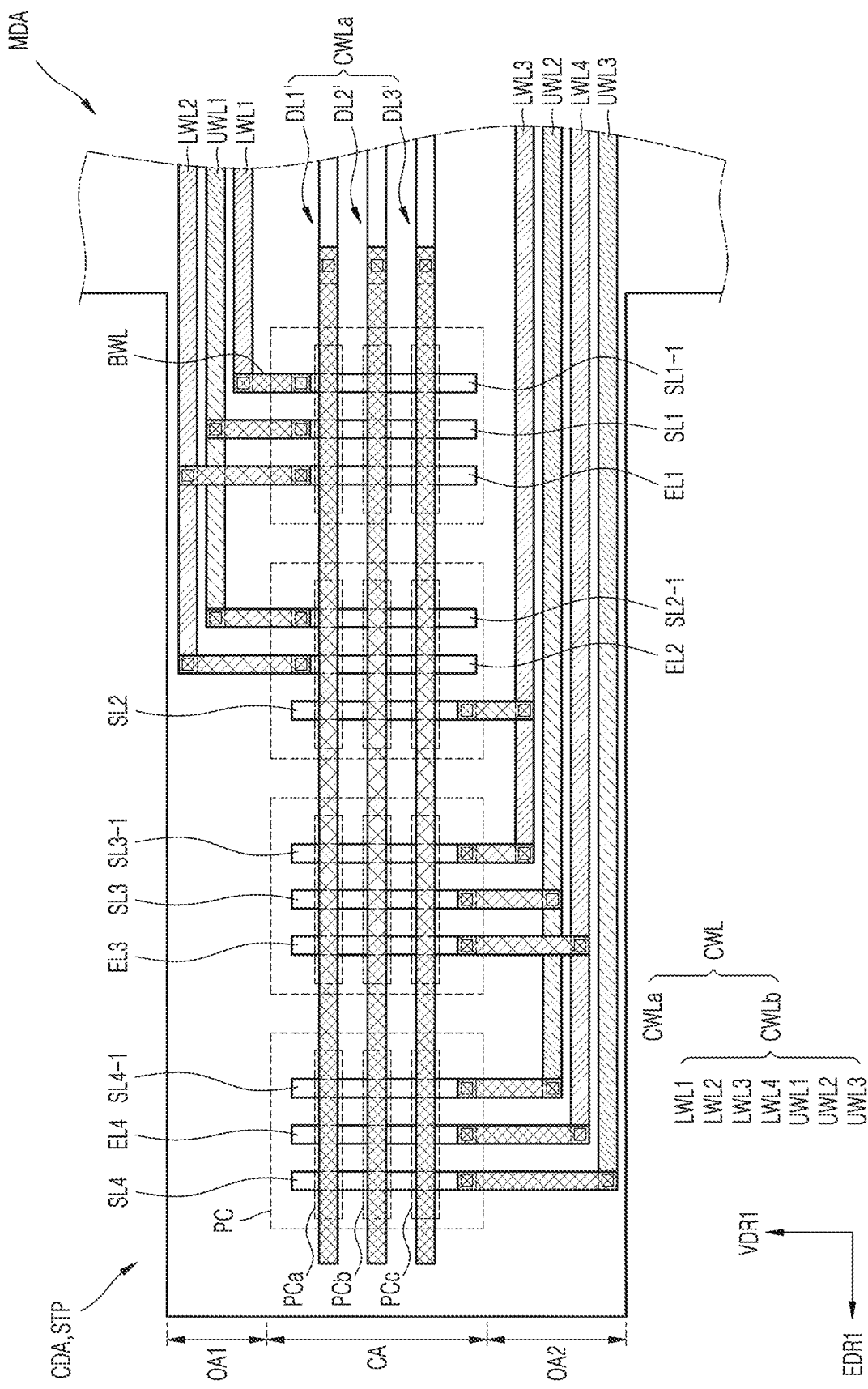

FIGS. 12C and 12D are schematic plan views of an embodiment of a corner display area. Reference numerals in FIGS. 12C and 12D that are the same as the reference numerals in FIG. 12A denote the same elements, and thus repeated descriptions thereof are omitted.

Referring to FIGS. 12C and 12D, a display panel may include a substrate, first wires, second wires, corner wires CWL, pixel circuits PC, and bridge lines BWL. Each corner wire CWL may include a first corner wire CWLa and a second corner wire CWLb.

The substrate may include a front display area, a corner display area CDA surrounding the front display area, and a middle display area MDA between the front display area and the corner display area CDA. The corner display area CDA may include a plurality of strip portions STP each extending from the middle display area MDA, and a space may be defined between adjacent strip portions STP. FIGS. 12C and 12D illustrate one strip portion STP from among the plurality of strip portions STP.

The strip portion STP may extend in a first extension direction EDR1. The first extension direction EDR1 may be the direction intersecting the first direction (for example, the y direction) and the second direction (for example, the x direction) of FIG. 12A.

The strip portion STP may include a center area CA, and a first outer area OA1 and a second outer area OA2 arranged on both sides of the center area CA. The center area CA may extend in the first extension direction EDR1. The center area CA may be between the first outer area OA1 and the second outer area OA2.

A pixel circuit PC and a first corner wire CWLa may be in the center area CA. A plurality of pixel circuits PC may be arranged on the strip portion STP. The plurality of pixel circuits PC may be arranged side by side in the first extension direction EDR1.

In an embodiment, each pixel circuit PC may include a first subpixel circuit PCa, a second subpixel circuit PCb, and a third subpixel circuit PCc. In another embodiment, the pixel circuit PC may further include a fourth subpixel circuit. Each of the first subpixel circuit PCa, the second subpixel circuit PCb, and the third subpixel circuit PCc may correspond to the second pixel circuit PC2 of FIG. 12A. A case where each pixel circuit PC includes the first subpixel circuit PCa, the second subpixel circuit PCb, and the third subpixel circuit PCc will now be focused on and described in detail.

The first subpixel circuit PCa, the second subpixel circuit PCb, and the third subpixel circuit PCc may be arranged side by side. In an embodiment, the first subpixel circuit PCa, the second subpixel circuit PCb, and the third subpixel circuit PCc may be arranged side by side in a first vertical direction VDR1 perpendicular to the first extension direction EDR1, for example. In an embodiment, a plurality of first subpixel circuits PCa may be included in the strip portion STP, and the plurality of first subpixel circuits PCa may be arranged side by side in the first extension direction EDR1. A plurality of second subpixel circuits PCb may be included in the strip portion STP, and the plurality of second subpixel circuits PCb may be arranged side by side in the first extension direction EDR1. A plurality of third subpixel circuits PCc may be included in the strip portion STP, and the plurality of third subpixel circuits PCc may be arranged side by side in the first extension direction EDR1.

In the illustrated embodiment, the first corner wire CWLa may extend in the first extension direction EDR1. The first corner wire CWLa may overlap the pixel circuits PC. The first corner wire CWLa may include a first data line DL1', a second data line DL2', and a third data line DL3' each extending in the first extension direction EDR1 to be parallel with each other.

The first data line DL1' may be connected to first subpixel circuits PCa. In an embodiment, the first data line DL1' may be connected to each of the plurality of first subpixel circuits PCa. Accordingly, the plurality of first subpixel circuits PCa may be all connected to the single first data line DL1'.

In an embodiment, the first data line DL1' may include a first lower data line LDL1 and a first upper data line UDL1. The first lower data line LDL1 may be arranged in the middle display area MDA, and the first upper data line UDL1 may be arranged in the corner display area CDA. The first lower data line LDL1 and the first upper data line UDL1 may be in different layers. In this case, the first upper data line UDL1 may be above an insulating layer, and the first lower data line LDL1 may be below the insulating layer. The first upper data line UDL1 and the first lower data line LDL1 may be connected to each other through a contact hole of the insulating layer. In another embodiment, the first lower data line LDL1 may be omitted. In this case, the first upper data line UDL1 may extend to the middle display area MDA.

The second data line DL2' may be connected to second subpixel circuits PCb. In an embodiment, the second data line DL2' may be connected to each of the plurality of second subpixel circuits PCb. Accordingly, the plurality of second subpixel circuits PCb may be all connected to the single second data line DL2'.

In an embodiment, the second data line DL2' may include a second lower data line LDL2 and a second upper data line UDL2. The second lower data line LDL2 may be arranged in the middle display area MDA, and the second upper data line UDL2 may be arranged in the corner display area CDA. The second lower data line LDL2 and the second upper data line UDL2 may be in different layers. In this case, the second upper data line UDL2 may be above an insulating layer, and the second lower data line LDL2 may be below the insulating layer. The second upper data line UDL2 and the second lower data line LDL2 may be connected to each other through a contact hole of the insulating layer. In another embodiment, the second lower data line LDL2 may be omitted. In this case, the second upper data line UDL2 may extend to the middle display area MDA.

The third data line DL3' may be connected to third subpixel circuits PCc. In an embodiment, the third data line DL3' may be connected to each of the plurality of third subpixel circuits PCc. Accordingly, the plurality of third subpixel circuits PCc may be all connected to the single third data line DL3'.

In an embodiment, the third data line DL3' may include a third lower data line LDL3 and a third upper data line UDL3. The third lower data line LDL3 may be arranged in the middle display area MDA, and the third upper data line UDL3 may be arranged in the corner display area CDA. The third lower data line LDL3 and the third upper data line UDL3 may be in different layers. In this case, the third upper data line UDL3 may be above an insulating layer, and the third lower data line LDL3 may be below the insulating layer. The third upper data line UDL3 and the third lower data line LDL3 may be connected to each other through a contact hole of the insulating layer. In another embodiment, the third lower data line LDL3 may be omitted. In this case, the third upper data line UDL3 may extend to the middle display area MDA.

Accordingly, even when N pixel circuits PC are arranged on the single strip portion STP, three first corner wires CWLa may be arranged.

In an embodiment, when the pixel circuit PC further includes the fourth subpixel circuit, the first corner wire CWLa may further include a fourth data line. In this case, even when N pixel circuits PC are arranged on the single strip portion STP, four first corner wires CWLa may be arranged.

The first outer area OA1 and the second outer area OA2 may each extend in the first extension direction EDR1. The second corner wire CWLb may be arranged in the first outer area OA1) and the second outer area OA2. The second corner wire CWLb may extend in the first extension direction EDR1, which is the same direction as the extension direction of the first corner wire CWLa. The second corner wire CWLb may transmit a scan signal or a light-emission control signal to the pixel circuits PC.

The second corner wire CWLb may include a lower wire and an upper wire arranged in different layers. In an embodiment, the lower wire may be covered by an insulating layer, and the upper wire may be arranged on the insulating layer, for example.

In an embodiment, referring to FIG. 12C, three pixel circuits PC may be arranged on the strip portion STP, for example. In this case, the second corner wire CWLb may include a first lower wire LWL1, a second lower wire LWL2, a third lower wire LWL3, a fourth lower wire LWL4, a first upper wire UWL1, and a second upper wire UWL2. In an embodiment, the first lower wire LWL1, the second lower wire LWL2, and the first upper wire UWL1 may be arranged in the first outer area OA1. The third lower wire LWL3, the fourth lower wire LWL4, and the second upper wire UWL2 may be arranged in the second outer area OA2.

The lower wire and the upper wire may alternate with each other in the first vertical direction VDR1. In an embodiment, the first lower wire LWL1, the first upper wire UWL1, and the second lower wire LWL2 may be sequentially arranged in the first vertical direction VDR1, for example. The fourth lower wire LWL4, the second upper wire UWL2, and the third lower wire LWL3 may also be sequentially arranged in the first vertical direction VDR1.

Because the second corner wire CWLb includes a lower wire and an upper wire arranged in different layers in at least one of the first outer area OA1 and the second outer area OA2, the strip portion STP may have a reduced width. The width of the strip portion STP is a width of the strip portion STP in the first vertical direction VDR1.

In the illustrated embodiment, the second corner wire CWLb may be connected to the bridge lines BWL. Thus, the second corner wire CWLb may be connected to the pixel circuits PC through the bridge lines BWL. In an embodiment, the second corner wire CWLb and the bridge lines BWL may be in different layers. In an embodiment, an insulating layer may be arranged on the second corner wire CWLb, for example. The bridge lines BWL may be on the insulating layer. In this case, the second corner wire CWLb and the bridge lines BWL may be connected to each other through a contact hole of the insulating layer. In an embodiment, the bridge lines BWL may be in the same layer as the layer in which the first corner wire CWLa is. In an embodiment, the bridge lines BWL may be in the same layer as the layer in which the first upper data line UDL1 is, for example.

In the illustrated embodiment, the second corner wire CWLb may be connected to two of the plurality of pixel circuits PC. In detail, a previous scan line and a current scan line connected to adjacent pixel circuits PC may be connected to the same second corner wire CWLb. In an embodiment, a first scan line SL1 and a second previous scan line SL2-1 connected to pixel circuits PC may be connected to the first upper wire UWL1 through bridge lines BWL, for example. A second scan line SL2 and a third previous scan line SL3-1 connected to pixel circuits PC may be connected to the third lower wire LWL3 through bridge lines BWL.

In an embodiment, light-emission control lines connected to adjacent pixel circuits PC may be connected to the same second corner wire CWLb. In an embodiment, a first light-emission control line EL1 and a second light-emission control line EL2 connected to adjacent pixel circuits PC may be connected to the second lower wire LWL2 through bridge lines BWL, for example.

In another embodiment, light-emission control lines connected to pixel circuits PC may each be connected to the second corner wire CWLb. A case where light-emission control lines connected to adjacent pixel circuits PC are connected to the same second corner wire CWLb will now be focused on and described in detail.

A first previous scan line SL1-1 connected to a pixel circuit PC may be connected to the first lower wire LWL1 through a bridge line BWL. A third scan line SL3 connected to a pixel circuit PC may be connected to the second upper wire UWL2 through a bridge line BWL. A third light-emission control line EL3 connected to a pixel circuit PC may be connected to the fourth lower wire LWL4. Thus, when three pixel circuits PC are arranged on the strip portion STP, a total of six second corner wires CWLb may be used. In this way, when N (where N is an odd number) pixel circuits PC are arranged on the strip portion STP, a total of (N+1)×1.5 second corner wires CWLb may be used. Because the second corner wire CWLb is connected to two of the plurality of pixel circuits PC as described above, the number of wires arranged on the strip portion STP may be minimized or reduced.

Referring to FIG. 12D, four pixel circuits PC may be arranged on the strip portion STP. In this case, the second corner wire CWLb may include a first lower wire LWL1, a second lower wire LWL2, a third lower wire LWL3, a fourth lower wire LWL4, a first upper wire UWL1, a second upper wire UWL2, and a third upper wire UWL3. In an embodiment, the first lower wire LWL1, the second lower wire LWL2, and the first upper wire UWL1 may be arranged in the first outer area OA1. The third lower wire LWL3, the fourth lower wire LWL4, the second upper wire UWL2, and the third upper wire UWL3 may be arranged in the second outer area OA2.

In the illustrated embodiment, the fourth lower wire LWL4, the second upper wire UWL2, the third lower wire LWL3, and the third upper wire UWL3 may be sequentially arranged in the first vertical direction VDR1.

In the illustrated embodiment, the second corner wire CWLb may be connected to two of the plurality of pixel circuits PC. In detail, a previous scan line and a current scan line connected to adjacent pixel circuits PC may be connected to the same second corner wire CWLb. In an embodiment, a first scan line SL1 and a second previous scan line SL2-1 connected to pixel circuits PC may be connected to the first upper wire UWL1 through bridge lines BWL, for example. A second scan line SL2 and a third previous scan line SL3-1 connected to pixel circuits PC may be connected to the third lower wire LWL3 through bridge lines BWL. A third scan line SL3 and a fourth previous scan line SL4-1 connected to pixel circuits PC may be connected to the second upper wire UWL2 through bridge lines BWL.

In an embodiment, light-emission control lines connected to adjacent pixel circuits PC may be connected to the same second corner wire CWLb. In an embodiment, a first light-emission control line EL1 and a second light-emission control line EL2 connected to adjacent pixel circuits PC may be connected to the second lower wire LWL2 through bridge lines BWL, for example. A third light-emission control line EL3 and a fourth light-emission control line EL4 connected to adjacent pixel circuits PC may be connected to the fourth lower wire LWL4 through bridge lines BWL.

A first previous scan line SL1-1 connected to a pixel circuit PC may be connected to the first lower wire LWL1 through a bridge line BWL. A fourth scan line SL4 connected to a pixel circuit PC may be connected to the third upper wire UWL3 through a bridge line BWL. Thus, when four pixel circuits PC are arranged on the strip portion STP, a total of seven second corner wires CWLb may be used. In this way, when N (where N is an even number) pixel circuits PC are arranged on the strip portion STP, a total of 1.5×N+1 second corner wires CWLb may be used. Because the second corner wire CWLb is connected to two of the plurality of pixel circuits PC as described above, the number of wires arranged on the strip portion STP may be minimized or reduced.

Figure 12E:
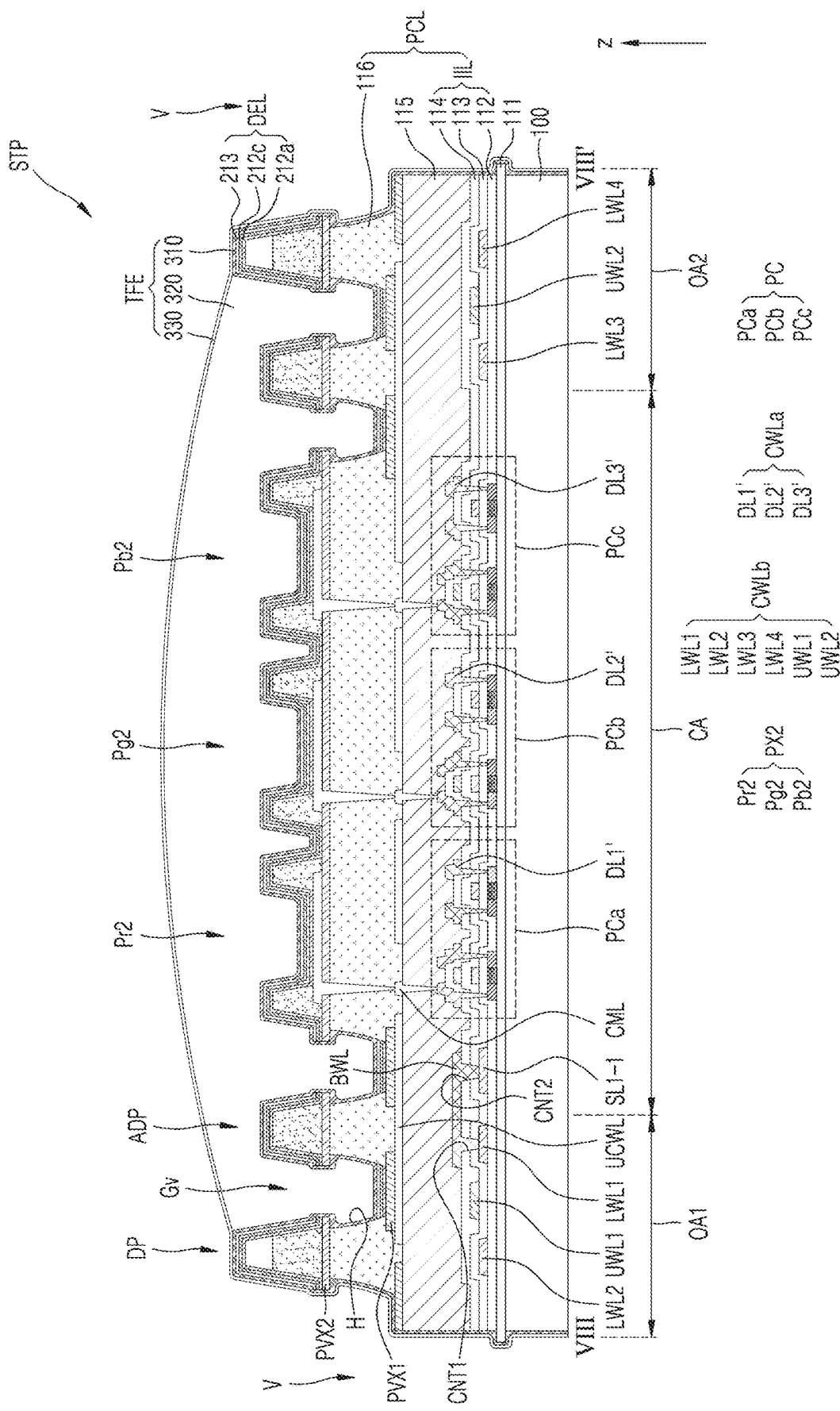
FIG. 12E is a cross-sectional view of a pixel circuit of FIG. 12C taken along line VIII-VIII'.

FIG. 12E is a cross-sectional view of a pixel circuit PC of FIG. 12C taken along line VIII-VIII'. Reference numerals in FIG. 12E that are the same as the reference numerals in FIGS. 3DA and 12C denote the same elements, and thus repeated descriptions thereof are omitted.

Referring to FIG. 12E, the display panel may include the substrate 100, a buffer layer 111, a pixel circuit layer PCL, a display element layer DEL, and a thin-film encapsulation layer TFE.

The substrate 100 may include a corner display area, the corner display area may include a plurality of strip portions, and spaces V may be defined between the plurality of strip portions. Each of the plurality of strip portions STP may include a center area CA, and a first outer area OA1 and a second outer area OA2 arranged on both sides of the center area CA.

The buffer layer 111, the pixel circuit layer PCL, the display element layer DEL, and the thin-film encapsulation layer TFE may be stacked on the substrate 100. The pixel circuit layer PCL may include the inorganic insulating layer IIL, the first corner wire CWLa, the second corner wire CWLb, the pixel circuit PC, the first planarization layer 115, and the second planarization layer 116. The inorganic insulating layer IIL may include the first gate insulating layer 112, the second gate insulating layer 113, and the interlayer insulating layer 114.

The first corner wire CWLa may include a first data line DL1', a second data line DL2', and a third data line DL3'. The second corner wire CWLb may include a first lower wire LWL1, a second lower wire LWL2, a third lower wire LWL3, a fourth lower wire LWL4, a first upper wire UWL1, and a second upper wire UWL2.

The display element layer DEL may include a second red subpixel Pr2, a second green subpixel Pg2, and a second blue subpixel Pb2. Each of the second red subpixel Pr2, the second green subpixel Pg2, and the second blue subpixel Pb2 may include the second display element DE2 (refer to FIG. 12A). The second display element DE2 may be an organic light-emitting diode OLED. In an embodiment, the second red subpixel Pr2 may be connected to a first subpixel circuit PCa, the second green subpixel Pg2 may be connected to a second subpixel circuit PCb, and the second blue subpixel Pb2 may be connected to a third subpixel circuit PCc. The thin-film encapsulation layer TFE may include a first inorganic encapsulation layer 310, an organic encapsulation layer 320, and a second inorganic encapsulation layer 330.

A semiconductor layer of the first subpixel circuit PCa, a semiconductor layer of the second subpixel circuit PCb, and a semiconductor layer of the third subpixel circuit PCc may be arranged on the buffer layer 111. The first gate insulating layer 112 may cover the semiconductor layers.

The first previous scan line SL1-1, the first lower wire LWL1, the second lower wire LWL2, the third lower wire LWL3, and the fourth lower wire LWL4 may be arranged on the first gate insulating layer 112. The first lower wire LWL1 and the second lower wire LWL2 may be on the first outer area OA1, and the third lower wire LWL3 and the fourth lower wire LWL4 may be on the second outer area OA2. In an embodiment, at least one of the first previous scan line SL1-1, the first lower wire LWL1, the second lower wire LWL2, the third lower wire LWL3, and the fourth lower wire LWL4 may include a conductive material including at least one of molybdenum (Mo), aluminum (Al), copper (Cu), and titanium (Ti), and may be a multi-layer or single layer including the aforementioned materials, for example. In an embodiment, at least one of the first previous scan line SL1-1, the first lower wire LWL1, the second lower wire LWL2, the third lower wire LWL3, and the fourth lower wire LWL4 may be provided simultaneously with forming of the gate electrode G of FIG. 3DA.

The second gate insulating layer 113 may cover the first lower wire LWL1, the second lower wire LWL2, the third lower wire LWL3, and the fourth lower wire LWL4. The first upper wire UWL1 and the second upper wire UWL2 may be on the second gate insulating layer 113. The first lower wire LWL1, the first upper wire UWL1, and the second lower wire LWL2 may be sequentially arranged in a direction from the center area CA to the first outer area OA1. At least one of the first upper wire UWL1 and the second upper wire UWL2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may each be a single layer or multi-layer including the aforementioned materials. At least one of the first upper wire UWL1 and the second upper wire UWL2 may be provided simultaneously with forming of the upper electrode CE2 of FIG. 3DA.

In this case, the first upper wire UWL1 is arranged in a different layer from the layer in which the first lower wire LWL1 and the second lower wire LWL2 are arranged, thereby reducing the width of the first outer area OA1. Similarly, the third lower wire LWL3, the second upper wire UWL2, and the fourth lower wire LWL4 may be sequentially arranged in a direction from the center area CA to the second outer area OA2. In this case, the third lower wire LWL3 and the fourth lower wire LWL4 are arranged in a different layer from the layer in which the second upper wire UWL2 is arranged, thereby reducing the width of the second outer area OA2.

The interlayer insulating layer 114 may cover the first upper wire UWL1 and the second upper wire UWL2. The first data line DL1', the second data line DL2', the third data line DL3', and the bridge line BWL may be on the interlayer insulating layer 114. The first data line DL1', the second data line DL2', and the third data line DL3' may be connected to the first subpixel circuit PCa, the second subpixel circuit PCb, and the third subpixel circuit PCc, respectively. Accordingly, data signals may be transmitted to the first subpixel circuit PCa, the second subpixel circuit PCb, and the third subpixel circuit PCc, respectively.

The second gate insulating layer 113 and the interlayer insulating layer 114 may include a first contact hole CNT1 and a second contact hole CNT2. The first contact hole CNT1 may expose the first lower wire LWL1, and the second contact hole CNT2 may expose the first previous scan line SL1-1.

The bridge line BWL may extend from at least one of the first outer area OA1 and the second outer area OA2 to the center area CA. The bridge line BWL may be connected to the first lower wire LWL1 and the first previous scan line SL1-1 through the first contact hole CNT1 and the second contact hole CNT2, respectively.

In an embodiment, at least one of the first data line DL1', the second data line DL2', the third data line DL3', and the bridge line BWL may include a conductive material including at least one of molybdenum (Mo), aluminum (Al), copper (Cu), and titanium (Ti), and may be a multi-layer or single layer including the aforementioned materials, for example. At least one of the first data line DL1', the second data line DL2', the third data line DL3', and the bridge line BWL may have a multi-layer structure of Ti/Al/Ti. At least one of the first data line DL1', the second data line DL2', the third data line DL3', and the bridge line BWL may be provided simultaneously with forming of the drain electrode D and the source electrode S of FIG. 3DA.

As shown in FIG. 12E, a first scan line and a first light-emission control line may be connected to the first subpixel circuit PCa, the second subpixel circuit PCb, and the third subpixel circuit PCc. The first scan line and the first light-emission control line may transmit a scan signal and a light-emission control signal to the first subpixel circuit PCa, the second subpixel circuit PCb, and the third subpixel circuit PCc. The first upper wire UWL1 may be connected to the first scan line and may transmit the scan signal to the pixel circuit PC. Similarly, the second lower wire LWL2 may be connected to the first light-emission control line and may transmit the light-emission control signal to the pixel circuit PC. Accordingly, in an embodiment, even when the space V is defined between adjacent strip portions, a signal may be transmitted to the pixel circuit PC.

The first planarization layer 115 may be arranged on the first corner wire CWLa and the bridge line BWL, and a connecting electrode CML and an upper connection line UCWL may be arranged on the first planarization layer 115. The connecting electrode CML may connect the pixel circuit PC to a second display element DE2. Similar to the first corner wire CWLa and/or the second corner wire CWLb, the upper connection line UCWL may extend from a middle display area to a corner display area. In detail, the upper connection line UCWL may extend in the first extension direction EDR1 of FIG. 12C. The upper connection line UCWL may transmit the initializing voltage Vint of FIG. 7, the driving voltage ELVDD of FIG. 7, or/and the common voltage ELVSS of FIG. 7 to the pixel circuit PC. In an embodiment, the upper connection line UCWL may be between the interlayer insulating layer 114 and the first planarization layer 115.

The upper connection line UCWL may include a conductive material including molybdenum (Mo), aluminum (Al), copper (Cu), and titanium (Ti), and may be a multi-layer or single layer including the aforementioned materials. In an embodiment, the upper connection line UCWL may have a multi-layer structure of Ti/Al/Ti.

The first inorganic pattern layer PVX1 may be on the first planarization layer 115 and/or the upper connection line UCWL. A plurality of first inorganic pattern layers PVX1 may be arranged on the upper connection line UCWL, and the plurality of first inorganic pattern layers PVX1 may be spaced apart from each other on the upper connection line UCWL.

The second planarization layer 116 may cover the upper connection line UCWL, the connecting electrode CML, and the first planarization layer 115. In an embodiment, a groove Gv may be defined in the second planarization layer 116. The second planarization layer 116 may include a hole H, and the hole H may correspond to the first inorganic pattern layer PVX1. The second planarization layer 116 may cover the edge of the first inorganic pattern layer PVX1. Accordingly, the groove Gv may be defined by a center portion of the first inorganic pattern layer PVX1 and the hole H of the second planarization layer 116. When the organic encapsulation layer 320 is provided, the groove Gv may control flow of an organic material that forms the organic encapsulation layer 320.

A second inorganic pattern layer PVX2 and the second display element DE2 may be on the second planarization layer 116. Second inorganic pattern layers PVX2 may be on both sides of the groove Gv, and may include a pair of protruding tips protruding in a center direction of the groove Gv.

A first functional layer 212a, a second functional layer 212c, and an opposite electrode 213 arranged on the second inorganic pattern layer PVX2 may be disconnected by the groove Gv and the pair of protruding tips. In an embodiment, a first functional layer pattern, a second functional layer pattern, and an opposite electrode pattern may be arranged within the groove Gv.

A dam unit DP and an auxiliary dam unit ADP protruding in a thickness direction of the substrate 100 may be above the second inorganic pattern layer PVX2. The auxiliary dam unit ADP may be between the dam unit DP and the second display element DE2.

In an embodiment, the groove Gv may be between the dam unit DP and the auxiliary dam unit ADP, and the groove Gv may also be between the auxiliary dam unit ADP and the second display element DE2.

In an embodiment, a height between the upper surface of the substrate 100 to the upper surface of the dam unit DP may be greater than a height between the upper surface of the substrate 100 and the upper surface of the auxiliary dam unit ADP.

In an embodiment, the first inorganic encapsulation layer 310 may entirely and consecutively cover the strip portion STP. In detail, the first inorganic encapsulation layer 310 may entirely and consecutively cover the dam unit DP, the auxiliary dam unit ADP, the groove Gv, and the second display element DE2. In this case, the first inorganic encapsulation layer 310 may contact the second inorganic pattern layer PVX2. The organic encapsulation layer 320 may extend from the second display element DE2 to the dam unit DP. The organic encapsulation layer 320 may fill the groove Gv. Similar to the first inorganic encapsulation layer 310, the second inorganic encapsulation layer 330 may entirely and consecutively cover the strip portion STP. In an embodiment, the second inorganic encapsulation layer 330 may contact the first inorganic encapsulation layer 310 in the dam unit DP.

Although only a display panel and a display apparatus have been focused on and described above, the invention is not limited thereto. A method of manufacturing the display panel, for example, and a method of manufacturing the display apparatus may belong to the scope of the invention.

In an embodiment, a display panel and a display apparatus in which a display area is expanded may be realized. Of course, the scope of the invention is not limited thereto.

It should be understood that embodiments described herein should be considered in a descriptive sense only and not for purposes of limitation. Descriptions of features or advantages within each embodiment should typically be considered as available for other similar features or advantages in other embodiments. While one or more embodiments have been described with reference to the drawing figures, it will be understood by those of ordinary skill in the art that various changes in form and details may be made therein without departing from the spirit and scope as defined by the following claims.

What is claimed is:

1. A display panel comprising:
    a substrate comprising a display area and a peripheral area around the display area, the display area comprising a front display area, a corner display area extending from a corner of the front display area, and a middle display area between the front display area and the corner display area;
    a pixel arranged on the front display area and comprising a display element;
    a gate driving circuit arranged on a side of the peripheral area;
    a data driving circuit arranged on the side on which the gate driving circuit is arranged;
    a gate line connected to the gate driving circuit and extending in a first direction to be connected to the pixel;
    a data line connected to the data driving circuit and extending in a second direction intersecting the first direction to be connected to the pixel; and
    a gate connection line extending in the second direction and including a first side connected to the gate driving circuit and a second side connected to the gate line.

2. The display panel of claim 1, further comprising a data connection line including a first side connected to the data driving circuit and a second side connected to the data line adjacent to the edge of the front display area.

3. The display panel of claim 2, wherein the data connection line at least partially overlaps the front display area.

4. The display panel of claim 3, further comprising:
    a voltage wire arranged on the substrate to correspond to the middle display area;
    a middle display element arranged to at least partially overlap the voltage wire; and
    a middle pixel circuit which is connected to the middle display element and drives the middle display element,
    wherein the middle pixel circuit is arranged in the front display area.

5. The display panel of claim 4, wherein a light-emission area of the display element is smaller than a light-emission area of the middle display element.

6. The display panel of claim 3, further comprising:
    a corner display element arranged on the substrate to correspond to the corner display area; and
    a corner pixel circuit which is connected to the corner display element and drives the corner display element,
    wherein the corner pixel circuit is arranged in the front display area or the corner display area.

7. The display panel of claim 6, wherein a light-emission area of the display element is smaller than a light-emission area of the corner display element.

8. The display panel of claim 6, further comprising:
    a first corner wire arranged in the corner display area and connected to the data line; and
    a second corner wire arranged in the corner display area and connected to the gate line,
    wherein the first corner wire and the second corner wire are connected to the corner pixel circuit.

9. The display panel of claim 8, wherein the substrate corresponding to the corner display area comprises:
    a plurality of strip portions each extending in a direction away from the front display area; and
    a plurality of spaces each defined between adjacent strip portions from among the plurality of strip portions, and penetrating through the substrate,
    wherein the first corner wire and the second corner wire are arranged in each of the plurality of strip portions.

10. The display panel of claim 2, wherein the data connection line at least partially overlaps the middle display area.

11. The display panel of claim 10, further comprising:
    a middle display element arranged to at least partially overlap the data connection line; and
    a middle pixel circuit which is connected to the middle display element and drives the middle display element, wherein the middle pixel circuit is arranged in the front display area.

12. The display panel of claim 10, further comprising:
a corner display element arranged on the substrate to correspond to the corner display area; and
a corner pixel circuit which is connected to the corner display element and drives the corner display element,
wherein the corner pixel circuit is arranged in the front display area or the corner display area.

13. A display panel comprising:
a substrate comprising a display area and a peripheral area around the display area, the display area comprising a front display area, a corner display area extending from a corner of the front display area, and a middle display area between the front display area and the corner display area;
a pixel arranged on the front display area and comprising a display element;
a gate driving circuit arranged on a side of the peripheral area;
a data driving circuit arranged on the side on which the gate driving circuit is arranged;
a gate line connected to the gate driving circuit and extending in a first direction to be connected to the pixel;
a data line connected to the data driving circuit and extending in a second direction intersecting the first direction to be connected to the pixel;
a first voltage wire and a second voltage wire arranged in the peripheral area and spaced apart from each other with the middle display area between the first voltage wire and the second voltage wire; and
a voltage connection line arranged in the corner display area and connecting the first voltage wire to the second voltage wire.

14. The display panel of claim 13, wherein the substrate corresponding to the corner display area comprises:
a plurality of strip portions each extending in a direction away from the front display area; and
a plurality of spaces each defined between adjacent strip portions from among the plurality of strip portions, and penetrating through the substrate,
wherein the voltage connection line is arranged along the edges of the plurality of strip portions.

15. The display panel of claim 13, further comprising:
a corner display element arranged on the substrate to correspond to the corner display area; and
a corner pixel circuit which is connected to the corner display element and drives the corner display element,
wherein the corner pixel circuit is arranged in the front display area or the corner display area.

16. The display panel of claim 13, further comprising:
a middle display element arranged on the substrate to correspond to the middle display area; and
a middle pixel circuit which is connected to the middle display element and drives the middle display element,
wherein the middle pixel circuit is arranged in the front display area or the middle display area.

17. A display apparatus comprising:
a display panel including:
a substrate which comprises:
a display area and a peripheral area around the display area, the display area comprising a front display area, a corner display area extending from a corner of the front display area and bent with a preset radius of curvature; and
a middle display area between the front display area and the corner display area;
a pixel arranged on the front display area and comprising a display element;
a gate driving circuit arranged on a side of the peripheral area;
a data driving circuit arranged on the side on which the gate driving circuit is arranged;
a gate line connected to the gate driving circuit and extending in a first direction to be connected to the pixel; and
a data line connected to the data driving circuit and extending in a second direction intersecting the first direction to be connected to the pixel;
a window covering the display panel; and
a gate connection line extending in the second direction and including a first side connected to the gate driving circuit and a second side connected to the gate line.

18. The display apparatus of claim 17, wherein the display panel further comprises:
a data connection line including a first side connected to the data driving circuit and a second side connected to the data line, and
the data connection line at least partially overlaps the front display area or the middle display area.

19. The display apparatus of claim 17, wherein the display panel further comprises:
a voltage wire arranged on the substrate to correspond to the middle display area;
a middle display element arranged to at least partially overlap the voltage wire; and
a middle pixel circuit which is connected to the middle display element and drives the middle display element,
wherein the middle pixel circuit is arranged in the front display area.

20. The display apparatus of claim 17, wherein the display panel further comprises:
a corner display element arranged on the substrate to correspond to the corner display area; and
a corner pixel circuit which is connected to the corner display element and drives the corner display element,
wherein the corner pixel circuit is arranged in the front display area or the corner display area.

* * * * *